(12) United States Patent
Perrott et al.

(10) Patent No.: US 11,870,446 B2
(45) Date of Patent: Jan. 9, 2024

(54) HIGH GAIN DETECTOR TECHNIQUES FOR LOW BANDWIDTH LOW NOISE PHASE-LOCKED LOOPS

(71) Applicant: Texas Instruments Incorporated, Dallas, TX (US)

(72) Inventors: Michael Henderson Perrott, Nashua, NH (US); Hon Kin Chiu, Castro Valley, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/461,997

(22) Filed: Aug. 31, 2021

(65) Prior Publication Data
US 2022/0224348 A1 Jul. 14, 2022

Related U.S. Application Data

(60) Provisional application No. 63/136,245, filed on Jan. 12, 2021.

(51) Int. Cl.
*H03M 1/12* (2006.01)
*H03L 7/08* (2006.01)
(Continued)

(52) U.S. Cl.
CPC ........ *H03L 7/0807* (2013.01); *G11C 11/4093* (2013.01); *G11C 11/4099* (2013.01);
(Continued)

(58) Field of Classification Search
CPC .... H03M 1/0836; H03M 1/50; H03M 7/3004; H03M 1/1009; H03M 1/804;
(Continued)

(56) References Cited

U.S. PATENT DOCUMENTS

| 5,808,691 A | * | 9/1998 | Malcolm, Jr. | .......... H04N 5/126 348/537 |
| 6,008,703 A | * | 12/1999 | Perrott | ................. H03C 3/0925 331/23 |

(Continued)

OTHER PUBLICATIONS

Wanghua Wu et al, "A 28-nm 75-fsrms Analog Fractional-N Sampling PLL With a Highly Linear DTC Incorporating Background DTC Gain Calibration and Reference Clock Duty Cycle Correction", IEEE Journal of Solid-State Circuits, vol. 54, No. 5, May 2019, pp. 1254-1265.

(Continued)

*Primary Examiner* — Linh V Nguyen
(74) *Attorney, Agent, or Firm* — Frank D. Cimino

(57) ABSTRACT

In described examples, a feedback loop has phase detection (PD) circuitry that has a reference input to receive a reference frequency signal, a feedback input to receive a feedback signal, and phase difference outputs. A phase to digital converter (P2DC) includes a first phase to charge converter (PCC) that has a gain polarity and a first phase error output; a second PCC that has an opposite gain polarity and a second phase error output. A differential loop filter has an amplifier with an inverting input coupled to the first phase error output and a non-inverting input coupled to the second phase error output. An analog to digital converter (ADC) has an input coupled to an output of the differential loop filter. A feedback path is coupled to the output of the P2DC, with an output of the feedback path providing the feedback signal to the PD feedback input.

20 Claims, 38 Drawing Sheets

(51) Int. Cl.

| | | |
|---|---|---|
| *H03L 7/107* | (2006.01) | |
| *H03L 7/081* | (2006.01) | |
| *H03L 7/187* | (2006.01) | |
| *H03L 7/04* | (2006.01) | |
| *G11C 11/4093* | (2006.01) | |
| *G11C 11/4099* | (2006.01) | |
| *H03M 1/06* | (2006.01) | |
| *H03M 1/08* | (2006.01) | |
| *H03M 1/18* | (2006.01) | |

(52) U.S. Cl.
CPC .............. *H03L 7/04* (2013.01); *H03L 7/0816* (2013.01); *H03L 7/1072* (2013.01); *H03L 7/187* (2013.01); *H03M 1/0626* (2013.01); *H03M 1/0687* (2013.01); *H03M 1/0836* (2013.01); *H03M 1/182* (2013.01)

(58) Field of Classification Search
CPC ...... H03M 3/458; H03M 1/0626; H03M 1/06; H03M 1/124; H03L 7/0891; H03L 7/087; H03L 7/085; H03L 7/093; H03L 7/1976; H03L 7/193; H03L 7/0807; H03L 7/0895; H03L 7/0998; H03L 7/10; H03L 7/1072; H03L 7/1075; H03L 2207/06; H03L 7/0802; H03L 7/0995; H03L 7/113; H03L 7/18; H03L 7/1974; H04L 7/0025; H04L 1/00; H04L 12/437; H04L 2203/02; H04L 25/0272; H04L 25/14; H04L 25/40; H04L 25/493; H04L 7/0331; H04L 7/0337
USPC .................................................. 341/155, 143
See application file for complete search history.

(56) References Cited

U.S. PATENT DOCUMENTS

| | | | | | |
|---|---|---|---|---|---|
| 7,595,698 | B2 * | 9/2009 | Ben-Bassat | ........... | H03L 7/0898 |
| | | | | | 331/25 |
| 7,746,181 | B1 * | 6/2010 | Moyal | ....... | H03L 1/00 |
| | | | | | 331/11 |
| 8,553,827 | B2 * | 10/2013 | Zhang | ..... | H03L 7/093 |
| | | | | | 331/34 |
| 9,319,051 | B2 * | 4/2016 | Syllaios | .......... | H03L 7/193 |
| 9,455,667 | B2 * | 9/2016 | Vlachogiannakis | .. | H03M 1/002 |
| 9,588,497 | B1 * | 3/2017 | Monk | ..... | H03L 7/093 |
| 2008/0165043 | A1 * | 7/2008 | Wiesbauer | ............ | H03M 3/484 |
| | | | | | 341/143 |
| 2012/0200328 | A1 * | 8/2012 | Yao | ........ | H03L 7/1976 |
| | | | | | 327/157 |
| 2013/0113528 | A1 * | 5/2013 | Frantzeskakis | ......... | H03L 7/104 |
| | | | | | 327/117 |
| 2013/0169457 | A1 * | 7/2013 | Helio | .................... | G04F 10/005 |
| | | | | | 341/172 |
| 2014/0354336 | A1 * | 12/2014 | Syllaios | .................. | H03L 7/193 |
| | | | | | 327/156 |
| 2017/0063385 | A1 * | 3/2017 | Sie | ......... | H03L 7/093 |
| 2018/0083809 | A1 * | 3/2018 | Tajalli | ..... | H03L 7/087 |
| 2018/0212611 | A1 * | 7/2018 | Shen | ..... | H03L 7/0898 |
| 2018/0254774 | A1 * | 9/2018 | Thijssen | ............... | H03L 7/0991 |
| 2019/0074842 | A1 * | 3/2019 | Sun | ........... | H03L 7/06 |
| 2020/0373927 | A1 * | 11/2020 | Liang | ..................... | H03L 7/087 |

OTHER PUBLICATIONS

Michael H. Perrott et al, "A Low Area, Switched-Resistor Based Fractional-N Synthesizer Applied to a MEMS-Based Programmable Oscillator", IEEE Journal of Solid-State Circuits, vol. 54, No. 12, Dec. 2010, pp. 2566-2581.

Benyong Zhang et al, "TI BAW technology enables ultra-low jitter clocks for high-speed networks", White Paper, SNOAA34, Texas Instruments Incorporated, Feb. 2019, pp. 1-11.

"Delta-sigma modulation", Wikipedia, available at https://en.wikipedia.org/w/index.php?title=Delta-sigma_modulation&oldid=1037968959 on Aug. 9, 2021, pp. 1-14.

* cited by examiner

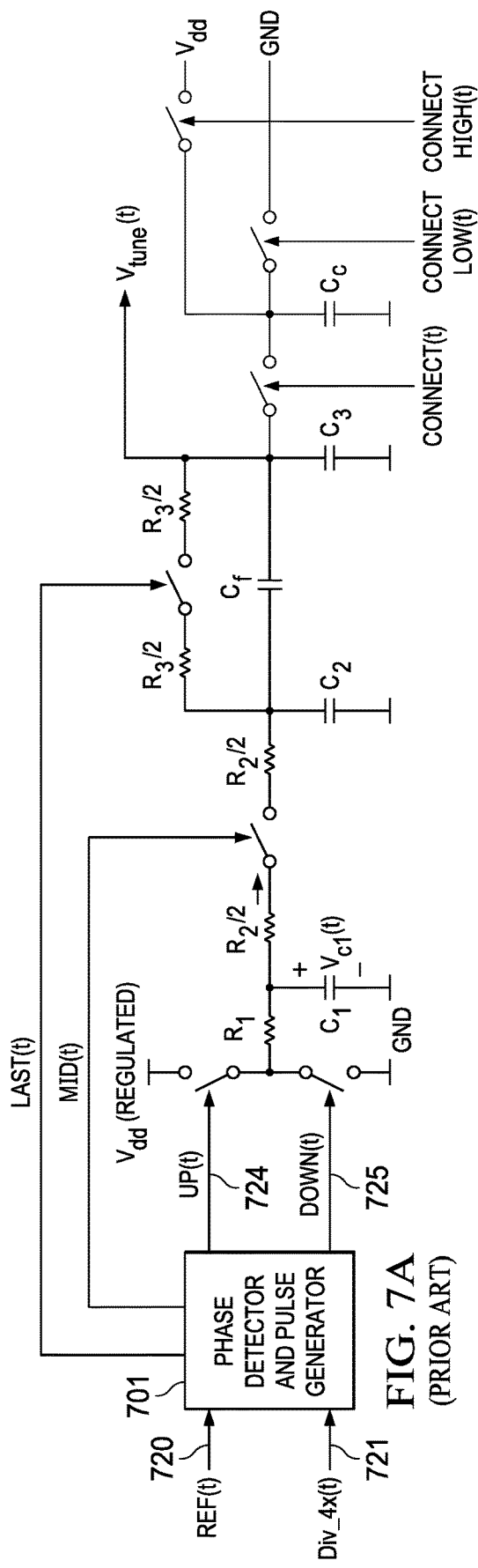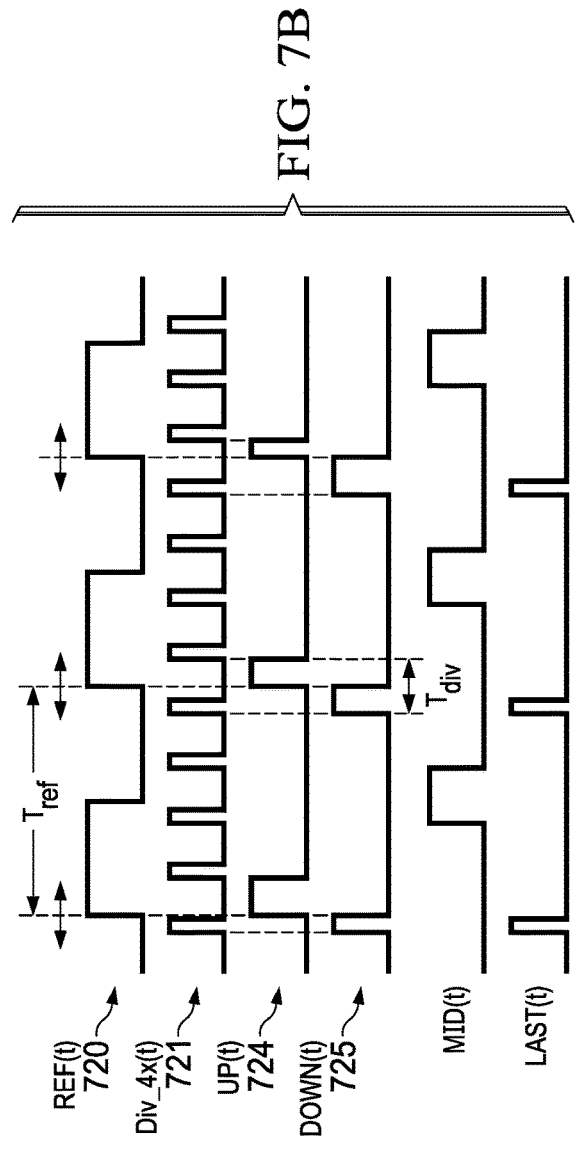
FIG. 7A (PRIOR ART)
FIG. 7B

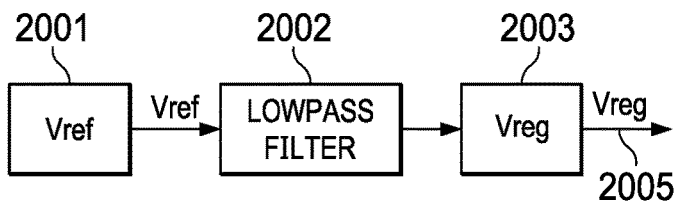
FIG. 20
FIG. 21
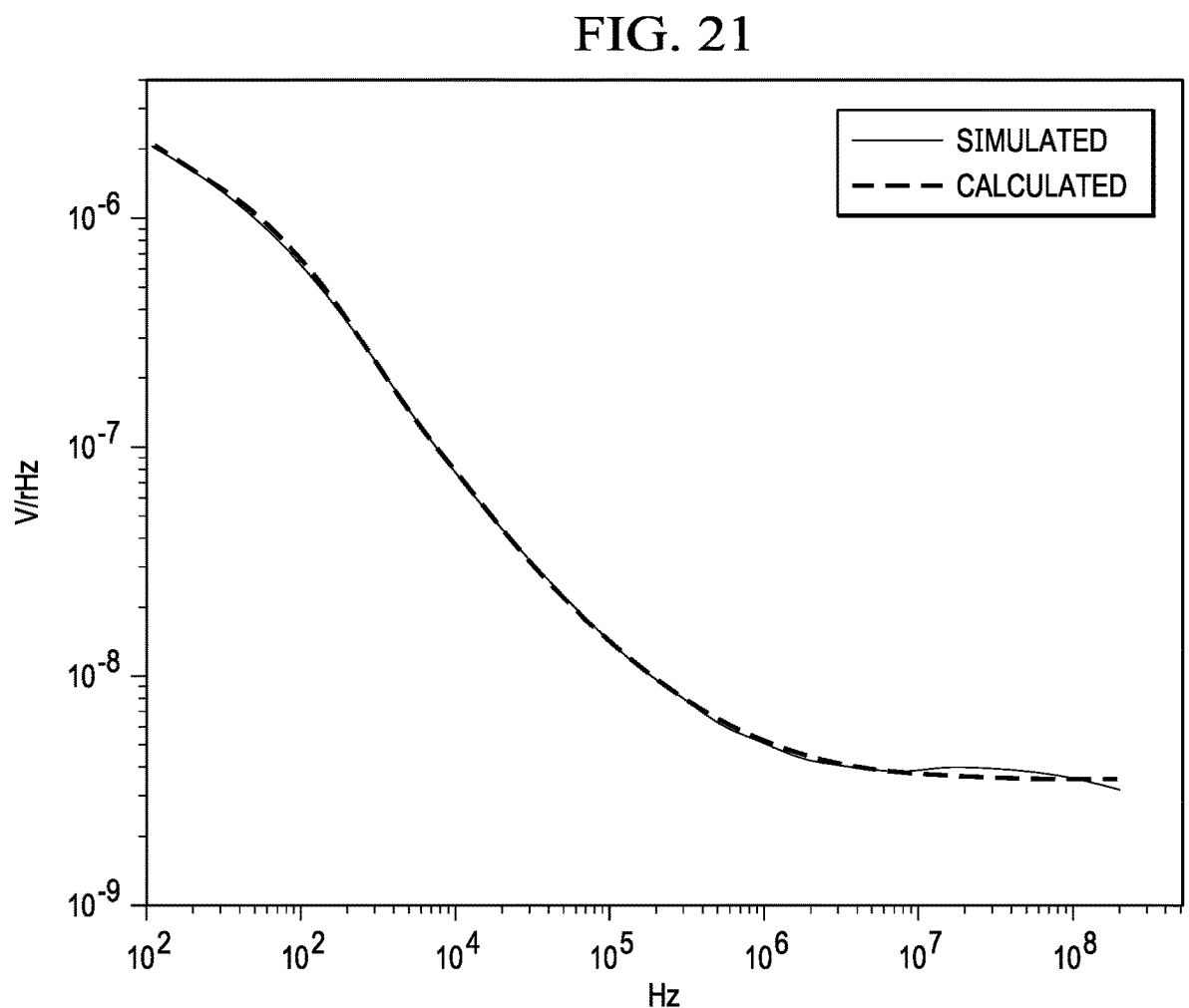

HIGH GAIN DETECTOR TECHNIQUES FOR LOW BANDWIDTH LOW NOISE PHASE-LOCKED LOOPS

CROSS-REFERENCE TO RELATED APPLICATION

This application claims priority to U.S. Provisional Patent Application No. 63/136,245 filed Jan. 12, 2021, the entirety of which is incorporated herein by reference.

TECHNICAL FIELD

This relates to high gain phase detector techniques for a low noise feedback loop.

BACKGROUND

Low phase noise operation for phase-locked loops (PLLs) or related feedback structures is enabled by high gain phase detector (PD) techniques. A high gain PD allows low detector noise to be achieved, which is typically a key bottleneck to achieving low phase noise at low frequency offsets.

There are several techniques for achieving high gain PD functionality. An example is a slope-based sampling PD structure, see, for example: "A 28-nm 75-fsrms Analog Fractional-N Sampling PLL With a Highly Linear DTC Incorporating Background DTC Gain Calibration and Reference Clock Duty Cycle Correction," Wanghua Wu et al, 2019. Another example is an Up/Down resistor-capacitor (RC) charging circuit that utilize a limited time range for the Up/Dn timing window, see, for example: "A Low Area, Switched-Resistor Based Fractional-N Synthesizer Applied to a MEMS-Based Programmable Oscillator Phase detector," Michael H. Perrott, et al, 2010. The slope-based sampling PD structure offers high gain but suffers from process and temperature (PT) sensitivity of that gain since the slope will generally be impacted by PT variations. The Up/Dn RC charging circuits offer gain that is generally robust against PT variation but are generally more limited by supply voltage than the slope-based structure. Both approaches are sensitive to supply noise.

SUMMARY

In described examples, a feedback loop includes a fully differential loop filter structure with gain fed by high gain phase detectors with opposite gain polarity for supply rejection. In some examples, a differential output is fed into differential or pseudo-differential ADC. In some examples, the feedback loop is augmented with bang-bang detector with a dead zone in order to extend phase error range for faster phase locking.

In described examples for low bandwidth applications, an enhanced delta-sigma modulator is used to reduce quantization noise at low frequencies without significant impact to shaped noise at high frequencies

BRIEF DESCRIPTION OF THE DRAWINGS

FIG. 7A is a schematic and FIG. 7B is a timing diagram of another prior art phase detector.
FIG. 20 is a block diagram of an example voltage supply for a PLL.
FIG. 21 is a plot of noise vs frequency for the supply of FIG. 20.

DETAILED DESCRIPTION

Figure 1:
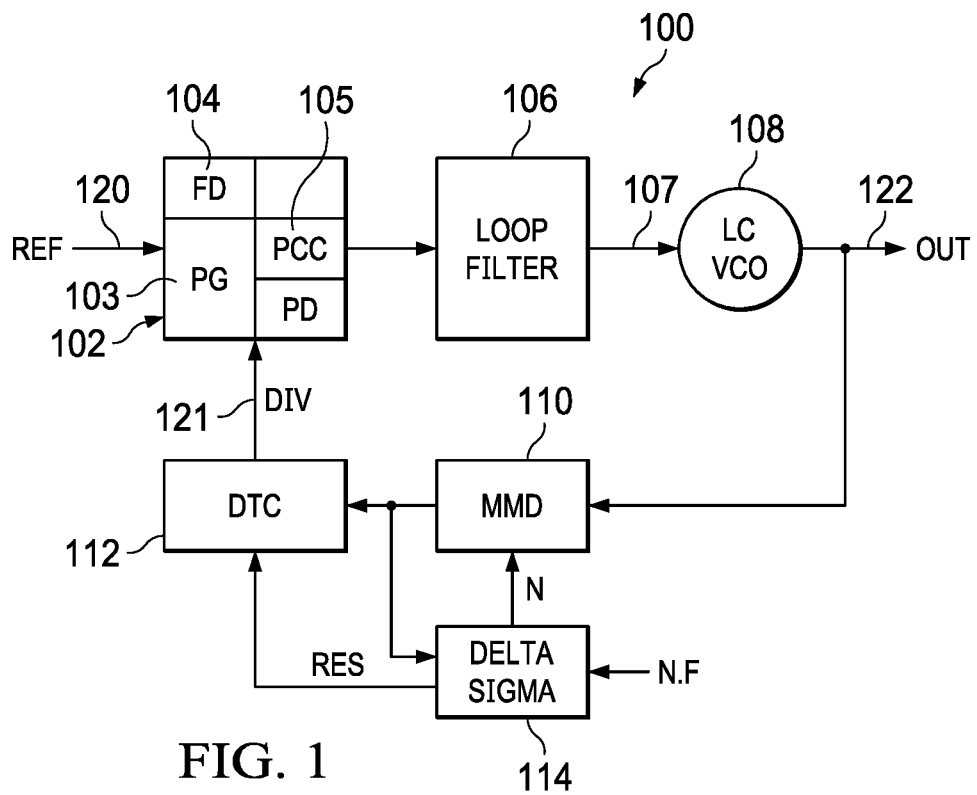
FIG. 1 is a block diagram of an example phase locked loop (PLL).

In the drawings, like elements are denoted by like reference numerals for consistency.

In examples described herein, achievement of low phase noise at low offset frequencies for phase-locked loops (PLLs) or related feedback structures is enabled by high gain phase detector (PD) techniques. In particular, a high gain PD allows reduction of the impact of detector noise to be achieved, which is typically a key bottleneck to achieving low phase noise at low frequency offsets.

In other examples described herein, low noise PLLs or related feedback structures are greatly aided by achieving a wide bandwidth (BW) for the PLL in order to suppress voltage-controlled oscillator (VCO) noise. However, wide BW PLLs are significantly impacted by phase detector noise, and therefore must achieve low phase detector noise in order to achieve low jitter. High gain phase detector techniques allow low detector noise impact to be achieved.

While high gain PD techniques exist, they are generally sensitive to process and temperature (PT) variation, voltage supply noise, and/or limited supply voltage (often <1.2V for core devices in advanced CMOS). PD gain variations can degrade PLL jitter performance across PT variation due to corresponding changes in the PLL bandwidth.

Voltage supply noise can degrade the low frequency phase noise performance. While such supply noise can be reduced with passive lowpass filtering, such filters require substantial area and may even require inclusion of undesired off-chip components such as discrete capacitors. Lower supply voltage is desired to reduce power consumption and allow use of core devices in advanced CMOS but can degrade PLL performance due to reduced PD gain.

There are several techniques for achieving high gain PD functionality. An example is a slope-based sampling PD structure. Another example is an Up/Down resistor-capacitor (RC) charging circuit that utilizes a limited time range for the Up/Dn timing window. The slope-based sampling PD structure offers high gain but suffers from PT sensitivity of that gain since the slope will generally be impacted by PT variations. The Up/Dn RC charging circuits offer gain that is generally robust against PT variation but are generally more limited by supply voltage than the slope-based structure. Both approaches are sensitive to supply noise.

In examples described herein, high gain PD techniques reduce sensitivity to supply noise by leveraging a differential structure. In another example, a technique is described for augmenting a delta-sigma modulator to reduce its low frequency quantization noise without substantially increasing high frequency quantization noise, which is useful for improving low frequency phase noise performance without incurring additional noise folding due to nonlinearity of the phase detector. In another example, a digital-to-time converter is used as an alternative for reducing the quantization noise with the benefit of enabling wider bandwidth, but comes at the cost of higher complexity, power, and area.

Examples described herein are based on improvements to the Up/Dn RC charging circuit approach to achieve higher PD gain and to reduce sensitivity to supply noise. A higher PD gain is achieved by leveraging charge pump techniques to increase the effective supply voltage seen by the PD during the Up/Dn charge/discharge times.

A lower sensitivity to supply noise is achieved through loop filter topologies that may be combined with various phase detector techniques. Single-ended and differential versions of example loop filter topologies are described herein. Some examples described herein utilize a differential structure in order to reduce sensitivity to supply noise while maintaining high gain for the PD. In some described examples, an ADC is included to digitize the differential signal.

In general, achievement of lower noise through brute force methods such as increased power/area encounter practical limits due power/area constraints for a product. In examples described herein, techniques to increase PD gain utilize circuit topologies that can be implemented with modest power/area requirements and enable state-of-the art jitter requirements to be met. Achievement of insensitivity to low frequency supply noise can often be achieved with external capacitors, but this is undesirable due to increased cost to the final system and difficulties in board design to avoid noise injection into the routing traces and pins associated with the external capacitors. Examples described herein use techniques for reducing supply sensitivity that avoid the need for such external capacitors.

FIG. 1 is a block diagram of an example phase locked loop (PLL) 100. A voltage-controlled oscillator (VCO) 108 outputs a variable frequency signal on oscillator output node 122 that is tuned according to a control voltage 107. Feedback is used to lock the VCO output frequency to a multiple of the reference frequency input signal 120 through the use of a multi-modulus frequency divider (MMD) 110, phase detector (PD) 102, and loop filter 106. In this example, the phase detector 102 also includes frequency detection (FD) logic 104. Phase detector 102 includes pulse generation (PG) logic 103 that produces up and down pulses whose pulse width varies with the phase difference between the reference frequency 120, Ref, and divider (Div) output 121. A phase to charge converter (PCC) 105 converts the up and down PD signals into pulses that are then filtered by loop filter 106 to form the control voltage 107. PCC 105 is configured to provide a high gain for PD 102

Digital-to-time converter (DTC) 112 is utilized to reduce quantization error from delta-sigma modulator 114 dithering of divider 110 so as to avoid noise folding due to nonlinearity of the high gain PD 102. In some examples, DTC 112 allows a phase adjustment. DTC 112 produces a variable delay that is determined by a digital input value provided by delta sigma 114 and MMD 110. The frequency divide value of MMD 112 is controlled by delta sigma 114. The output of MMD 110 serves as a clock input to delta sigma 114 and an input to DTC 112.

In some examples, the divisor value of multi-modulus divider 110 may be changed dynamically.

Figure 2:
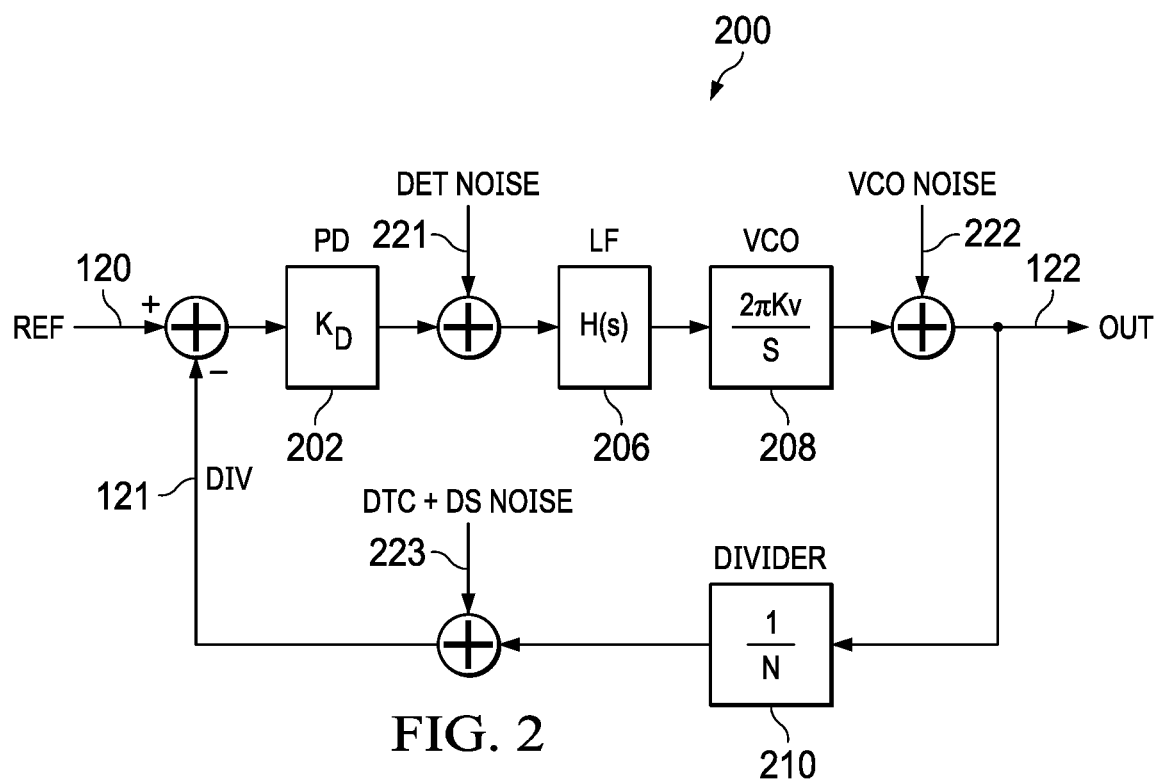
FIG. 2 is an example noise model of the PLL of FIG. 1.
Figure 3:
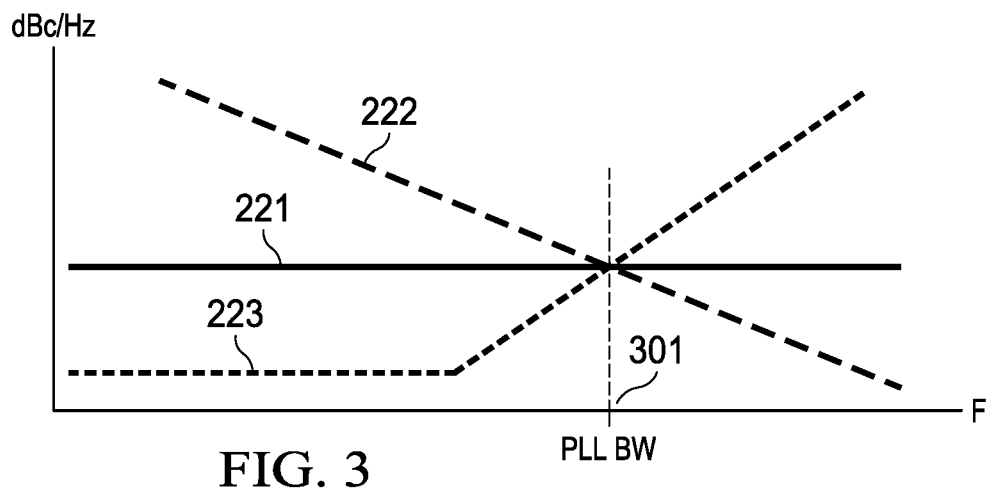
FIGS. 3-5 are plots of phase noise level (dBc/Hz) versus offset frequency (f) for the noise model of FIG. 2.
Figure 4:
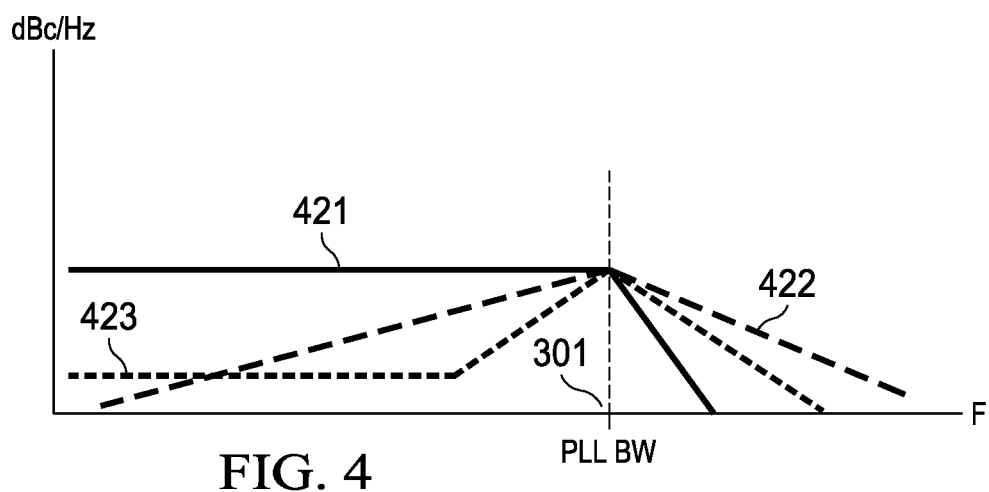

FIG. 2 is an example noise model 200 of the PLL of FIG. 1. FIG. 3 is a plot of raw phase noise level (dBc/Hz) versus offset frequency (f) for the noise model of FIG. 2. FIG. 3 is a plot of phase noise level before filtering within PLL 100 (FIG. 1). FIG. 4 is a plot of phase noise level after filtering within PLL 100 (FIG. 1). This example model includes phase detector 202, loop filter 206, VCO 208, and divider 210. $K_D$ 202 is the gain of phase detector 102. H(s) 206 is the transfer function of loop filter 106. (2πKv)/s 208 is the transfer function for VCO 108. N is the divider value of divider 110.

Various sources of noise contribute to degradation of loop performance, such as: phase detector noise 221, quantization noise from the divider, DTC thermal noise and delta sigma dithering noise 223, some residual noise that is not canceled, supply noise, etc. Supply noise affects all blocks, but especially is an issue for the phase detector and loop filter. Delta sigma modulator 114 causes noise 223 to rise to higher frequencies that can be filtered by the loop filter 206. VCO noise 222 gets high-pass filtered by the loop, but some low frequency noise gets through. Phase detector 202 is low pass filtered by the loop filter 206 but some high frequency noise gets through.

As illustrated in FIG. 4, after filtering by PLL 100, detector noise 421 dominates at low frequency offsets relative to the PLL bandwidth indicated at 301. VCO noise 422 dominates at high frequency offsets. DTC and DS noise 422 is reduced due to filtering by the PLL.

Referring to FIG. 2, expression (1) quantifies the transfer function relationship from detector noise to the output signal on output terminal 122. For the case where s is much less than PLL bandwidth (BW), expression (1) can be simplified to expression (2).

$$H_{out/det}(s) = \frac{H(s)2\pi K v/s}{1 + K_D/NH(s)2\pi K v/s} \quad (1)$$

$$\approx \frac{N}{K_D} \text{ for } s \ll PLL\ BW \quad (2)$$

Thus, detector noise 421 is approximately equal to $N/K_D$, therefore, maximizing detector gain $K_D$ results in minimizing the impact of detector noise on output 122.

Figure 5:
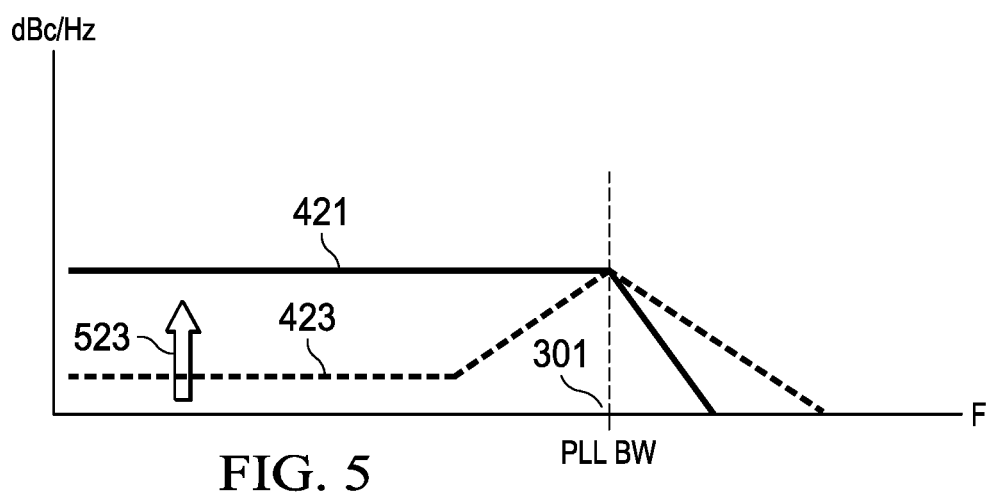

FIG. 5 illustrates noise folding that may occur if DTC 112 (see FIG. 1) is not included in PLL 100. Without DTC 112, nonlinearity in phase detector 102 leads to noise folding of delta sigma noise 423, as indicated at 523. Such noise folding is avoided by the use of DTC 112 which reduces the impact of dithering by delta sigma modulator 114 (see FIG. 1) on phase error.

Figure 6A:
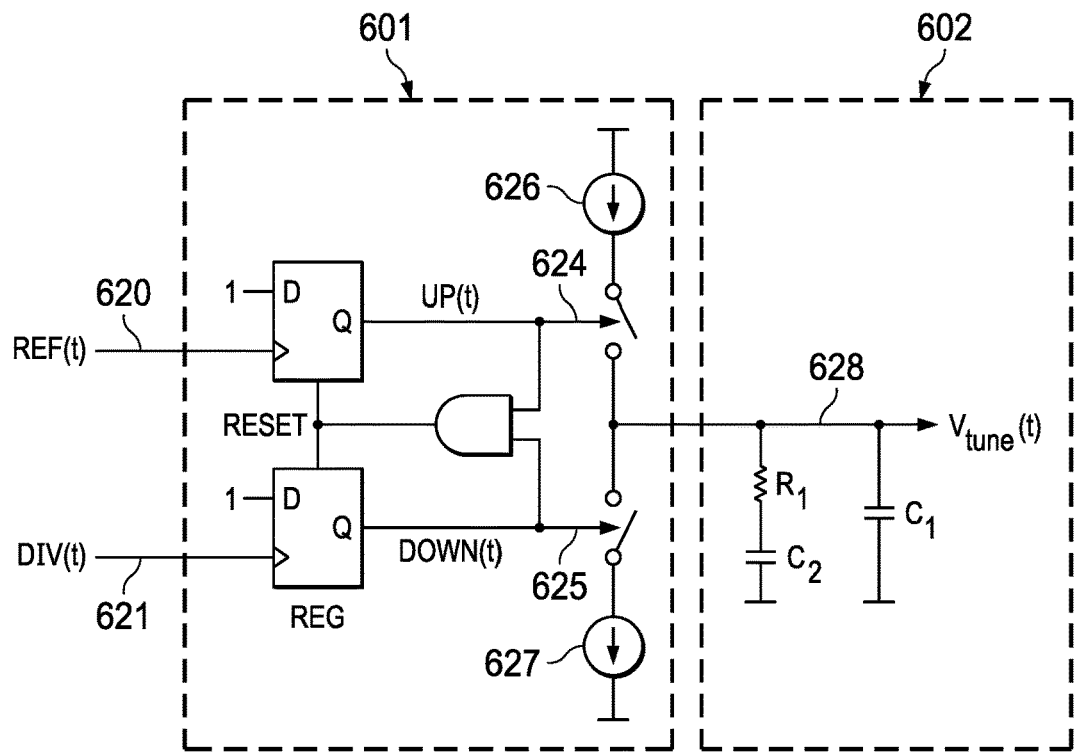
FIG. 6A is a schematic and FIG. 6B is a timing diagram of a prior art phase detector and loop filter.
Figure 6B:
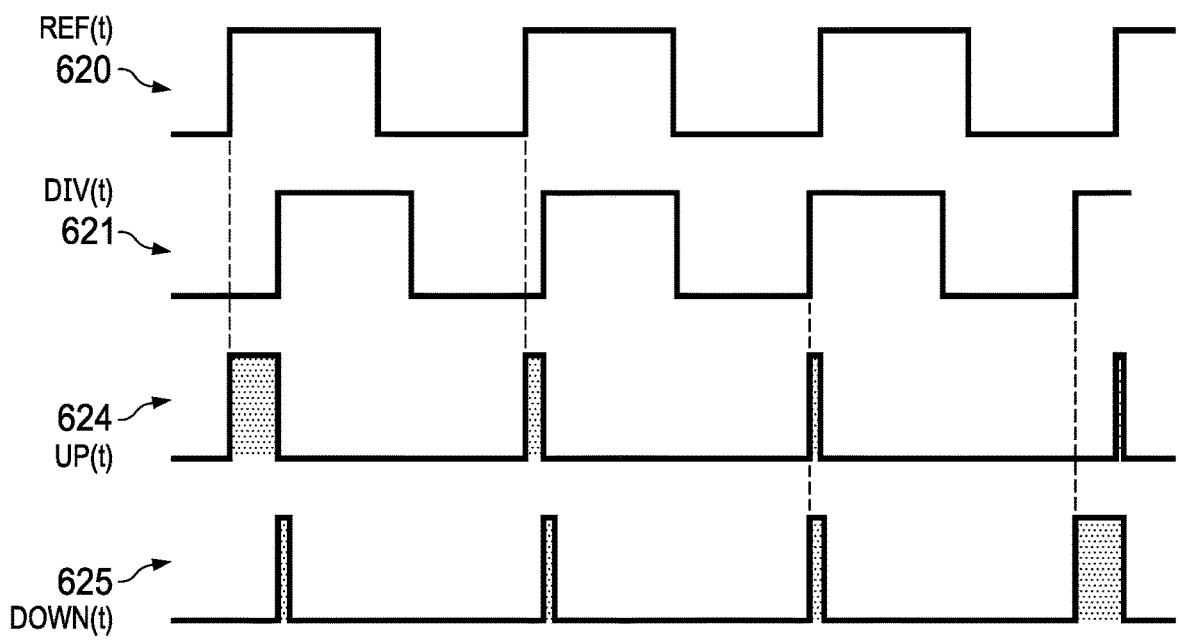

FIG. 6A is a schematic of a prior art phase detector 601 and loop filter 602 for use in a feedback structure such as a phase locked loop. Phase detector 601 generates an up-pulse signal 624 and a down-pulse signal 625 whose widths are a function of phase difference between reference frequency signal 620 and feedback divided signal 621, as illustrated in FIG. 6B.

Charge pump 626 is turned on in response to up pulse signal 624 and charge pump 627 is turned on in response to down pulse signal 625. Charge pumps 626, 627 are added to allow up or down control of the VCO tuning voltage formed on node 628. Expression (3) represents the loop filter transfer function, H(s), from output of the charge pump to the VCO tuning voltage 628. In general, larger charge pump current, which is advantageous for improved detector noise, must be accompanied by an increase in loop filter capacitors to achieve a given PLL bandwidth. This often leads to the requirement of large physical capacitors that typically must be located off chip, which is undesirable for an integrated single chip solution.

$$H(s) = \frac{1}{s(C_1 + C_2)} \frac{1 + s/w_z}{1 + s/w_p} \quad (3)$$

FIG. 7A is a schematic of a prior art phase detector 701 and loop filter for use in a feedback structure such as a phase locked loop that does not use current sources to increase phase detector gain. Instead, the ratio of the reference signal period (Tref) to the divided feedback signal period (Tdiv) is increased. In this example, the divisor is selected so that the feedback divided signal 721 frequency is four times the frequency of the reference signal 720. Phase detector 701 sees a phase error range over a smaller phase window and the corresponding phase detector gain is increased due to the small phase error range. In this example, there is a 4× improvement due to 4× frequency ratio. This provides a relatively stable phase detector gain since the Tref/Tdiv ratio is PVT insensitive. However, this phase detector and loop filter approach is very sensitive to supply voltage (Vdd) noise and there is some impact of noise folding for fractional-N implementations due to nonlinearity from RC charging behavior within the loop filter.

Phase detector 701 generates an up-pulse signal 724 and a down-pulse signal 725 whose widths are a function of phase difference between reference frequency signal 720 and feedback divided signal 721, as illustrated in FIG. 7B.

Phase detector 701 is based on an RC charging mechanism with resistor R1 and capacitor C1. While up signal 724 is active capacitor C1 is charged via resistor R1. While down signal 725 is active C1 is discharged. When up or down are not present, then capacitor C1 holds the voltage.

Figure 8A:
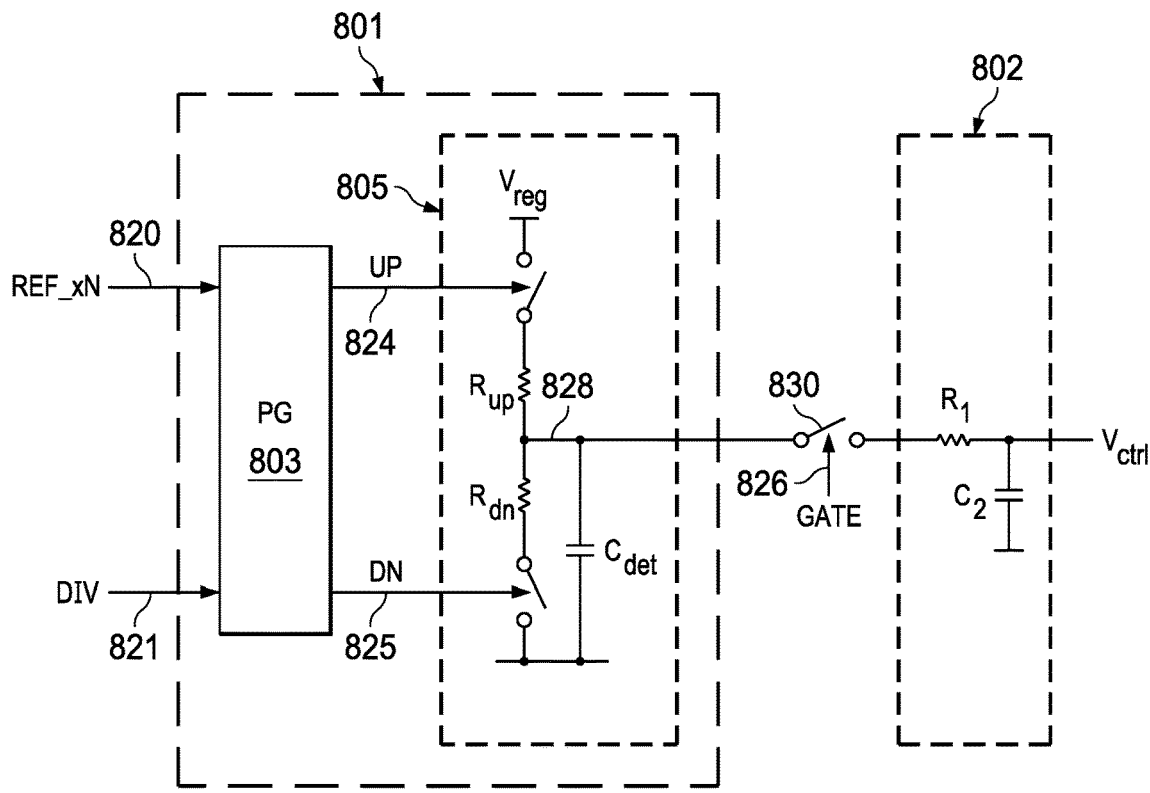
FIG. 8A is a schematic and FIG. 8B is a timing diagram of another prior art phase detector.
Figure 8B:
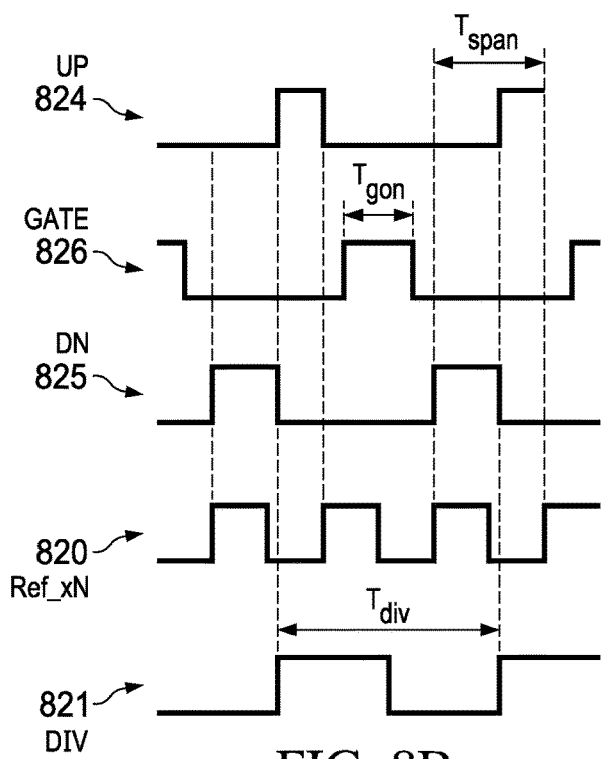

FIG. 8A is a schematic and FIG. 8B is a timing diagram of another prior art switched resistor phase detector 801 and loop filter 802. In this example, only the phase to charge module 805 of the phase detector is illustrated in detail for simplicity. Pulse generation module 803 generates the pulse signals illustrated in FIG. 8B. In this example, a separate up-charge resistor Rup and down-charge resistor Rdn are connected to charging node 828 and charging capacitor Cdet. In this example, the phase detector includes a pulse generation circuit 803 to generate the up-pulse signal 824, down-pulse signal 825 and gate signal 826.

In this example, the divider is configured to provide a divided feedback signal 821 that has a frequency that is lower than the frequency of the reference signal 820. As in the example of FIG. 7A, gain of the phase detector is increased due to the ratio of Fref/Fdiv.

Switch 830 is controlled by gate signal 826 to only transfer charge from RC node 828 to loop filter 802 for a limited period of time. The resulting increase in phase detector gain reduces the impact of noise that is transferred from phase to charge converter 805 to loop filter 802.

Phase detectors 701 (FIG. 7A) and 802 are described in more detail in "A Low Area, Switched-Resistor Based Fractional-N Synthesizer Applied to a MEMS-Based Programmable Oscillator Phase detector," Michael H. Perrott, et al, 2010.

High Bandwidth, High Gain Phase Detector Examples

Figure 9A:
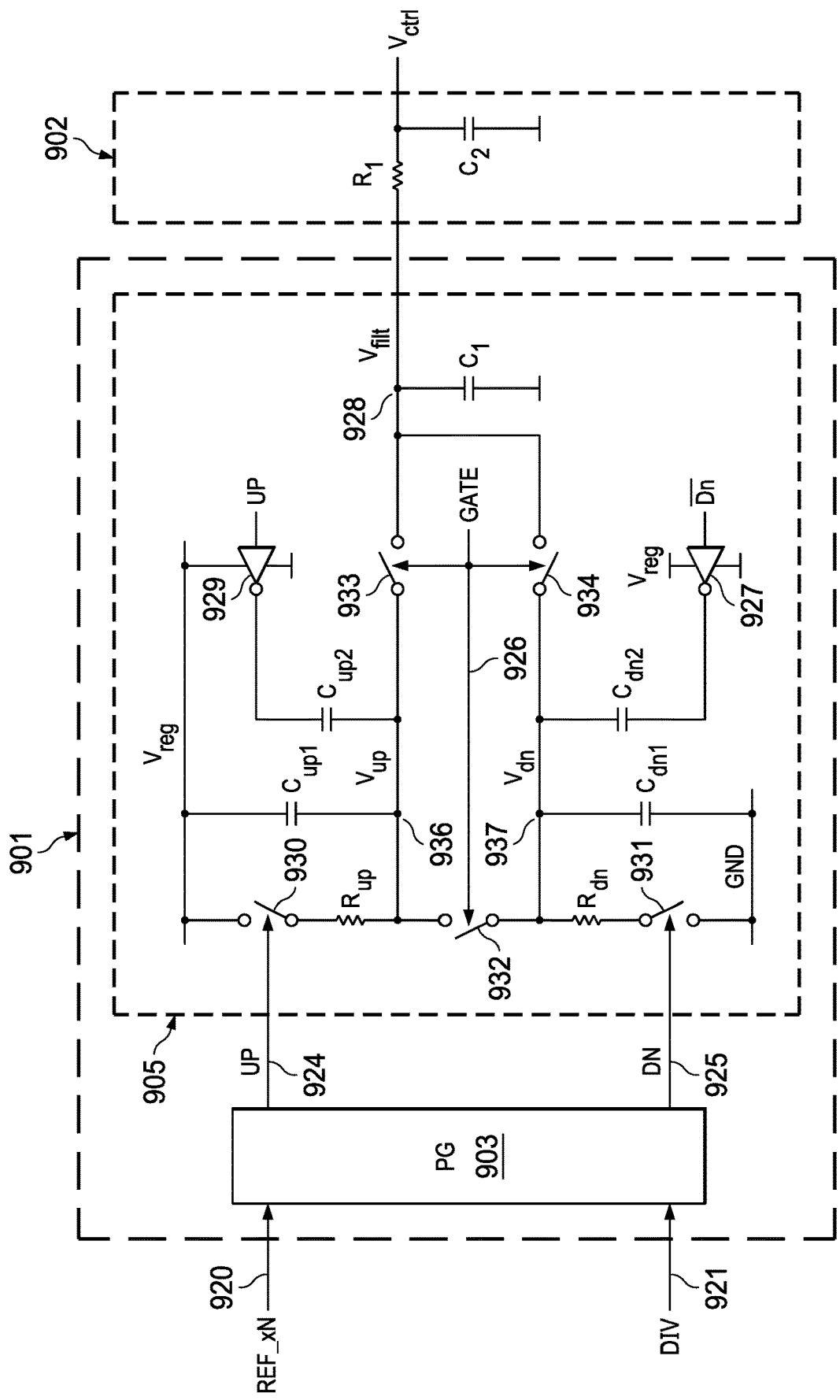
FIG. 9A is a schematic and FIG. 9B is a timing diagram of an example high gain phase detector.

FIG. 9A is a schematic of a switched resistor phase detector 901 and loop filter 902. In this example, the gain of phase detector 901 is improved with a structure that alters RC charging. Phase detector gain is limited by the supply voltage. If a larger supply voltage is used, the gain can be increased. However, process limitations limit the magnitude of the supply voltage without device problems due to overvoltage issues. In this example, the "effective" supply voltage on the RC charging circuit is raised by using a voltage boosting structure 927, 929 (also referred to as a "charge pump") that augments the phase detector. To do this, capacitors Cup2 and Cdn2 are added along with inverters 927 and 929 in order to inject additional charge into capacitors Cup1 and Cdn1 during assertion of Up and Dn signals, respectively. This injection of extra charge has a similar effect on RC charging as what would be achieved with a higher supply voltage. An extra switch 932 allows the Up and Dn network charge states to be shared after the Up and Dn charging events occur. Switches 933 and 934 pass the combined Up and Dn charge states to capacitor C1 such that a phase error voltage signal (Vfilt) is achieved which can be further filtered before influencing the VCO control voltage Vctrl.

In described examples, charge pumps 927, 929 boost a charging voltage on boost capacitors Cup2, Cdn2, respectively in order to increase gain of the phase detector. In another example, a charge pump structure that boosts a current into a suitable element, such as an inductor, may be used to increase an effective supply voltage to increase the gain of a phase detector.

Figure 9B:
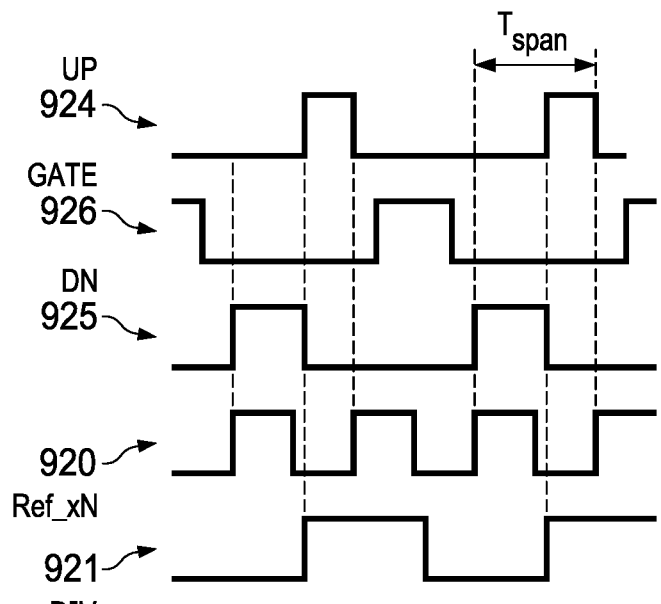

FIG. 9B is a timing diagram illustrating timing signals 924, 925, 926 generated by pulse generator module 903 in response to a reference signal 920 (Ref_xN) and a feedback signal 921 (Div). The time duration of Up pulse 924 is proportional to the time between an edge of reference signal 920 and feedback signal 921. The time duration of Dn pulse 925 is proportional to the time between an edge of reference signal 920 and feedback signal 921. The total length of Up pulse 924 and Dn pulse 925 is constrained to be the period of the reference signal, Tspan.

For example, when down-pulse 925 becomes asserted and switch 931 is closed, the output of inverter 927 will transition to a high voltage state and thereby charge capacitor Cdn2 through resistor Rdn to ground via Vdn RC node 937 and also share charge with capacitor Cdn1. Then, when up-pulse 924 is asserted and switch 930 is closed, the output of inverter 929 will become low and thereby charge capacitor Cup2 through resistor Rup from Vreg via Vup RC node 936 and also share charge with capacitor Cup1. Then, when up-pulse 924 and down-pulse 925 are de-asserted and switches 930, 931 are open, gate pulse 926 is activated to close switches 932, 933 and 934 and thereby couple the RC nodes 936, 937 to filter capacitor C1 at phase error output node 928.

In this example, only the phase to charge converter 905 of the phase detector 901 is illustrated in detail for simplicity. Pulse generation module 903 generates the pulse signals illustrated in FIG. 9B. Pulse generation circuit 903 generates the up-pulse signal 924, down-pulse signal 925 and gate signal 926. In this example, down-pulse signal 925 is enabled only from the rising edge of ref signal 920 to the rising edge of divide signal 921, and the up-pulse signal 924 is enabled only from the rising edge of divide signal 921 to the rising edge of ref signal 920. In this manner, up-pulse signal 924 and down pulse signal 925 are non-overlapping and have a total active time that is equivalent the period (Tspan) of ref signal 920.

In this example, the divider is configured to provide a divided feedback signal 921 that has a frequency that is lower than the frequency of the reference signal 920. Gain of the phase detector is increased due to the ratio of Fref/Fdiv.

Switches 933, 934 are controlled by gate signal 926 to transfer charge from RC nodes 936, 937 to output node 928 for a limited period while gate signal 926 is active. This prevents the phase error voltage Vfilt as well as the VCO control voltage Vctrl from being disturbed by the RC charging activity during enablement of Up and Dn pulses.

Up-pulse 924 and down-pulse 925 are enabled while the gate switches 932, 933, 934 are off. Phase detector gain is improved by an alpha factor, which is a ratio of the caps as given by expression (4). equation. Expression (5) represents the total gain factor of phase detector 901 assuming capacitors Cup1 and Cdn1 are equal in value and that capacitors Cup2 and Cdn2 are also equal in value.

$$\alpha_{det} = \frac{C_{up1} + C_{up2}}{C_{up1}} = \frac{C_{dn1} + C_{dn2}}{C_{dn1}} \quad (4)$$

$$\alpha_{det} \frac{F_{Ref\_xN}}{\pi F_{Div}} \frac{V_{reg}}{2} \quad (5)$$

In some examples, multiple capacitors may be provided that may be selectively switched off using switches, a multiplexor, or other known or later developed technique to dynamically change the gain of the system by varying the capacitor ratio alpha to optimize the gain. If one considers only minimization of the impact of detector noise, alpha should be selected to be as high as possible. However, other considerations such as implementation area, achievable switching speed of inverters 927 and 929 with capacitive loading, and impact on supply may impact the optimal setting of alpha.

Figure 10:
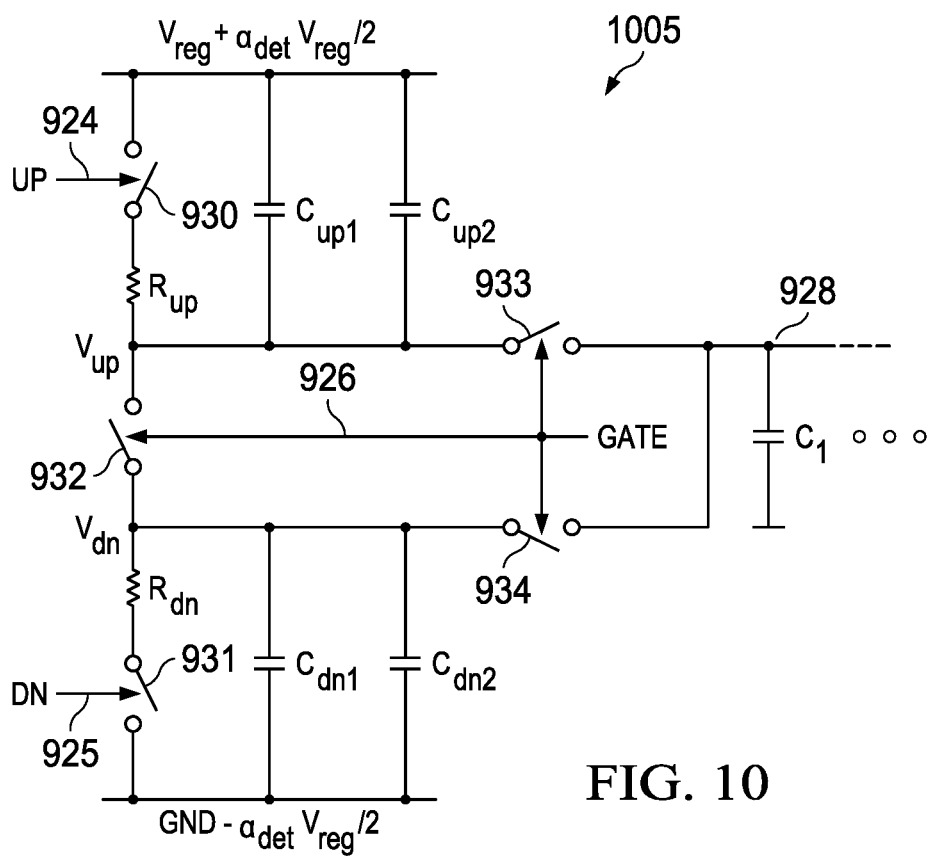
FIG. 10 is a schematic of an equivalent circuit for the phase detector of FIG. 9A.

FIG. 10 is a schematic of an equivalent circuit 1005 for the phase to charge converter 905 for the phase detector 901 of FIG. 9A. As described for FIG. 9A, charge pump structures 927, 929 and Cup2, Cdn2 produce an effect equivalent to raising the supply voltage. In this example, the result is the same as if the supply voltage is raised by an amount equal to $\alpha_{det}$ times one half the supply voltage and the ground voltage is lowered by an amount equal to $\alpha_{det}$ times one half the supply voltage. In this example, the supply voltage for phase detector 901 is a regulated voltage Vreg. In other examples, the supply voltage for the phase detector may be the chip wide supply voltage Vdd or another different voltage source. In this example, the use of charge pump structures 927, 929 and Cup2, Cdn2 allows an effective increase in phase detector gain as determined by the capacitor ratio $\alpha_{det}$.

Figure 11A:
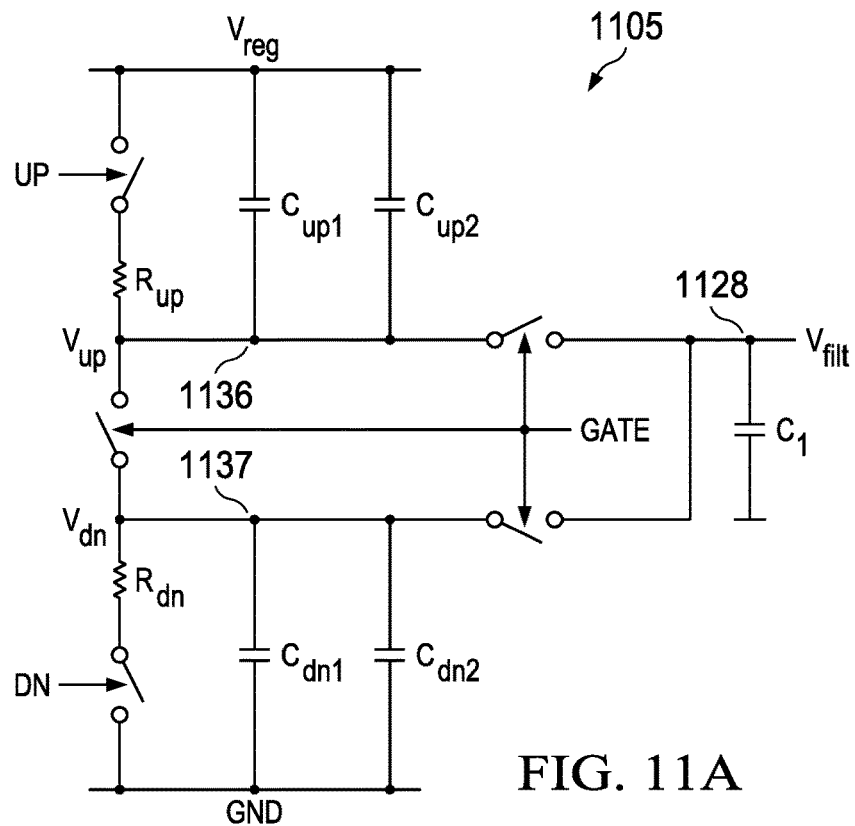
FIG. 11A is a schematic and FIG. 11B is a timing diagram of an example phase to charge converter without charge pump boosting.
Figure 11B:
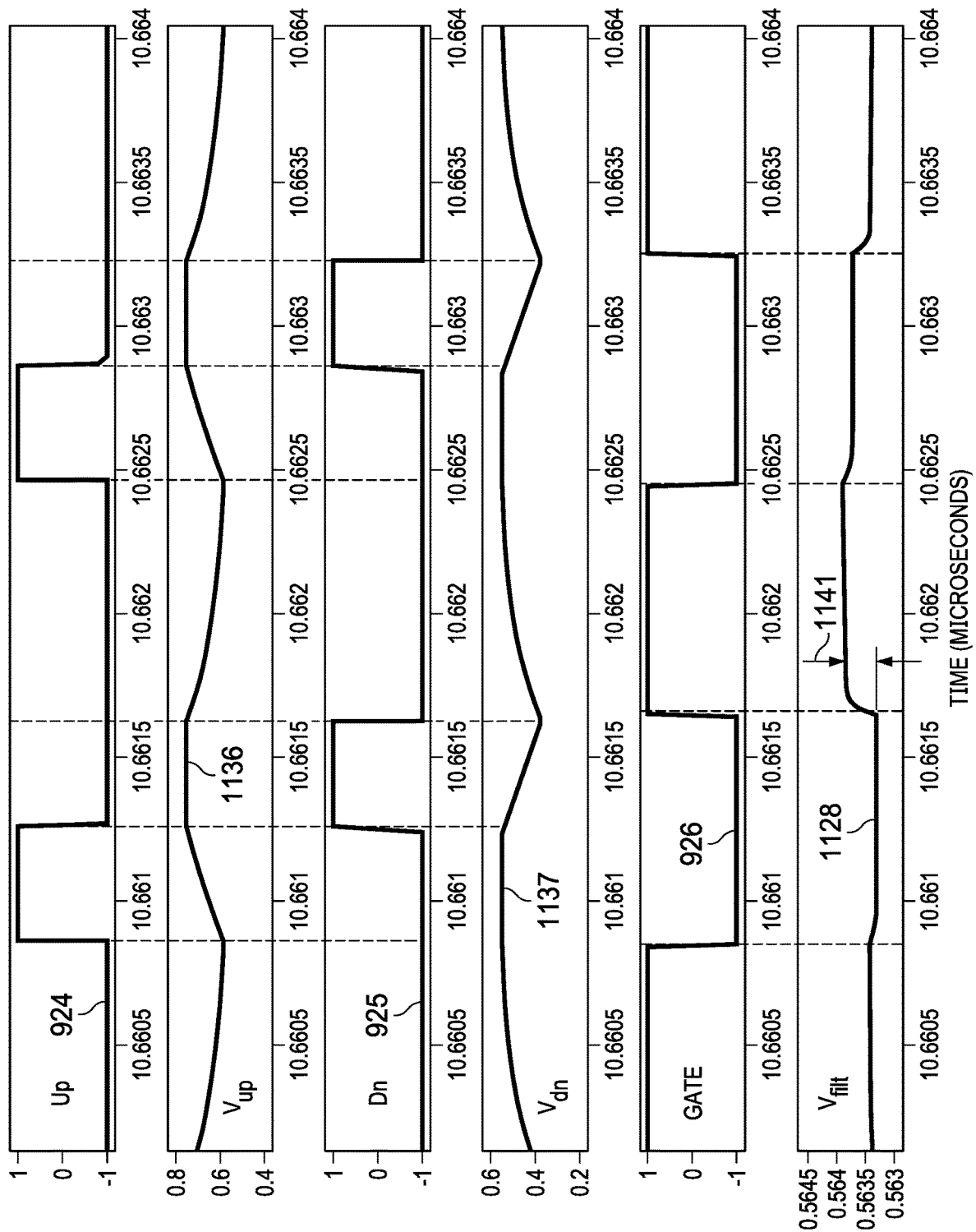

FIG. 11A is a schematic and FIG. 11B is a timing diagram of an example phase to charge converter (PCC) 1105 that is similar to PCC 905 (FIG. 9A) without charge pump structures 927, 929. In this example without gain boosting charge pumps, discharge at Vup node 1136 during up-pulse 924 and discharge at Vdn node 1137 during down-pulse 925 starts at approximately Vreg/2 for both the up and down path. A resulting Vfilt signal is formed on output node 1128.

Figure 12:
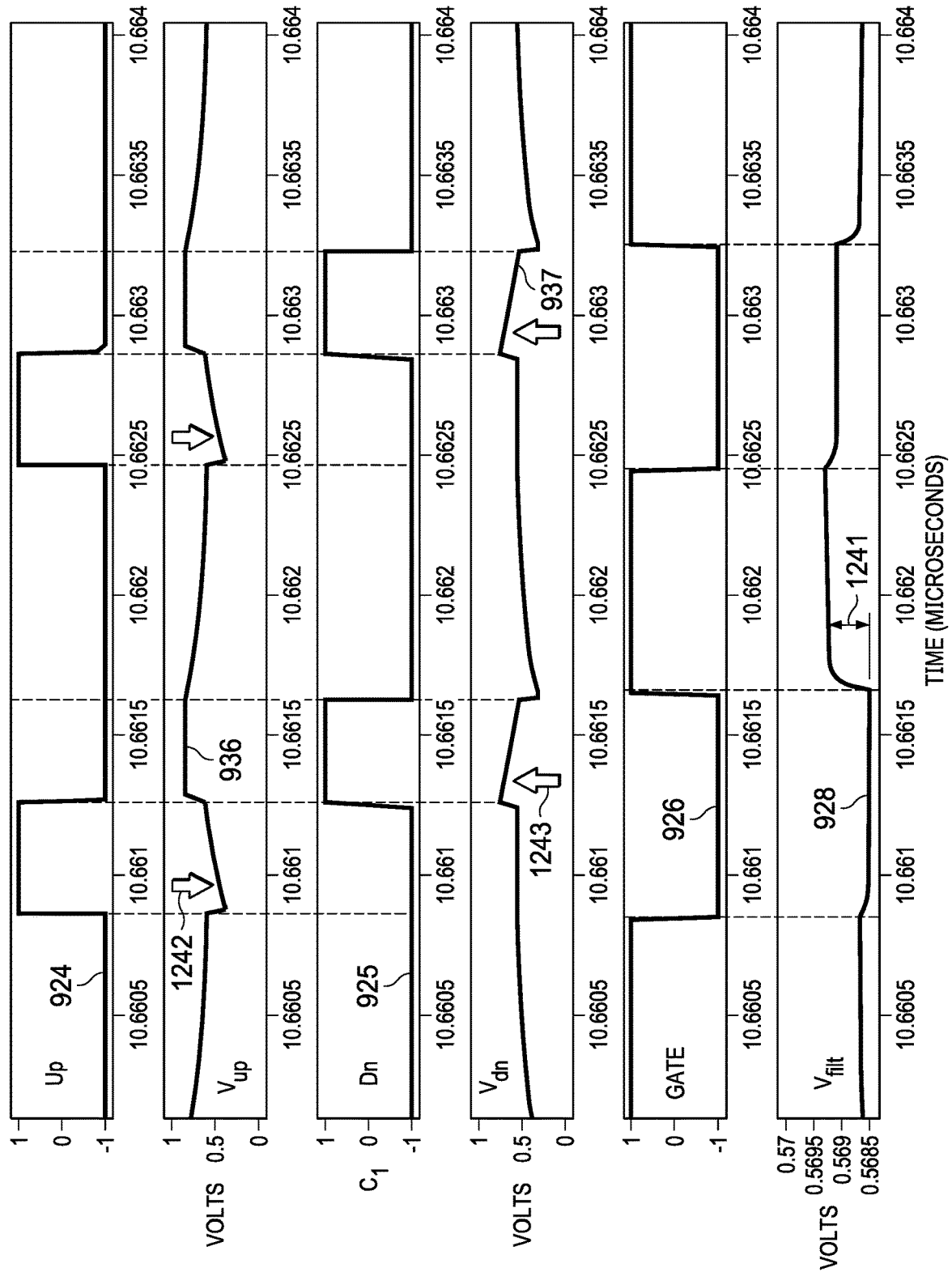
FIG. 12 is a timing diagram showing the effect of charge pump structures provided in the phase detector of FIG. 9A.

FIG. 12 is a timing diagram of example PCC 905 showing the effect of charge pump structures 927, 929 and Cup2, Cdn2. In this example, gain boosting is achieved by increasing the initial voltage across the Rup, Rdn resistors during the enable times of up-pulse 924 and down-pulse 925 as indicated on Vup 936 and Vdn 937 at 1242, 1243 respectively. This results in a larger change in the amplitude of Vfilt 928 for a given change in phase error. Thus, PCC 905 with charge pump structures 927, 929 and Cup2, Cdn2 has a higher gain than PCC 1105 without charge pump structures.

Figure 13B:
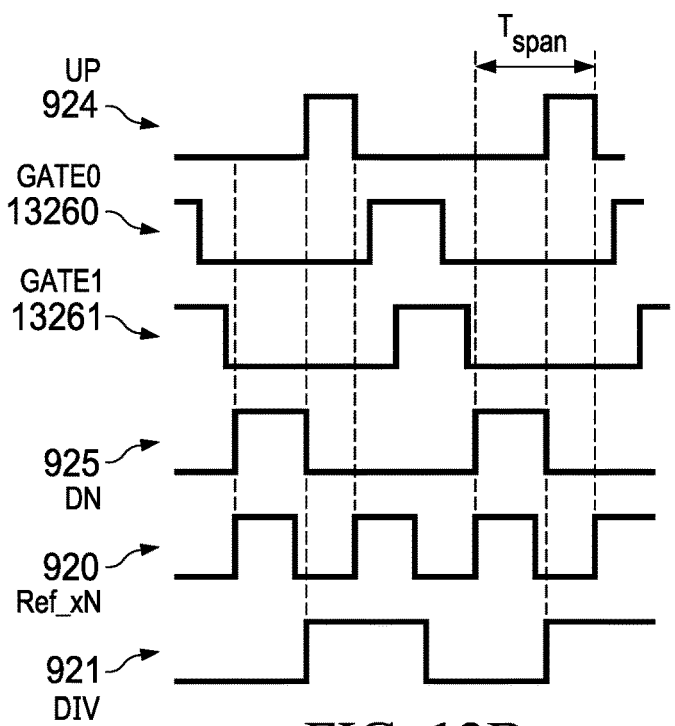
FIG. 13A is a schematic and FIG. 13B is a timing diagram of another example high gain phase detector.
Figure 13A:
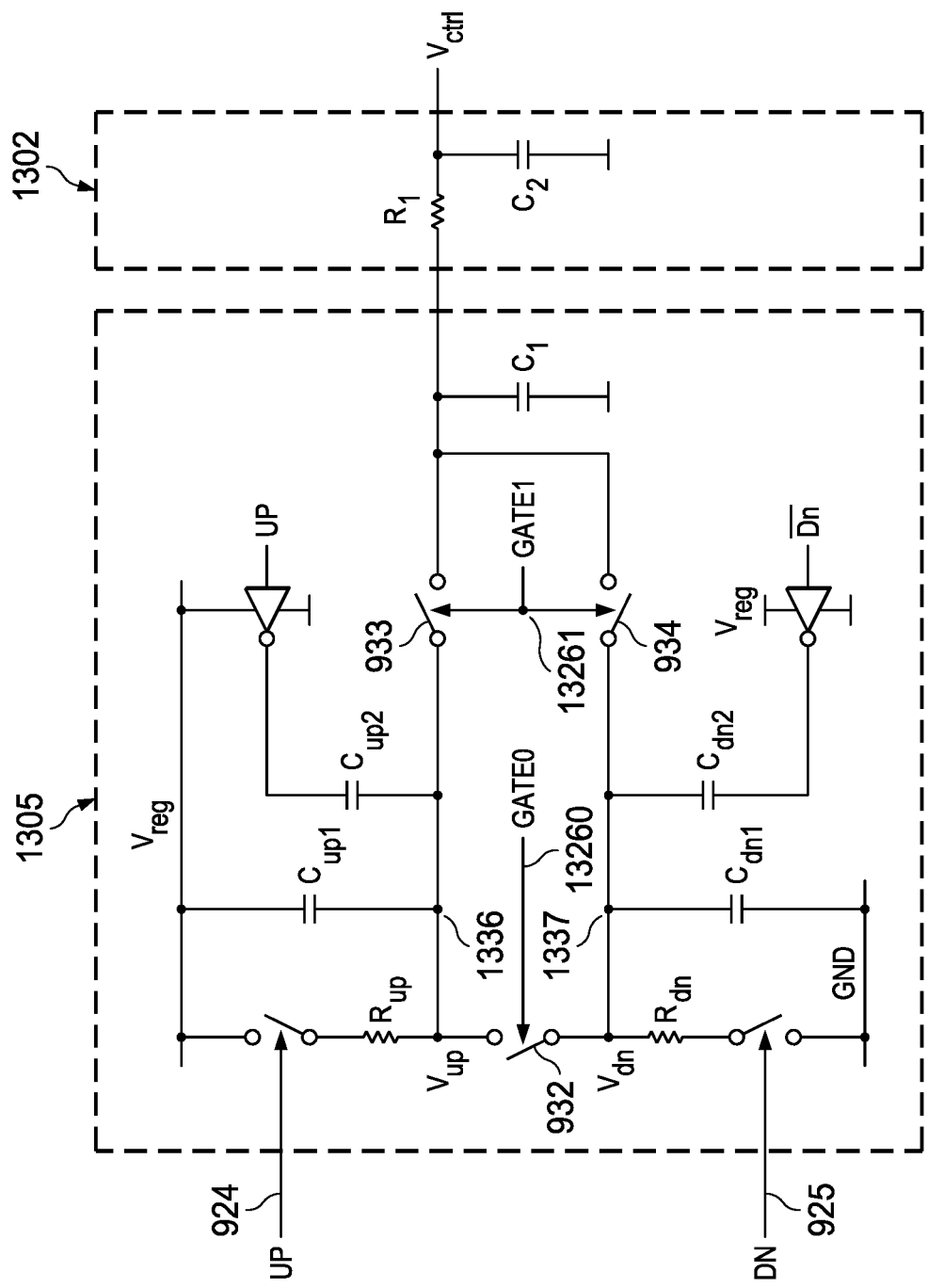

FIG. 13A is a schematic of another example high gain phase to charge converter (PCC) 1305 that is similar to PCC 905 (FIG. 9A). In this example, gate 932 is controlled by gate0 signal 13260, while gates 933, 934 are controlled by an offset gate1 signal 13261.

FIG. 13B is a timing diagram illustrating timing signals 924, 925, 13260, 13261 generated by a pulse generator module similar to PG 903 (FIG. 9A) in response to a reference signal 920 (Ref_xN) and a feedback signal 921 (Div). Gate0 signal 13260 is offset from gate1 signal 13261 by a small amount so that gate 932 is closed slightly before gates 933, 934. This allows ripple on nodes 1336, 1337 to settle out prior to closing switches 933, 934 and thereby reduces ripple sent to filter 1302 and output Vctrl. In this example, the offset time is approximately 5%-10% of Tspan, though optimal offset time will vary according to settling behavior when switch 13260 is on as well as other constraints. Note that Gate0 signal is shown to become de-asserted before Gate1 signal, but other implementations could have Gate0 signal become de-asserted at the same time or after Gate1 signal.

Figure 14:
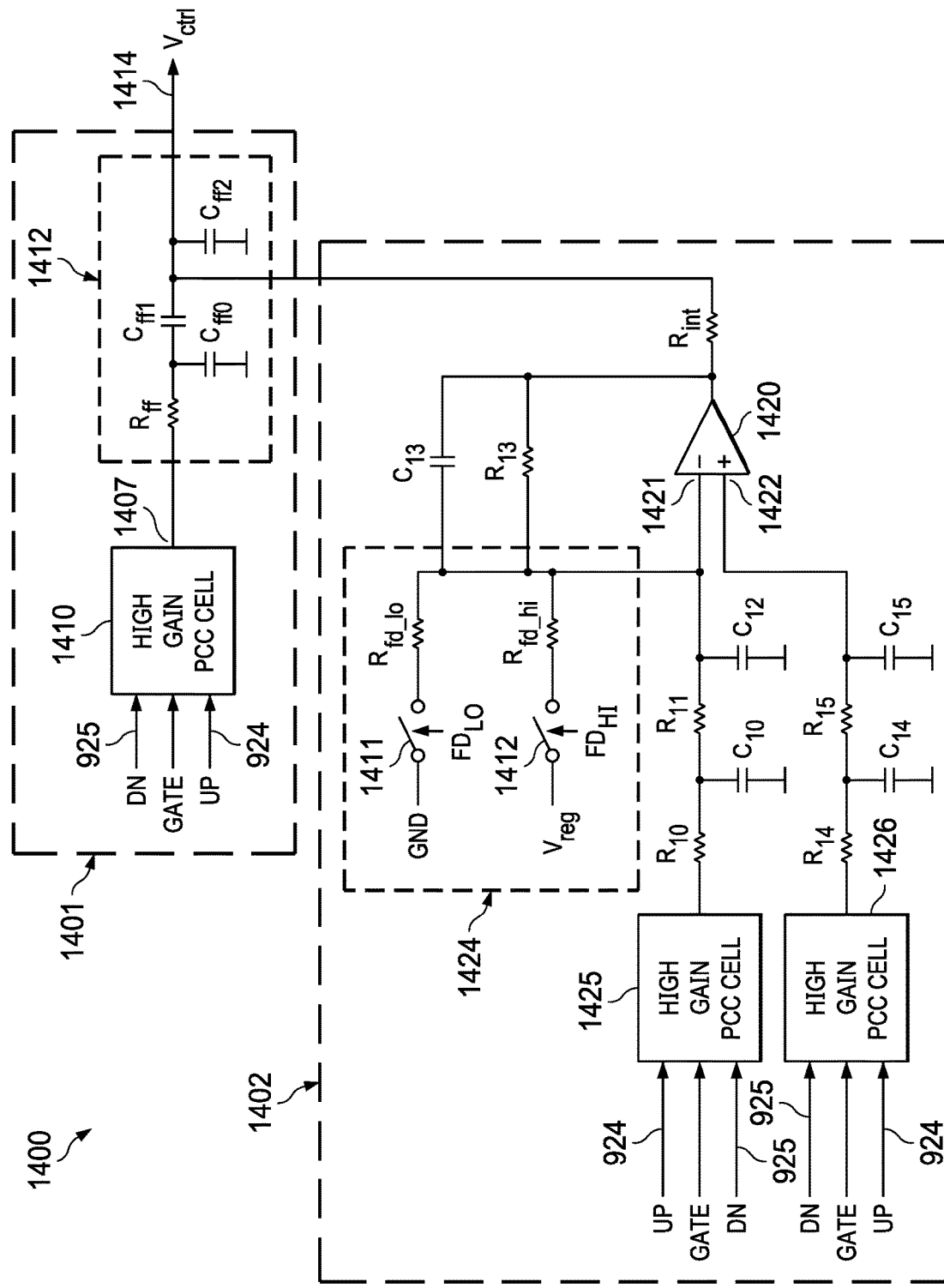
FIG. 14 is a schematic diagram of an example differential high gain phase detector and loop filter.

FIG. 14 is a schematic diagram of an example differential high gain phase detector and loop filter 1400 that can be used in the example PLL 100 of FIG. 1. In this example, a wide band feed-forward (FF) path 1401 includes a high gain PCC cell 1410 coupled to FF filter 1412. Lossy integrating path 1402 includes an opamp 1420 with an inverting input 1421 coupled to receive a filtered output from PCC cell 1425 and a non-inverting input 1422 coupled to receive a filtered output from PCC cell 1426.

Lossy integrating path 1402 also includes a frequency detection path 1424 in which switch 1411 is configured to couple inverting input 1421 to ground through resistor Rfd_lo when a signal FDlo asserts in cases where the frequency of an output signal, such as Out signal 122 (FIG. 1) is too low and in which switch 1412 is configured to couple inverting input 1421 to Vreg through resistor Rfd_hi when a signal FDhi asserts in cases where the frequency of the output signal is too high.

FF filter 1412 combines the output 1407 of PCC cell 1410 and integrating path 1402 to produce a control signal Vctrl on output node 1414. Control signal Vctrl is used to control a variable frequency oscillator that produces Out signal 122 (FIG. 1). In another example, additional filtering may be provided for control signal Vctrl before being output on node 1414.

PCC cells 1410, 1425, and 1426 can be the same as PCC 905 (FIG. 9A), PCC 1005 (FIG. 10), PCC 1105 (FIG. 11B), PCC 1305 (FIG. 13A) or another known or later developed PCC cell. However, notice that the Up signal 924 and Dn signal 925 are opposite between PCC 1425 and PVV 1426. This allows cancellation of low frequency supply noise and use of both the inverting input 1421 and non-inverting input 1422 of opamp 1420. In this manner, opamp 1420 noise impact is reduced by approximately 2× by leveraging both the inverting and non-inverting gain paths.

The DC gain of the inverting path of the opamp corresponds to the ratio of the resistor across the feedback to the input resistor $-(r13/(r10+r11))$, while the noninverting path has DC gain of $(1+r13/(r10+r11))$. In the case where the magnitude of the DC gain of the inverting path is significantly larger than 1, then the magnitude of the DC gain of the noninverting path will have similar magnitude. As such, any common-mode signals such as supply noise in high gain PD cells 1425 and 1426 will be largely cancelled out. For example, if the DC gain of inverting path has magnitude of 10, then the DC gain of the noninverting path has magnitude of 1+10=11. In this case, supply noise will be attenuated by approximately 90% assuming the supply noise has the same effect on both high gain PD cells 1425 and 1426. Thus, good supply noise cancellation is provided in a single ended system (as opposed to a differential two output system) which is convenient for doing analog control of a VCO since a VCO typically has a single ended control input.

This example provides the benefit of supply noise cancellation of low frequencies, and effectively gets more gain out of the opamp. If just the inverting terminal is used, then gain is 10 (in this example), however, in this case there is the gain of −10 on the inverting input and 11 on the noninverting, then the total gain of the lossy integrating path is effectively doubled in comparison with value of 21. As such, the opamp output provides double the phase error signal compared to just using either the inverting or noninverting path. This is important because the noise from the opamp is gained up by the noninverting path gain so that doubling the gain of the phase error signal relative to the noninverting path leads to roughly 2× improvement in Signal-to-Noise ratio at the opamp output. In effect, the opamp noise impact is reduced by about a factor of two. Therefore, this example provides the benefit of cancelation of low frequency supply noise by the integrating path and the benefit of reduced impact of opamp noise in the system.

In this example, each PCC cell 1410, 1425, 1426 is operated on a 1.1V regulated voltage Vreg. In another example, a different supply voltage may be used. Each PCC cell 1410, 1425, 1426 and associated filter network can be optimized independently.

In this example, integrating path 1402 is described as being "lossy" integrator. To avoid saturation problems, feedback capacitor C13 is shunted by a feedback resistance R13. The parallel combination of C13 and R13 behave like a practical capacitor which dissipates power, unlike an ideal capacitor. For this reason, a practical integrator is referred to as a lossy integrator. In another example, the amount of loss contributed by R13 may be selected based on other parameters to control saturation.

Figure 15:
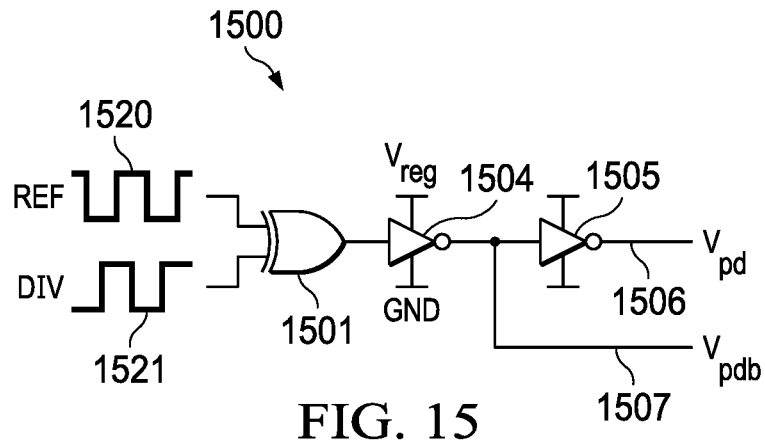
FIG. 15 is a schematic of a simple XOR phase detector.

FIG. 15 is a schematic of a simple XOR phase detector cell 1500. In this example, a reference signal 1520 and a divided feedback signal 1521 are connected to inputs of XOR gate 1501. Feedback signal 1521 is like feedback signal 121 (FIG. 1) for PLL 100 (FIG. 1). Inverting buffer 1504 provides buffered phase detect signal Vpdb 1507. Inverting buffer 1505 provides on opposite phase detect signal Vpd 1506.

Figure 16:
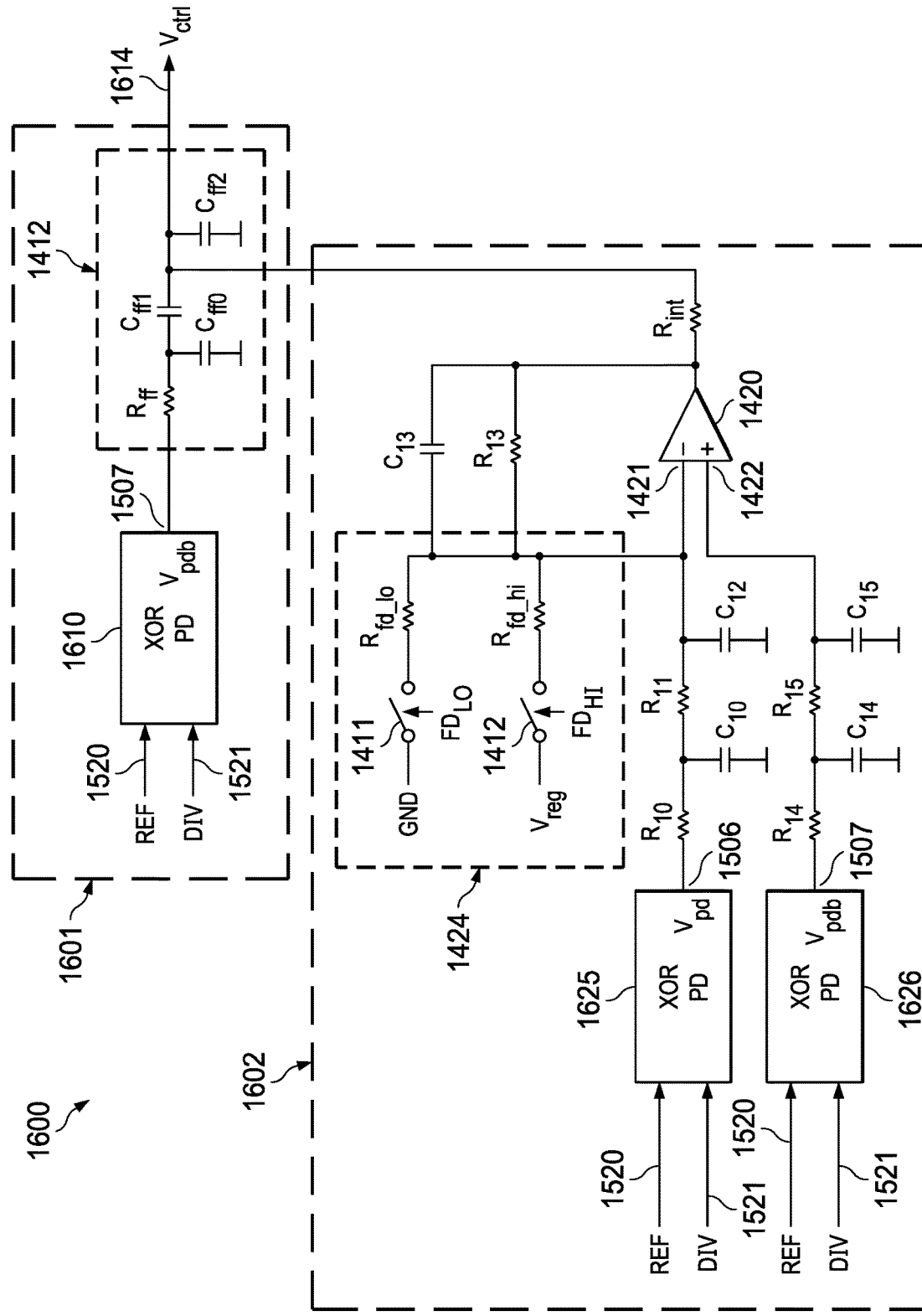
FIG. 16 is a schematic diagram of an example XOR differential high gain phase detector and loop filter.

FIG. 16 is a schematic diagram of an example XOR differential high gain phase detector 1600 that uses simple XOR PD cells of FIG. 15 in place of PCC cells. This structure is useful when a high frequency reference signal, such as Ref 1520, is available. A way to increase PD gain is to decrease the time range that it takes to achieve a given voltage error signal from the PD after filtering, which is the case when operating frequency of the PD is increased. A typical reference frequency is less than a few hundred MHz, however, in this example the reference oscillator runs at 2.5 GHz, while the VCO runs at multi-GHz. Since the reference frequency is very high, then don't need a PCC configuration where the reference frequency and the feedback divided signal are multiples of each other and can instead use a simple XOR type PD, such as PD 1500 (FIG. 15). In this example, the PD gain does not need to be increased; instead, a simple implementation is desired in order to allow robust operation at very high frequency. Due to the avoidance of narrow output pulses during steady-state operation, XOR PD provides a very linear behavior in a system where delta sigma modulation is included in the feedback loop as long as the instantaneous phase error deviation is not so large as to create very small pulses at the PD output.

In this example, a wide band feed-forward (FF) path 1601 includes a PD cell 1610 coupled to FF filter 1412. Lossy integrating path 1602 includes an opamp 1420 with an inverting input 1421 coupled to receive a filtered output from PD cell 1425 and a non-inverting input 1422 coupled to receive a filtered output from PD cell 1426.

Lossy integrating path 1602 also includes a frequency detection path 1424 in which switch 1411 is configured to couple inverting input 1421 to ground through resistor Rfd_lo when a signal FDlo asserts in cases where the frequency of an output signal, such as Out signal 122 (FIG. 1) is too low and in which switch 1412 is configured to couple inverting input 1421 to Vreg through resistor Rfd_hi when a signal FDhi asserts in cases where the frequency of the output signal is too high.

FF filter 1412 combines the output 1507 of PD cell 1610 and integrating path 1602 to produce a control signal Vctrl on output node 1614. Control signal Vctrl is used to control a variable frequency oscillator that produces Out signal 122. In another example, additional filtering may be provided for control signal Vctrl before being output on node 1414.

In this example, PD cells 1410, 1425, and 1426 are the same as PD cell 1500 (FIG. 15), or another known or later developed PD cell. However, notice that output signal Vpd 1506 is coupled to inverting input 1421 of opamp 1420, while the opposite polarity output signal Vpdb 1507 is coupled on non-inverting input 1422. This allows cancellation of low frequency supply noise and use of both the inverting input 1421 and non-inverting input 1422 of opamp 1420. In this manner, opamp 1420 noise impact is reduced by approximately 2× by leveraging both the inverting and non-inverting gain paths.

The DC gain of the inverting path of the opamp corresponds to the ratio of the resistor across the feedback to the input resistor −(r13/(r10+r11)), while the noninverting path has DC gain of (1+r13/(r10+r11)). In the case where the magnitude of the DC gain of the inverting path is significantly larger than 1, then the magnitude of the DC gain of the noninverting path will have similar magnitude. As such, any common-mode signals such as supply noise in high gain PD cells 1425 and 1426 will be largely cancelled out. For example, if the DC gain of inverting path has magnitude of 10, then the DC gain of the noninverting path has magnitude of 1+10=11. In this case, supply noise will be attenuated by approximately 90% assuming the supply noise has the same effect on both high gain PD cells 1425 and 1426. Thus, good supply noise cancellation is provided in a single ended system (as opposed to a differential two output system) which is convenient for doing analog control of a VCO since a VCO typically has a single ended control input.

This example provides the benefit of supply noise cancellation of low frequencies, and effectively gets more gain out of the opamp. If just the inverting terminal is used, then gain is 10 (in this example), however, in this case there is the gain of −10 on the inverting input and 11 on the noninverting, then the total gain of the lossy integrating path is effectively doubled in comparison with value of 21. As such, the opamp output provides double the phase error signal compared to just using either the inverting or noninverting path. This is important because the noise from the opamp is gained up by the noninverting path gain so that doubling the gain of the phase error signal relative to the noninverting path leads to roughly 2× improvement in Signal-to-Noise ratio at the opamp output. In effect, the opamp noise impact is reduced by about a factor of two. Therefore, this example provides the benefit of cancelation of low frequency supply noise by the integrating path and the benefit of reduced impact of opamp noise in the system.

In this example, each PD cell 1610, 1625, 1626 is operated on a 1.1V regulated voltage Vreg. In another example, a different supply voltage may be used. Each PD cell 1610, 1625, 1626 and associated filter network can be optimized independently.

Figure 17:
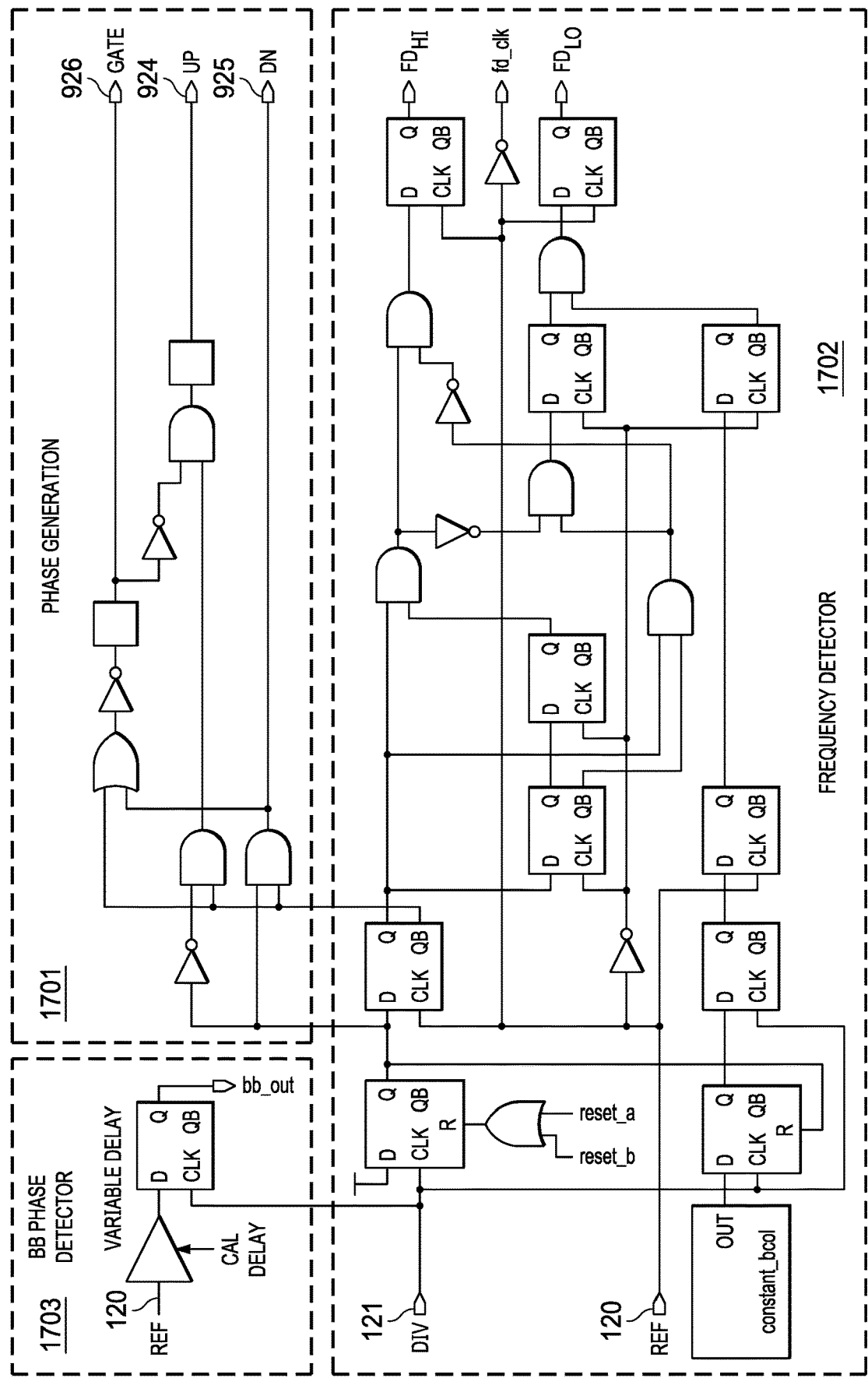
FIG. 17 is a schematic of an example phase detector and frequency detector circuit.

FIG. 17 is a schematic of an example phase detector pulse generation (PG) circuit 1701, frequency detector circuit 1702, and bang-bang phase detector circuit 1703. Reference frequency signal 120 and divided feedback signal 121 are provided as inputs to these circuits. PG circuit 1701 generates phase detector control signals Up 924, Dn 925, and Gate 926 that are used in the PCC cells described in more detail hereinabove. Frequency detector 1702 generates the FDhi and FDlo signals described hereinabove in more detail when the frequency of the oscillator output is outside of a selected range in order to achieve an initial lock of the PLL. Bang-bang PD circuit 1703 is used for DTC calibration and will be described in more detail hereinbelow.

Figure 18:
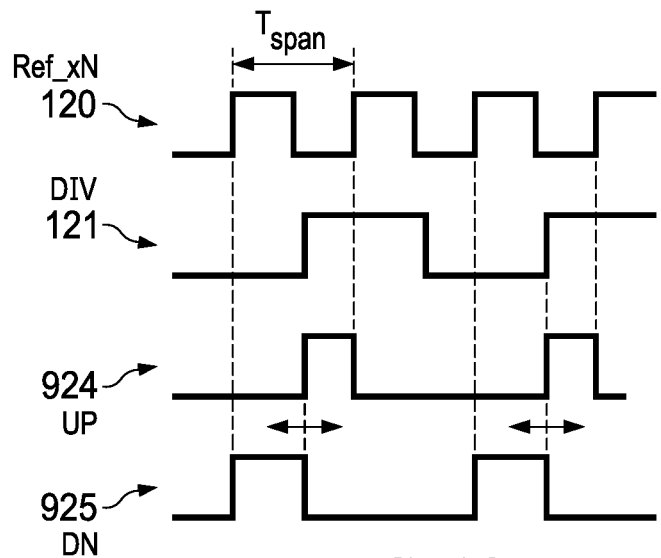
FIG. 18 is a timing diagram illustrating operation of the example circuit of FIG. 17.

FIG. 18 is a timing diagram illustrating operation of the PG portion 1701 of the example circuit of FIG. 17. In this example, the frequency of reference frequency signal 120 is 1.25 GHz. The frequency of divided feedback signal 121 is 625 MHz, such that Ref 120 has a frequency of 2× Div 121. In another example, a larger multiple could be used, and also a higher reference frequency. The 2× difference in frequency between Ref 120 and Div 121 provides the equivalent of a 2× gain in the PD/PCC cell. Alternatively, in another example the frequency of Div 121 could be configured to be a multiple of the frequency of Ref 120.

Up/Dn pulses 924, 925 change width in opposite manner as a function of phase error. This relationship provides high linearity even in the presence of mismatch between Up/Dn loop filter paths. This is in contrast to prior techniques in which either Up or Dn pulses changes width independently.

Figure 19:
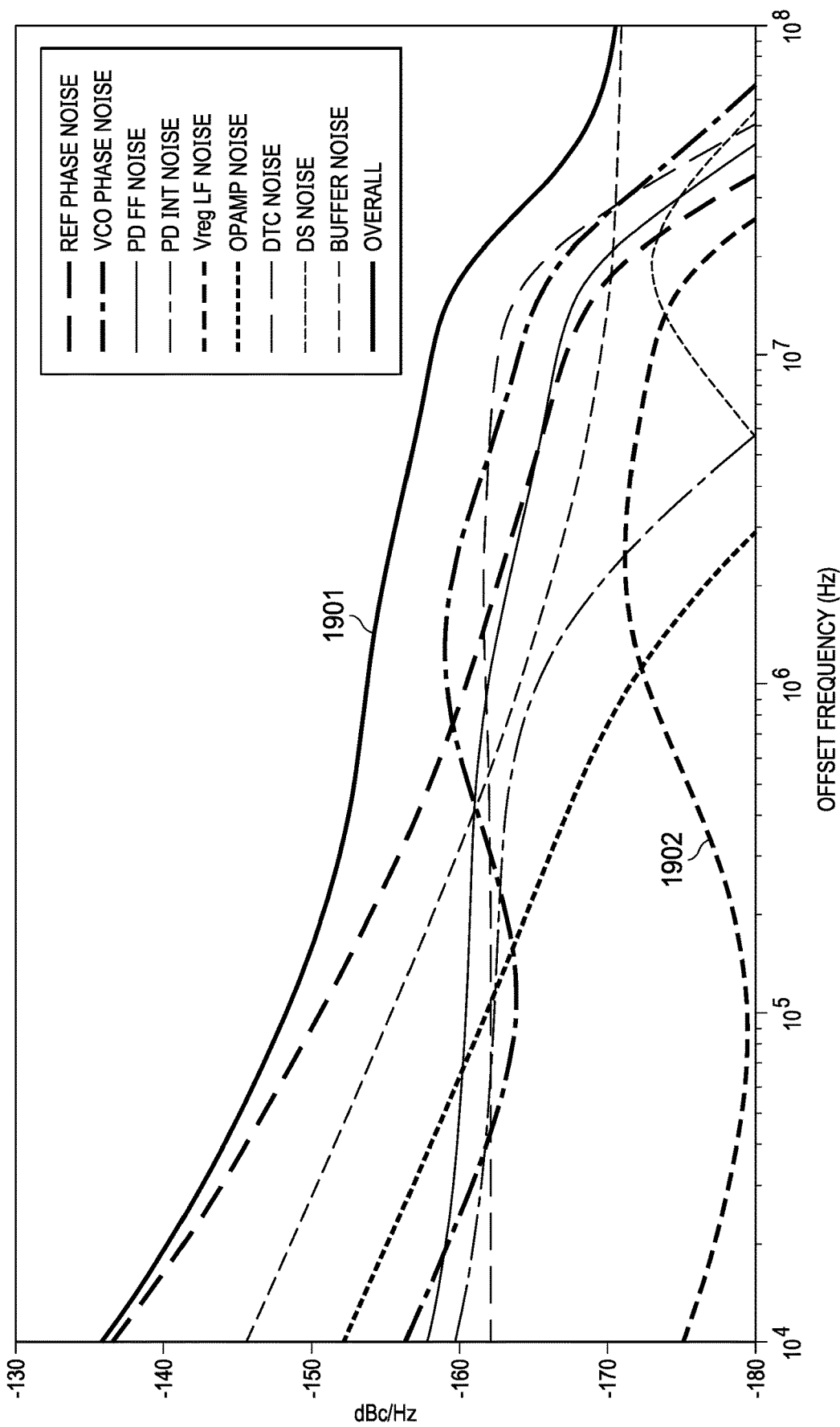
FIG. 19 is a plot illustrating phase noise in an example PLL.

FIG. 19 is a plot of noise in dBc/Hz vs offset frequency (Hz) illustrating noise in an example PLL In this example, a PLL 100 (FIG. 1) is equipped with the PCC blocks and loop filter circuit 1400 (FIG. 14) using the timing circuits 1701, 1702 (FIG. 17). In this example, the reference frequency is 1.25 GHz and the feedback frequency is 625 MHz. Low frequency noise from the regulated supply voltage (Vreg) is well suppressed as indicated by plot line 1902. Overall noise is indicated by plot line 1901. Overall jitter integrated from 12 kHz to 20 MHz is 46.0 fs (rms).

In descried examples, a method of operating a phase locked loop (PLL) is described. A first phase error signal is generated for a difference in phase between a reference signal and a feedback signal with first phase detector cell 1425 (FIG. 14) having a gain polarity. A second phase error signal is generated for a difference in phase between the reference signal and the feedback signal with a second phase detector cell 1426 having an opposite gain polarity. The first phase error signal and the second phase error signal are amplified by opamp 1420 (FIG. 14) and combined the results to form an integrated phase error signal. A third phase error signal is generated for a difference in phase between the reference signal and the feedback signal with a third phase detector cell 1410 (FIG. 14) to form a feed-forward phase error signal. The feed-forward phase error signal is combined with the integrated phase error signal to form a control signal Vctrl 1414 (FIG. 14).

In described examples, a voltage-controlled oscillator (VCO) 108 (FIG. 1) is operated responsive to the control signal Vctrl to generate an output signal Out 122 (FIG. 1). The frequency of the output signal is continuously monitored to determine if it is outside a target frequency range. A magnitude (value and/or sign) of the integrated phase error signal Vctrl is adjusted when the frequency of the output signal is outside the target frequency range.

In described examples, the output of a divider 110 (FIG. 1) coupled to the VCO is modulated with a delta sigma modulator. The feedback signal is delayed a varying amount responsive to the modulated output of the divider by DTC 112 (FIG. 1).

In described examples, a first phase error signal is generated by applying a first voltage to a first resistor-capacitor Rup, Cup1 (FIG. 9A) for an amount of time proportional to a first phase difference to form a first RC node voltage, wherein the magnitude of the voltage is augmented by a first charge pump 929 (FIG. 9A). A second voltage is applied to a second resistor-capacitor Rdn, Cdn1 (FIG. 9A) for an amount of time proportional to a second phase difference to form second RC node voltage, wherein the magnitude of the voltage is augmented by a second charge pump 927 (FIG. 9A). The first RC node voltage and the second RC node voltage are combined to form a combined RC node voltage by closing switch 932 (FIG. 9A). The combined RC node voltage is transferred to a filter by switches 933, 934 (FIG. 9A). In some examples, the transfer of the combined RC node voltage to the filter is delayed for a period of time by gate signals 13260, 13261 (FIG. 13B) to allow the combined RC node voltage to stabilize.

Low Bandwidth, High Gain Phase Detector Examples

In the following examples, a differential switched RC front end is used to cancel low frequency noise from a voltage regulator. A differential front end is combined with partial and fully differential loop filter and ADC (analog to digital converter). Gain of the loop filter is set high enough such that ADC noise impact is sufficiently reduced.

In some examples, a linear PD is augmented with a bang-bang detector and frequency detector for reasonable lock-in time.

In some examples, a digital Delta-Sigma modulator is augmented to reduce quantization noise at low frequencies without substantially increasing noise folding by avoiding significant increase of quantization noise spectral magnitude at high frequencies.

FIG. 20 is a block diagram of an example voltage supply for an example PLL. In a typical PLL system, a supply voltage 2001 is provided by a circuit, such as a bandgap circuit, that creates an accurate reference voltage Vref. While Vref provides an accurate voltage value that is reasonably consistent across PVT variations, it is often prone to being accompanied by high noise and also does not provide sufficient output current to function as the supply for various circuits within the integrated circuit including the PLL. As such, a voltage supply regulator Vreg 2003 is utilized to provide sufficient output current for the PLL and other blocks, and Vref 2001 is utilized as a reference voltage for Vreg in order to achieve an accurate voltage across PVT. The noise present in Vref is filtered 2002 before being supplied to Vreg. As such, a typical supply regulator for the PLL has an output noise spectral density noise that is highest at low frequencies due to the impact of band gap noise which is lowpass filtered.

FIG. 21 is an example plot of noise spectral density (V/rHz) vs frequency (Hz) for the voltage supply regulator of FIG. 20, illustrating the impact of Vref noise at lower frequencies.

Figure 22:
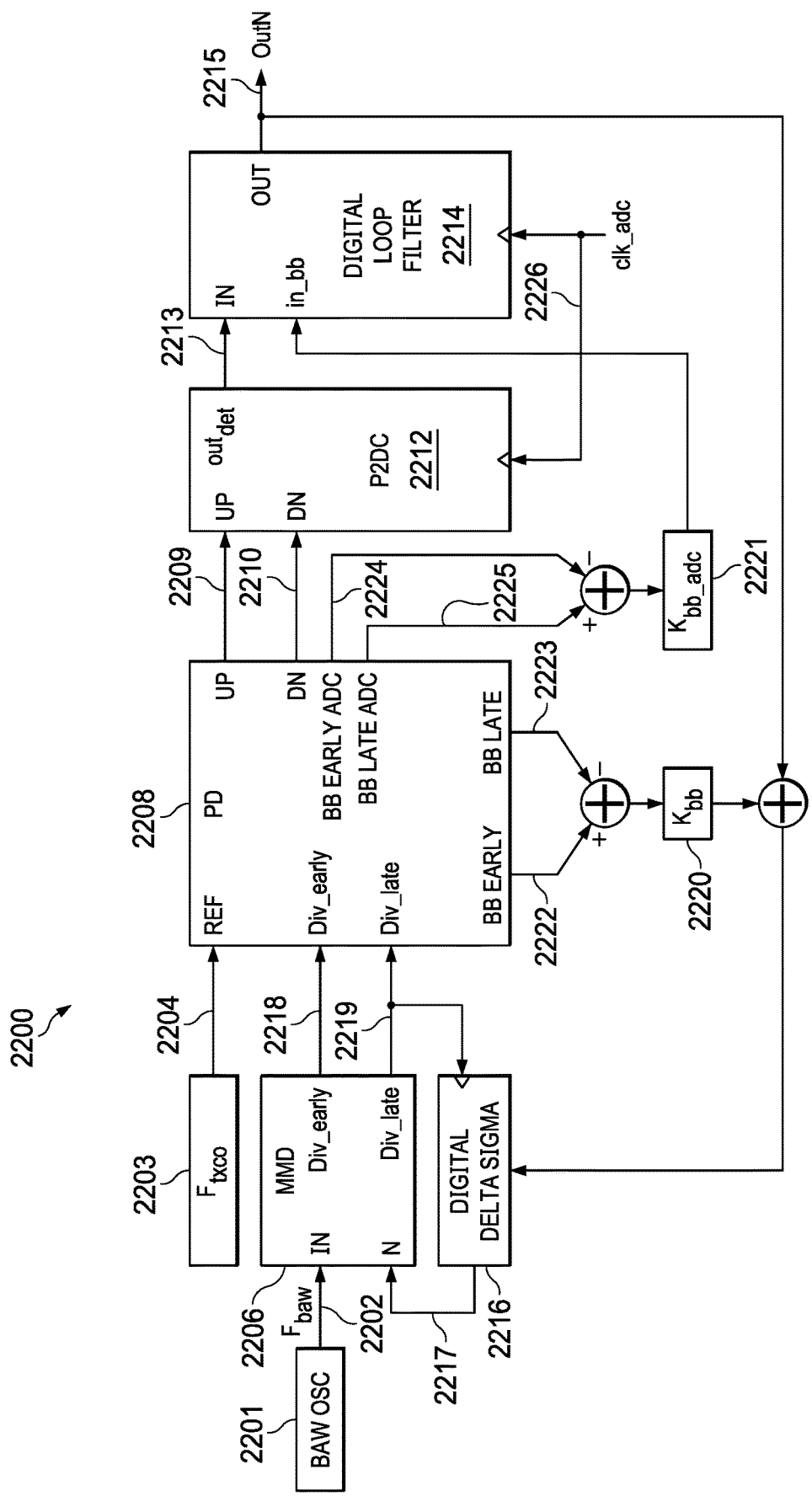
FIG. 22 is a block diagram of an example feedback loop with high gain phase detector.

FIG. 22 is a block diagram of an example feedback loop 2200 that provides a digital frequency ratio signal "OutN" on output node that is derived from comparison in phase/frequency of a high frequency bulk acoustic wave (BAW) oscillator 2201 and reference frequency Ftcxo. In particular, output signal OutN on node 2215 is the estimated instantaneous ratio of the frequency of BAW output signal 2202 and the frequency of reference signal 2204, which in this example is provided by a temperature-controlled crystal oscillator (TCXO) 2203. BAW resonators featuring high operating frequency up to a few GHz and small size have been used for mobile applications such as filters in the RF front-end of wireless transceivers for many years. The BAW resonator is a piezoelectric thin film resonator, which operates similarly to a quartz crystal, is utilized by a BAW oscillator circuit to create a periodic oscillation signal. In this example, BAW oscillator 2204 operates at 2.5 GHz.

Figure 23:
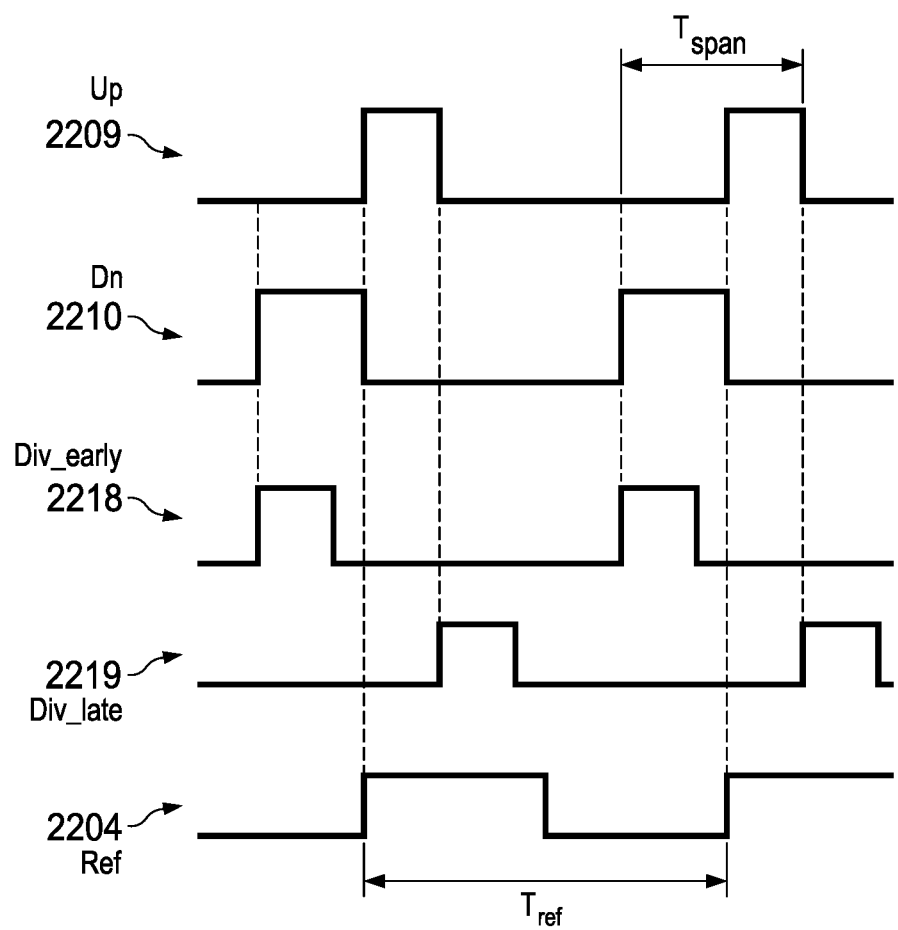
FIG. 23 is a timing diagram illustrating operation of the high gain phase detector within the feedback loop of FIG. 22.

Multi-modulus divider (MMD) 2206 divides BAW frequency signal 2202 by ratio number N of feedback signal 2217 provided by digital delta sigma modulator 2216. Div_early and div_late pulses are generated by MMD 2206, as illustrated in FIG. 23. In this example, delta sigma modulator 2216 is clocked by div_late pulse 2219.

Phase detector 2208 uses reference signal 2204 and div_early and div_late pulses to generate phase difference signals including up pulse 2209 and down pulse 2210 in response to the timing relationship between reference signal 2204 and the div_early and div_late pulses.

Phase to digital converter (P2DC) 2212 produces a digital output value 2213 responsive to up pulse 2209 and down pulse 2210. Digital loop filter 2214 filters digital value 2213 to produce output signal OutN on node 2215.

In this example, initial lock-in time is improved by a "bang-bang" (BB) loop 2220, 2221 that will be described in more detail hereinbelow. The BB loop augments the system with an extra phase detector when it is initially settling. The BB loop provides an error signal to drive the system. Once the system locks, the BB loop drops out in activity and does not affect noise, etc.

In this example, delta sigma 2216 is designed to reduce delta sigma noise impact without aggravating noise folding, as will be described in more detail hereinbelow.

FIG. 23 is a timing diagram illustrating timing signals generated by MMD 2206 (FIG. 22) and PD 2208 (FIG. 22).

Figure 24:
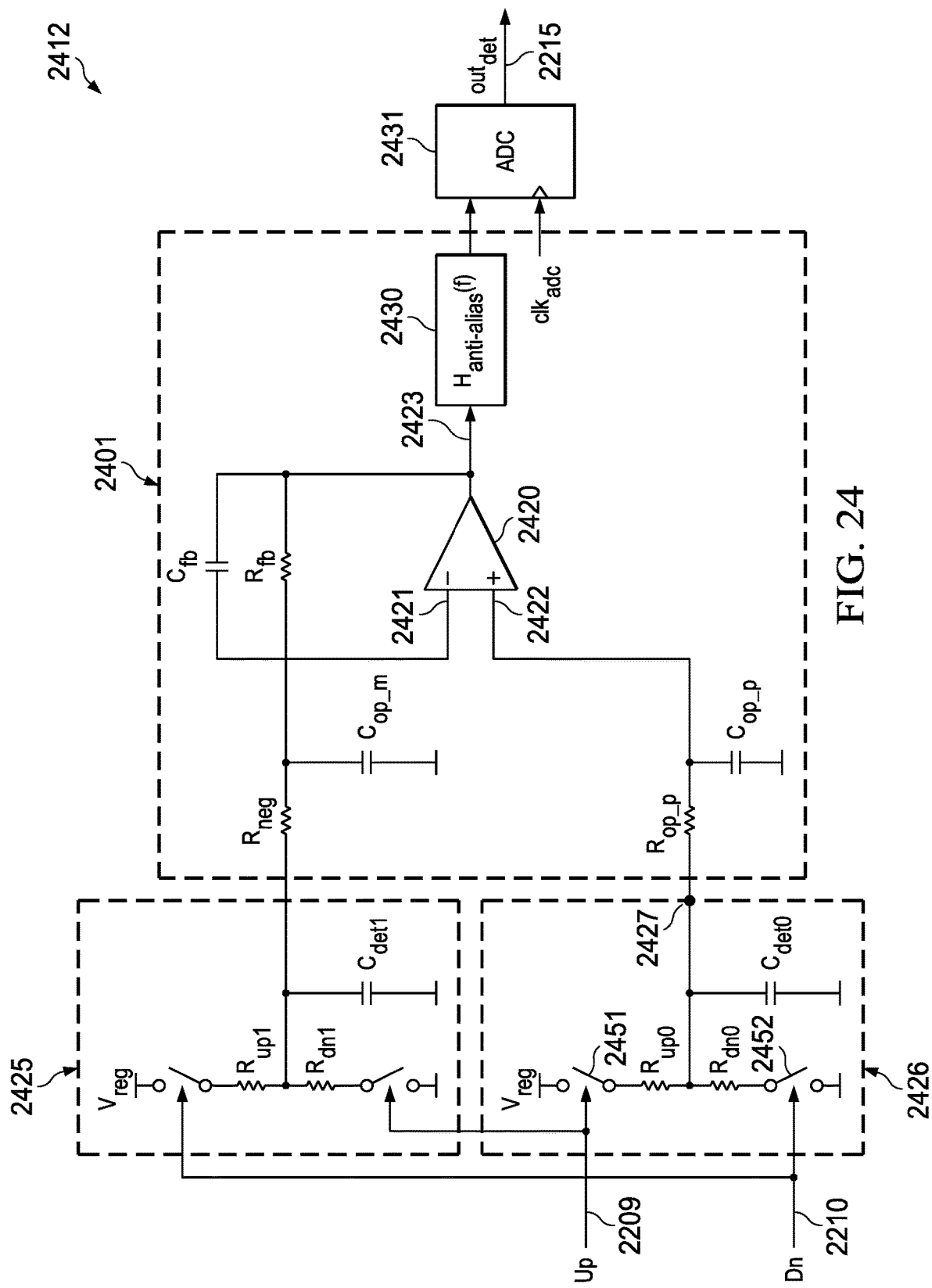
FIG. 24 is a schematic of an example phase to digital converter for a low BW feedback loop.

FIG. 24 is a schematic of an example P2DC 2412 for a low BW feedback loop, such as feedback loop 2200 (FIG. 22A).

Module 2412 includes switched resistor phase to charge converters (PCC) 2425, 2426 that are configured in a differential manner. Each PCC 2425, 2426 includes two switches, such as switches 2451, 2452 that are controlled by Up pulse signal 2209 and Dn pulse signal 2210, respectively. In this example, switches 2451, 2452 are each implemented as an FET transistor.

Differential loop filter 2401 includes opamp 2420. An output from PCC 2425 is coupled to inverting input 2421 of opamp 2420 and an output from PCC 2426 is coupled to non-inverting input 2422 of opamp 2420. Notice that signals Up 2209 and Dn 2210 received from PD 2208 (FIG. 22A) are reversed between PCC 2425 and 2426.

Anti-alias filter 2430 attenuates frequencies above the Nyquist sampling rate of analog to digital converter (ADC) 2431 to eliminate aliasing.

ADC 2431 converts the amplified output from opamp 2420 into a digital value that is output on node 2215. Such a digital value is useful for a digital phase locked loop (DPLL).

In this example, the differential configuration suppresses low frequency noise on the regulated supply voltage Vreg and reduces the impact of noise produced by opamp 2420, as described in more detail for opamp 1420 (FIG. 14).

Figure 25:
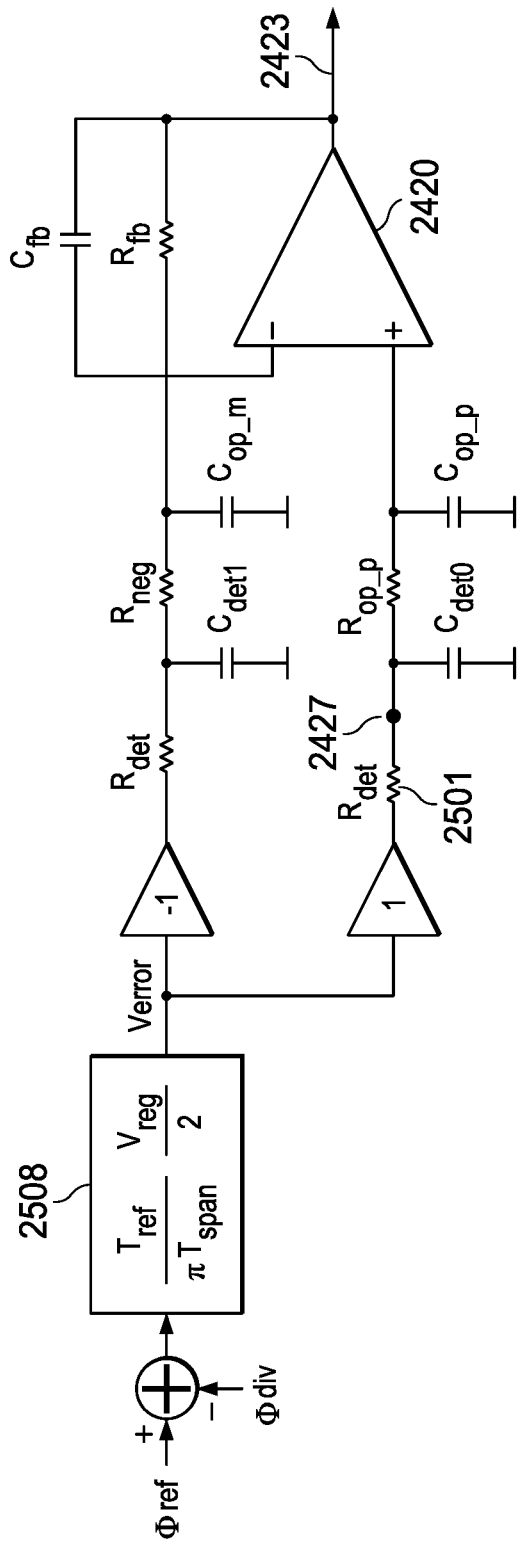
FIG. 25 is a simulation model for the resistor switching section of FIG. 24.

FIG. 25 is a simulation model for the resistor switching section of FIG. 24, such as switching section 2426. A value for equivalent resistor Rdet 2501 is given by expression (6), though this expression is approximate in that Rdet can be reduced by the impact of parasitic capacitance in networks 2425 and 2426 in FIG. 24.

$$R_{det} = \frac{2T_{ref}}{T_{span}} R_{up} \| R_{dn} \tag{6}$$

Block 2508, which corresponds to the DC gain from phase error to Verror, indicates that the DC gain of phase detector 2412 is increased by the ratio of the period of reference signal 2204 (FIG. 22) and the time span Tspan between the rising edges of Div_early and Div_late.

The DC gain of the loop filter circuit that is fed by Verror changes as a function of reference (TCXO) frequency based on expression (7), where Rdet is given by expression (6). Lower frequency for reference signal 2204 leads to increased Rdet and therefore lower DC gain. Higher frequency for reference signal 2204 leads to reduced Rdet and therefore higher DC gain.

$$DC \text{ gain of loop filter} = 1 + 2*R_{fb}/(R_{det} + R_{neg}) \tag{7}$$

The input to ADC 2431 (FIG. 24) and the output of opamp 2420 each have a limited voltage range. This leads to a tradeoff between effective phase error resolution and effective phase error range. Effective phase error range must be wide enough to accommodate jitter (including Delta-Sigma dithering). Effective phase error range is influenced by the ADC opamp voltage range, PD gain, and loop filter gain (expression (7)).

Figure 26:
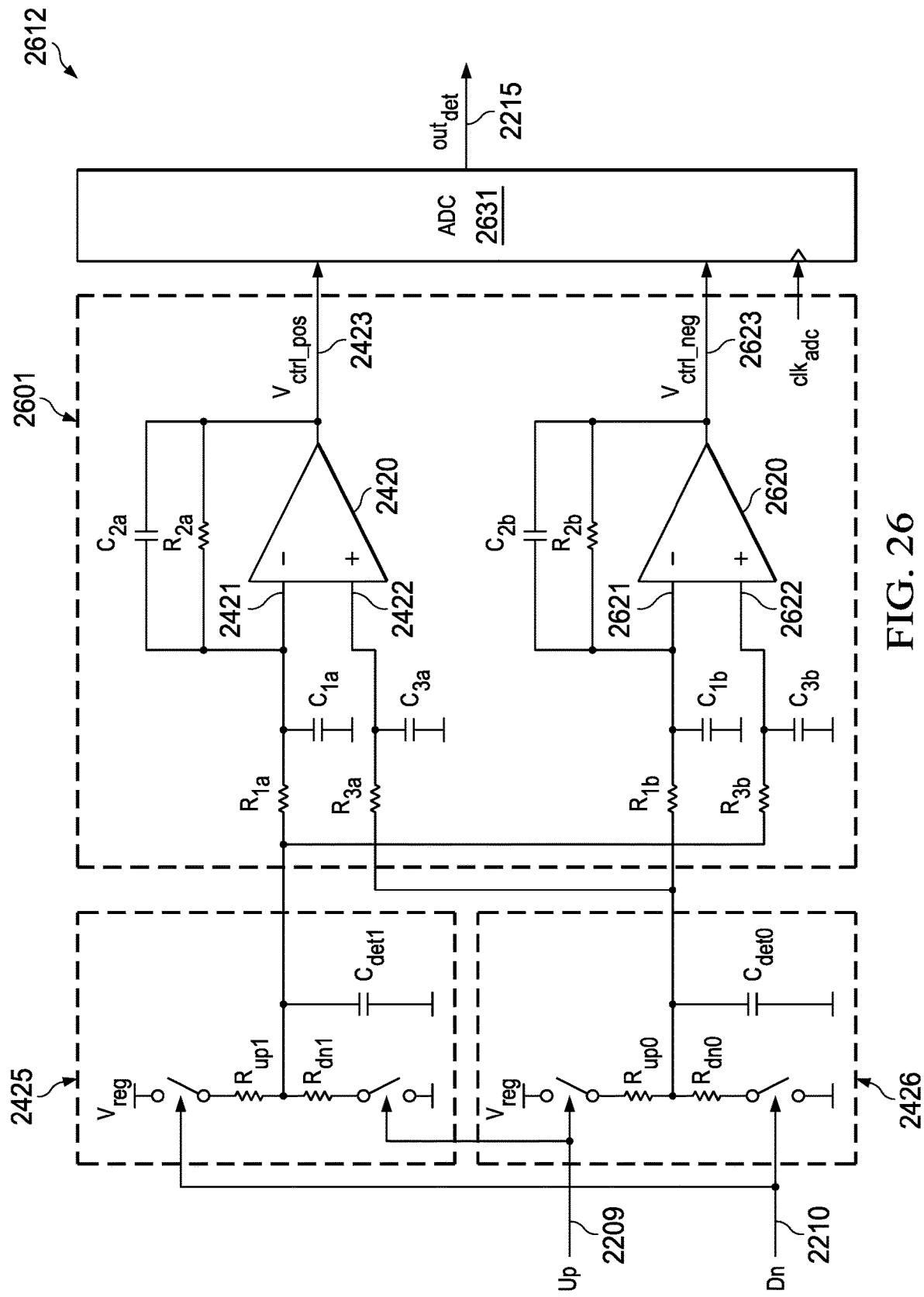
FIG. 26 is a schematic of an example fully differential phase to digital converter for a low BW feedback loop.

FIG. 26 is a schematic of an example fully differential P2DC 2600 for a low BW feedback loop, such as feedback loop 2200 (FIG. 22). In this example, phase to charge converters (PCC) 2425, 2426 are configured in a differential manner and coupled to two separate opamps 2420, 2620.

Differential loop filter 2601 includes opamps 2420 and 2620. An output from PCC 2425 is coupled to inverting input 2421 of opamp 2420 and an output from PCC 2426 is coupled to non-inverting input 2422 of opamp 2420. Similarly, an output from PCC 2425 is coupled to non-inverting input 2622 of opamp 2620 and an output from PCC 2426 is coupled to inverting input 2621 of opamp 2620. Notice that signals Up 2209 and Dn 2210 received from PD 2208 (FIG. 22A) are reversed between PCC 2425 and 2426.

An output 2423 from opamp 2420 and an output 2623 from opamp 2620 are coupled to inputs of differential ADC 2631. ADC 2631 quantifies the difference in voltage appearing on signal lines 2423 and 2623 and converts it to a digital output. The output of ADC 2631 is then provided on output node 2215. ADC 2631 may be fully differential or pseudo-differential.

Figure 27:
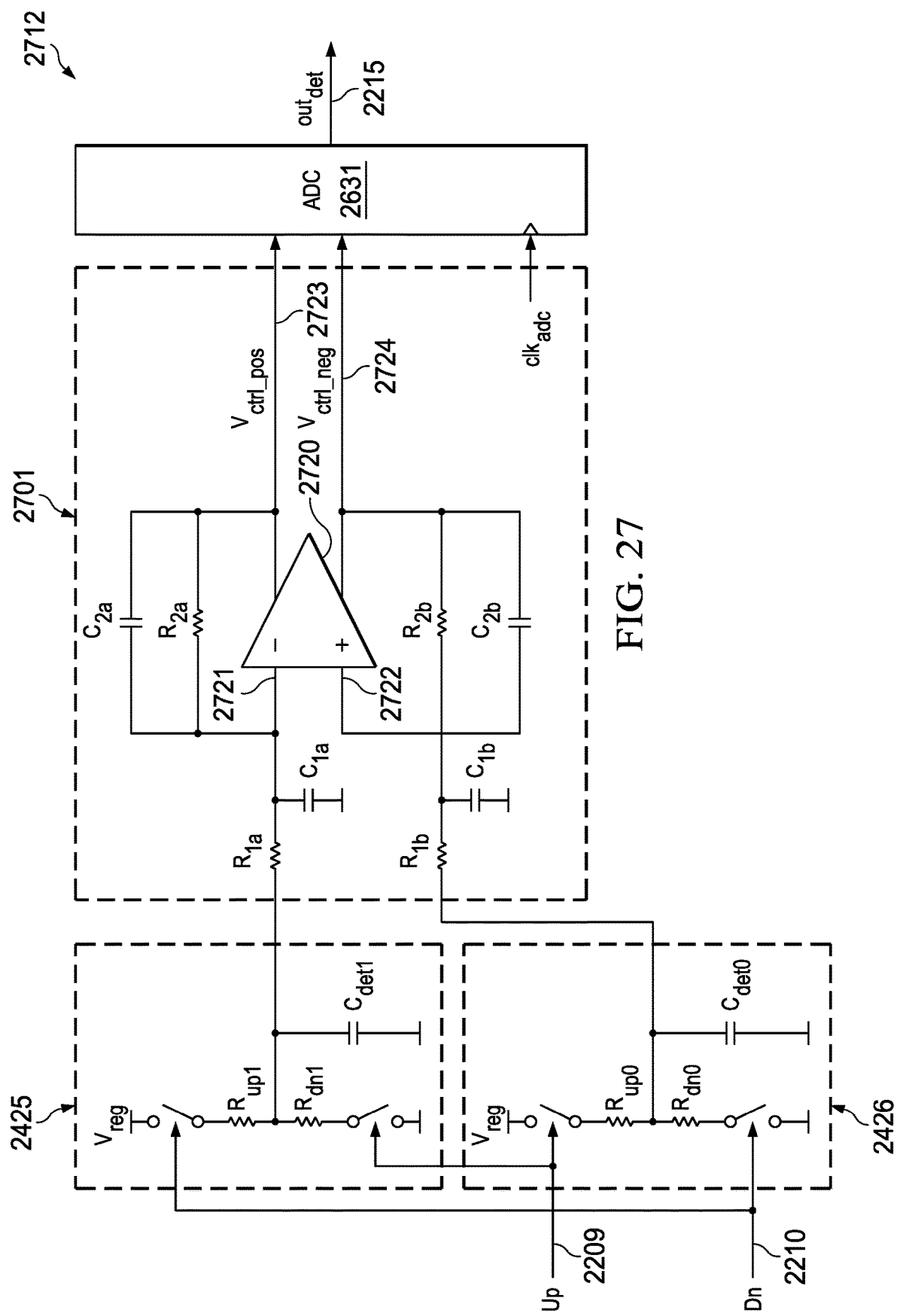
FIG. 27 is a schematic of another example fully differential phase to digital converter for a low BW feedback loop.

FIG. 27 is a schematic of an example fully differential P2DC 2700 for a low BW feedback loop, such as feedback loop 2200 (FIG. 22). In this example, phase to charge converters (PCC) 2425, 2426 are configured in a differential manner with differential loop filter 2701 that includes a single differential opamp 2720. An output from PCC 2425 is coupled to inverting input 2721 of opamp 2720 and an output from PCC 2426 is coupled to non-inverting input 2722 of opamp 2720. Opamp 2720 provides differential outputs 2723, 2724 that are coupled to differential ADC 2631. ADC 2631 quantifies the difference in voltage appearing signal lines 2723 and 2724 and converts it to a digital output. The output of ADC 2631 is then provided on output node 2215. ADC 2631 may be fully differential or pseudo-differential.

Figure 28:
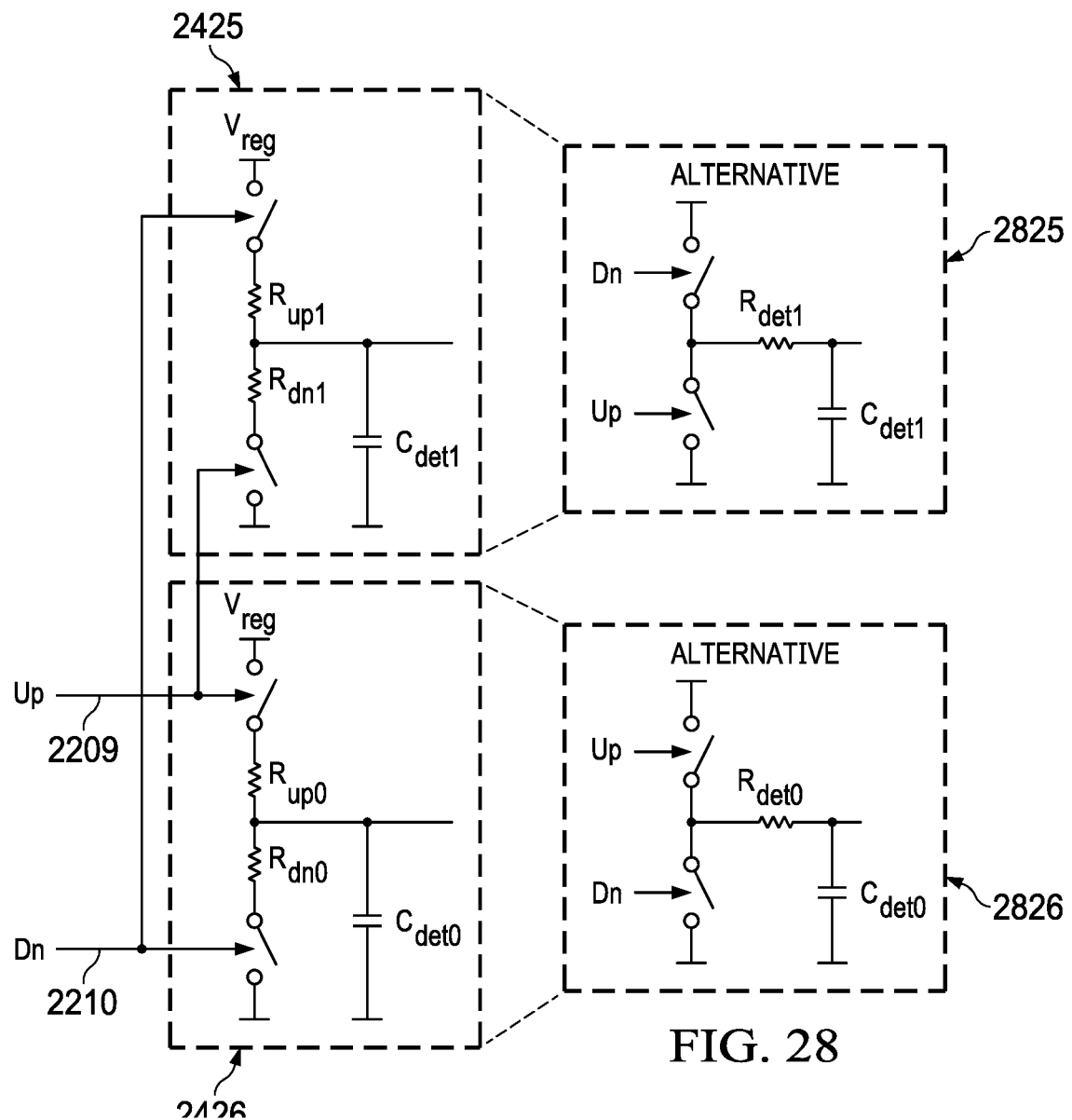
FIG. 28 is a schematic of an example alternative switched resistor phase to charge converter.

FIG. 28 is a schematic of an example alternative switched resistor phase to charge converter. In this example, switched PCC 2825 that has a single resistor Rdet1 can replace PCC 2425 that has two resistors Rup1 and Rdn1. Similarly, switched PCC 2826 that has a single resistor Rdet0 can replace PCC 2426 that has two resistors Rup0 and Rdn0. This alternative configuration can be used in any of the previously described systems 2412, 2600, or 2700.

Figure 29:
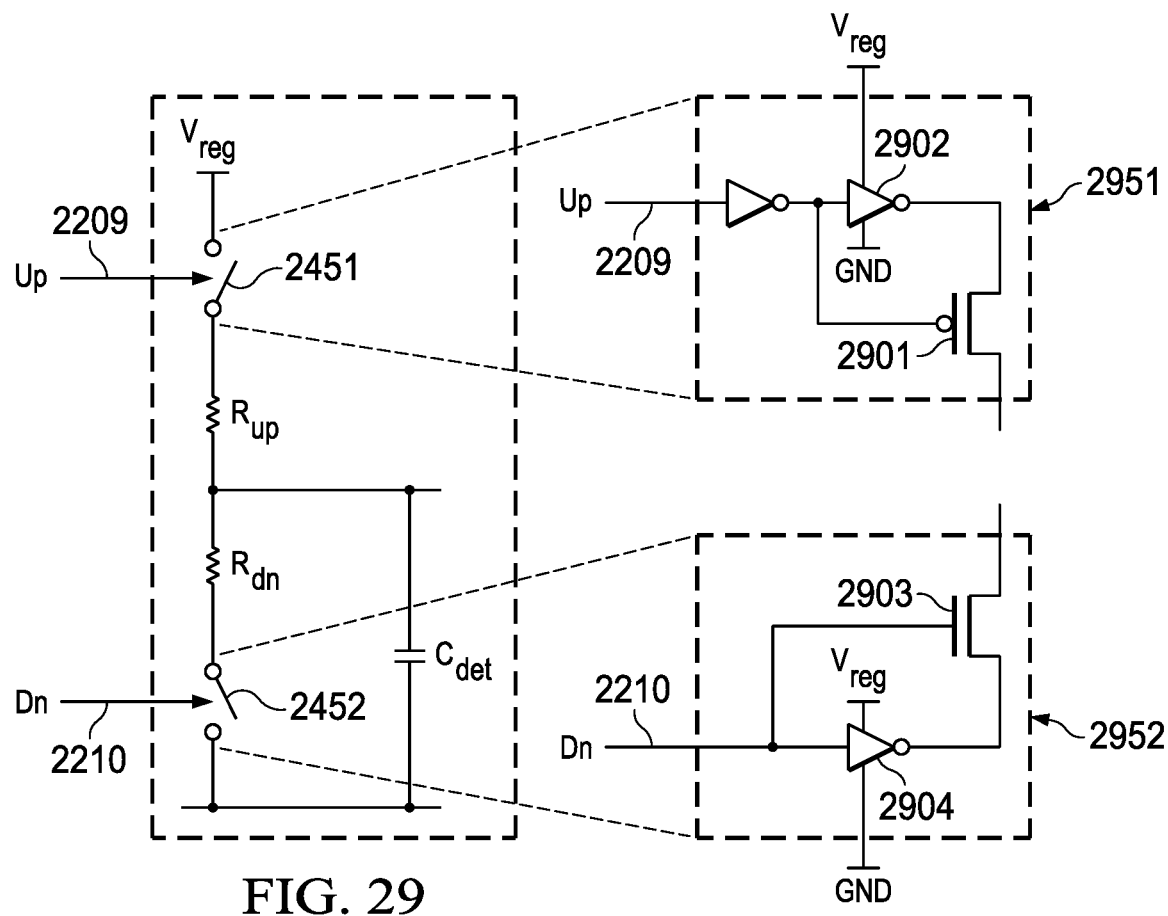
FIG. 29 is a schematic of an example alternative switch scheme.

FIG. 29 is a schematic of an example alternative switch scheme for PCC 2426, see FIG. 24. A similar configuration can be used in PCC 2425 (FIG. 24). In this example, a buffer 2902 is inserted between switching FET 2901 and Vreg and tracks the Up signal 2209. In this configuration the supply voltage provided to switching transistor 2901 is provided by the output of buffer 2902. Therefore, when Up signal 2209 is inactive, a voltage that is approximately at ground potential is provided to switch 2901. Similarly, a buffer 2904 is inserted between switching FET 2903 and ground and inverts the Dn signal 2210. In this configuration the supply voltage provided to switching transistor 2903 is provided by the output of buffer 2904. Therefore, when Dn signal 2210 is inactive, a voltage that is approximately Vreg potential is provided to switch 2903. In this manner, the off-resistance of switching circuit 2951, 2952 is increased significantly. The on-resistance is increased only slightly due to the resistance of buffers 2902, 2904.

Figure 30:
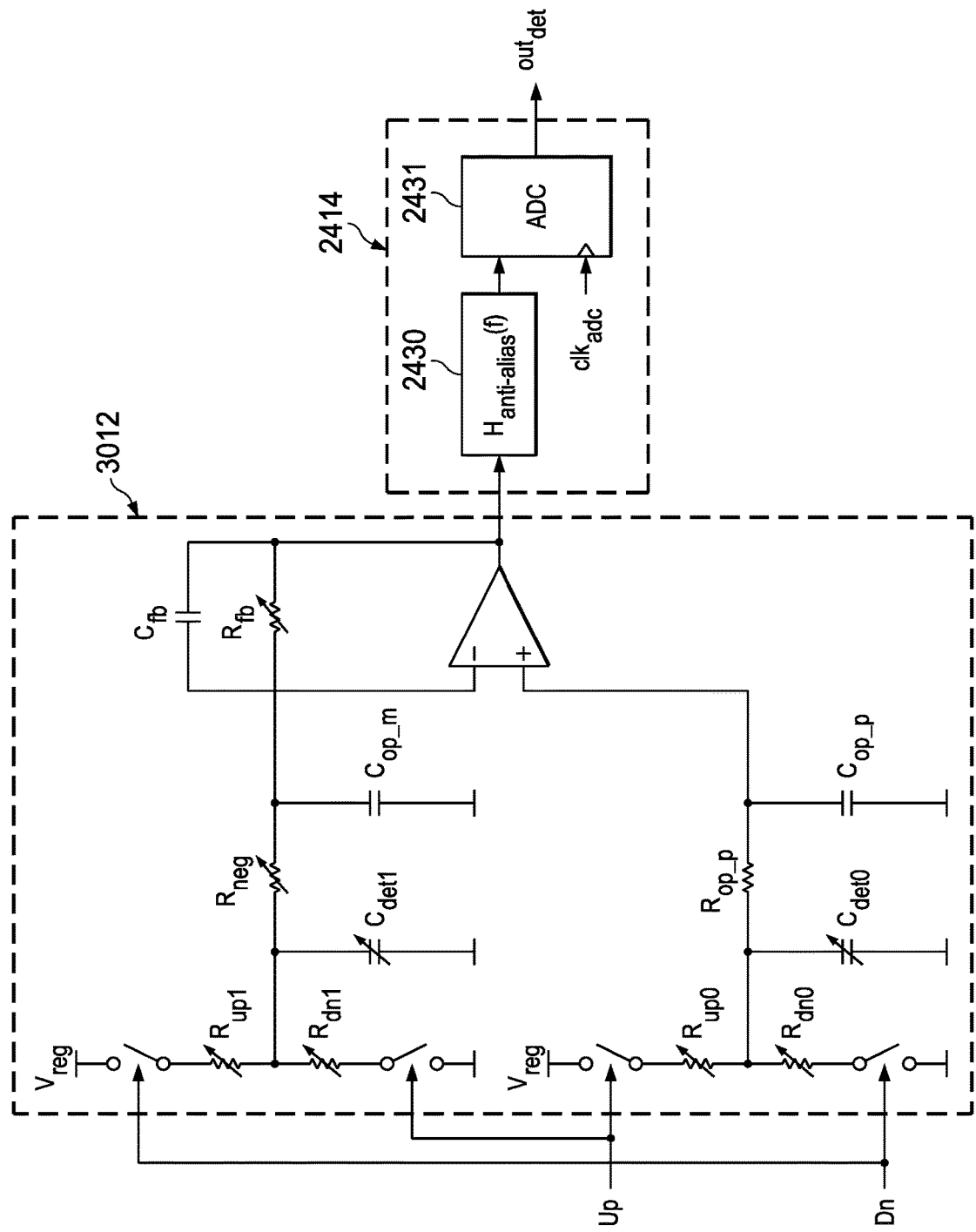
FIG. 30 is a schematic illustrating example configurability options for an example phase to digital converter.

FIG. 30 is a schematic illustrating example configurability options for an example PCC 3012 that has the same overall schematic as example PCC 2412 (FIG. 24). It is beneficial to keep loop filter gain high enough so that ADC 2413 quantization noise is well scrambled (i.e., so that at least several ADC codes are exercised by noise or other signals). Referring to expressions (6) and (7), loop filter gain varies with the period of the reference frequency, Tref. Therefore, it is beneficial to maintain sufficient loop filter gain as Tref varies by adjusting or trimming various resistor and capacitor values in PCC 3012 as appropriate.

In this example, Rup0, Rup1, Rdn0, Rdn1, Rop_p, Rneg, Rfb, Cdet0, Cdet1 and Cfb can each be individually adjusted using trimming switches and additional resistors and capacitors in appropriate configurations, such as connecting trimming components in series or in parallel. In this example, the trimming switches are controlled by a configuration register (not shown) that is set by a control processor (not shown) for the system. In another example, trimming may be controlled using known or later developed techniques, such as: fusible links, erasable programmable read only memory (EPROM) bits, etc.

Figure 31:
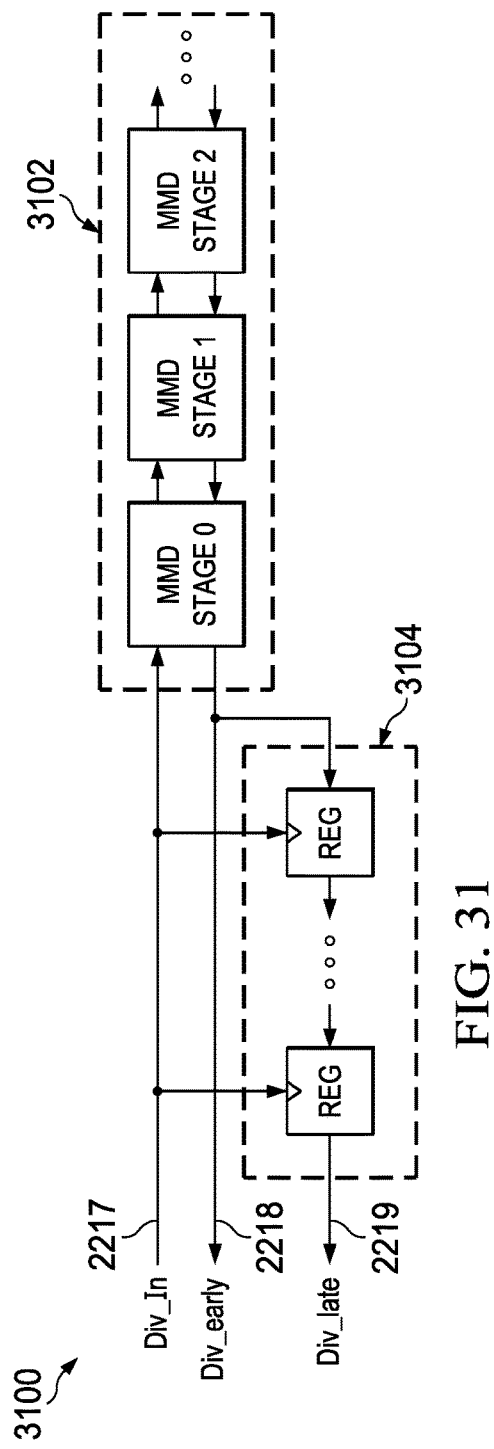
FIG. 31 is a block diagram and FIG. 32 is a timing diagram of an example circuit to generate early/late pulses.
Figure 32:
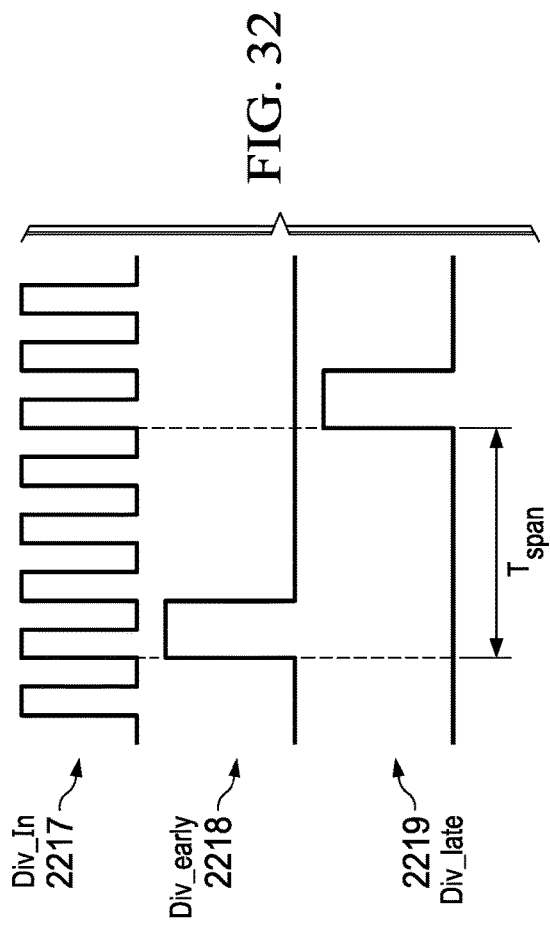

FIG. 31 is a block diagram and FIG. 32 is a timing diagram of an example circuit 3100 to generate early/late pulses 2218, 2219 in multi-modulus divider 2206 as illustrated in FIG. 22. Multistage divider topology 3102 provides a Div_early output pulse signal 2218 that is retimed from the Div_In feedback signal 2217 (see FIG. 22). In this example, configurable shift register 3104 is utilized to accurately delay the Div_late output pulse signal 2219 by a selected number of Div_in 2217 pulses. In this manner, the length of time, Tspan, between a rising edge of Div_early 2218 and a rising edge of Div_late 2219 is accurately set. In some examples, shift register 3104 may be configured to allow Tspan to be adjusted by half cycles of Div_In feedback signal 2217. Known or later developed techniques can be used with multiplexors and registers to control the configuration of delay register 3104 and thereby select a value for Tspan.

Figure 33:
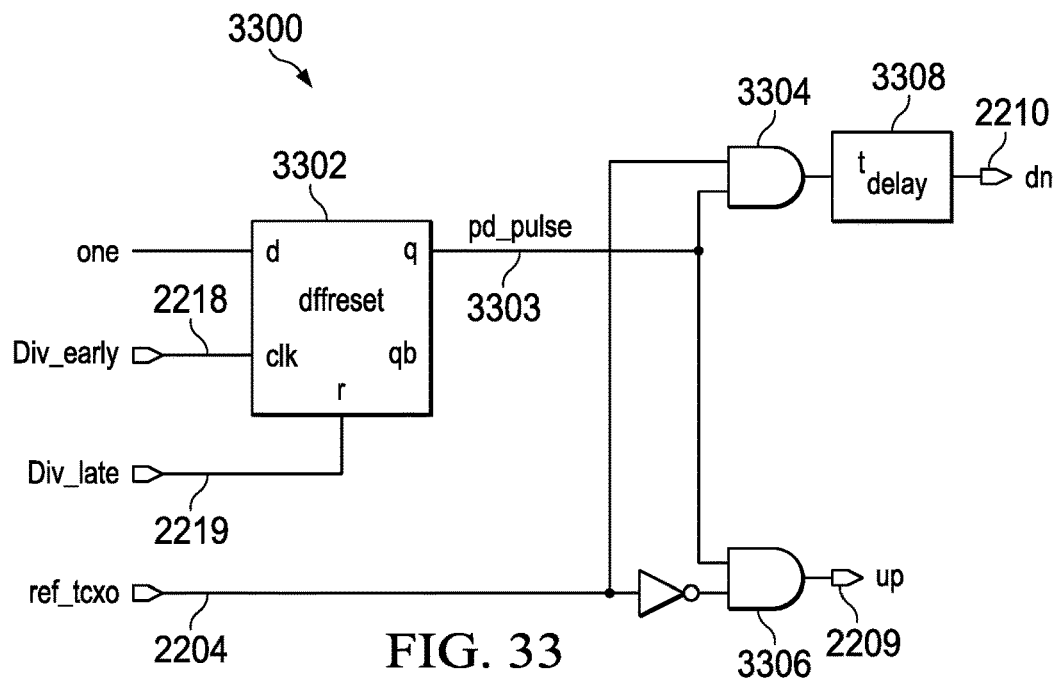
FIGS. 33-36 are schematics and timing diagrams for example linear phase detectors.
Figure 34:
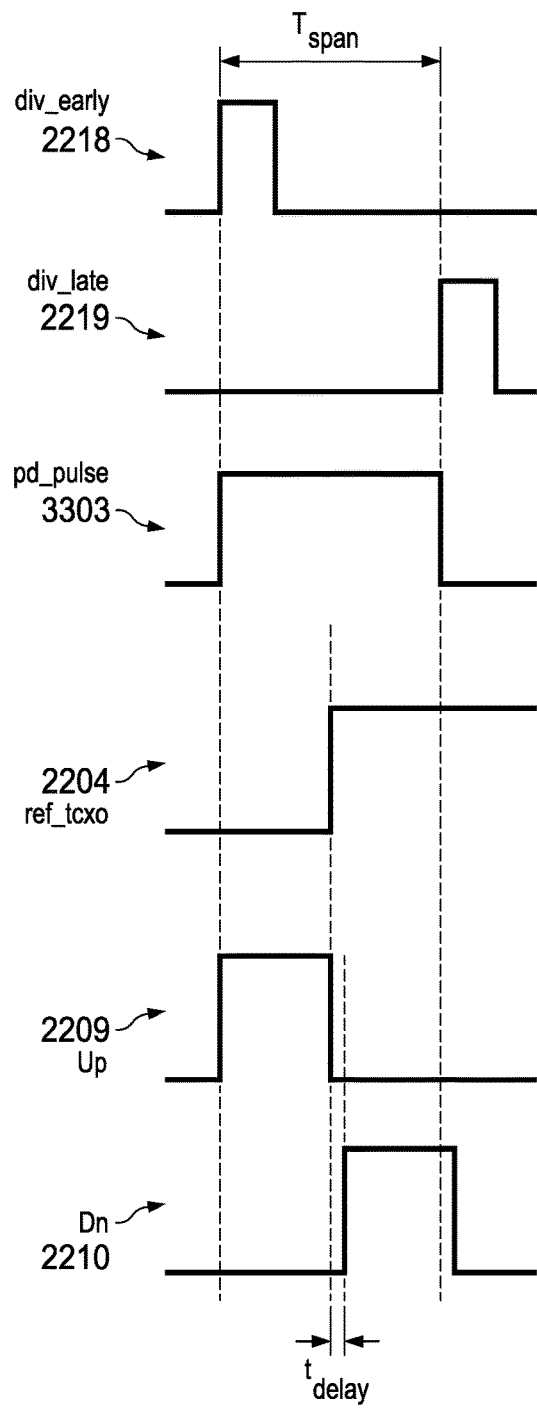

FIG. 33 is a schematic and FIG. 34 is a timing diagram for an example linear phase detector 3300 that is included within PD 2208, see FIG. 22. In this example, flip-flop 3302 receives the Div_early 2218 pulse signal on a clock input and Div_late 2219 pulse signal on a reset input. A solid "one" logic level is applied to a D input. Flip-flop 3302 generates pd_pulse signal 3303 that is coupled to inputs on gates 3304, 3306. Reference signal 2204 is coupled to a second input of gate 3304 and an inverted version of reference signal 2204 is coupled to a second input of gate 3306. And-gate 3304 generates Dn pulse signal 2210, while and-gate 3306 generates Up pulse signal 2209. In this example, an optional delay module 3308 is included to delay Dn pulse 2210 by a small amount so that the Up pulse and Dn pulse do not overlap. In this example, Tdelay is implemented using inverters. In another example, other types of known or later developed techniques or circuit elements may be used to produce a delay. In some examples, delay 3308 may be omitted if overlapping Up/Dn pulses are acceptable.

Figure 35:
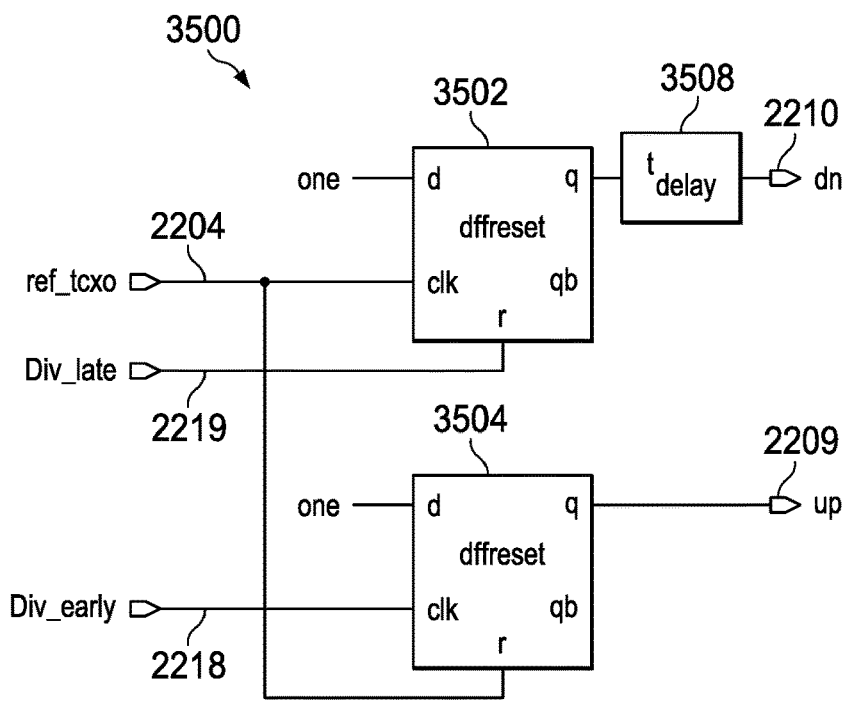
Figure 36:
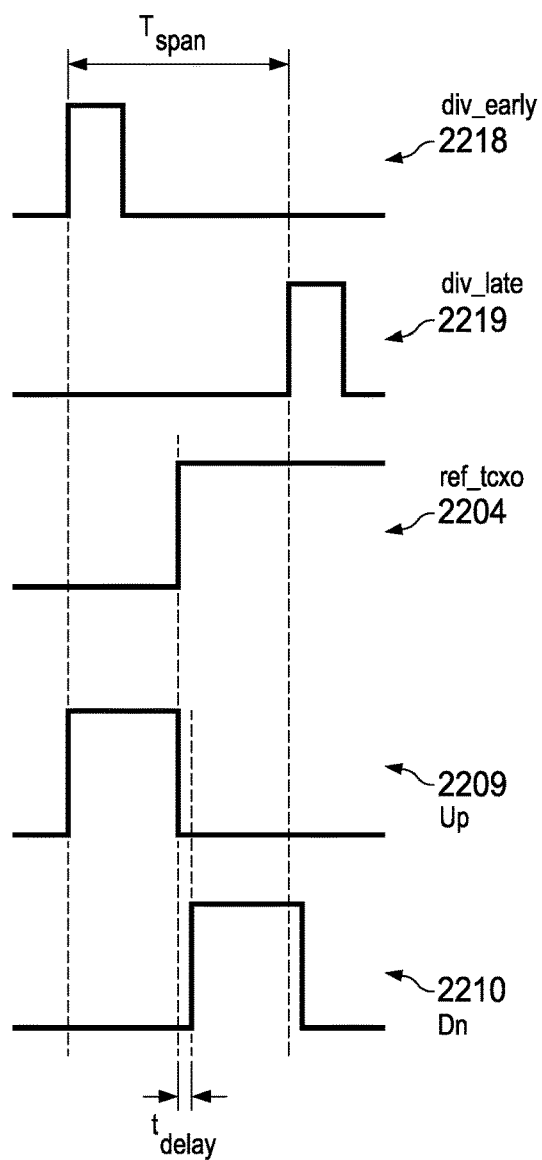

FIG. 35 is a schematic and FIG. 36 is a timing diagram for an example linear phase detector 3500 that is included within PD 2208, see FIG. 22. In this example, flip-flop 3502 receives reference signal 2204 on a clock input, a solid one logic level on a D input, and div_early on a reset input. Flip-flop 3502 generates do pulse signal 2210. Flip-flop 3504 receives reference signal 2204 on a clock input, a solid one logic level on a D input, and div_late on a reset input. Flip-flop 3504 generates up pulse signal 2209. In this example, an optional delay module 3508 is included to delay Dn pulse 2210 by a small amount so that the Up pulse and Dn pulse do not overlap. In this example, Tdelay is implemented using inverters. In another example, other types of known or later developed techniques or circuit elements may be used to produce a delay. In some examples, delay 3308 may be omitted if overlapping Up/Dn pulses are acceptable.

Figure 37A:
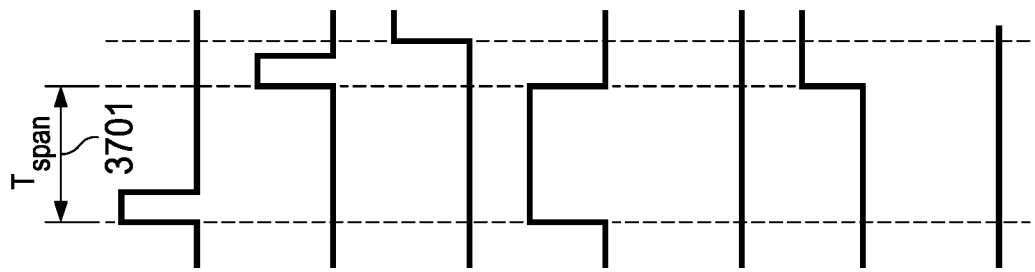
FIGS. 37A-37E are timing diagrams illustrating example bang-bang timing with linear phase detector timing.
Figure 37B:
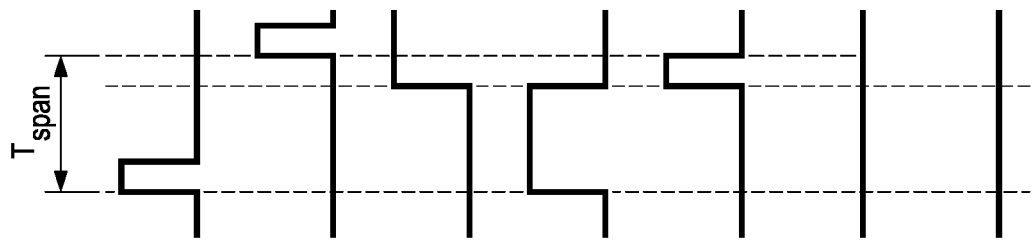
Figure 37C:
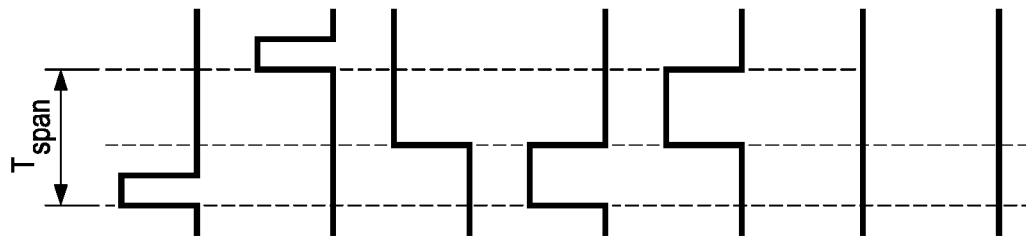
Figure 37D:
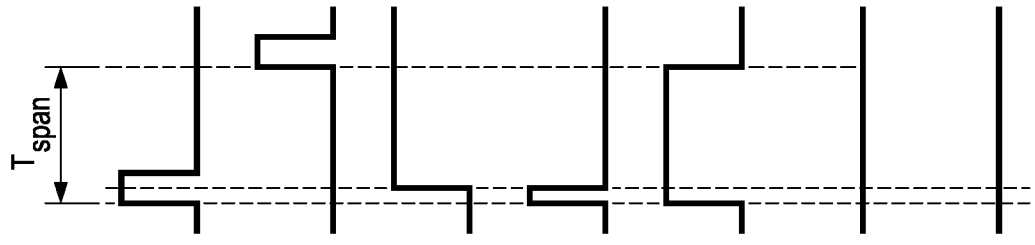
Figure 37E:
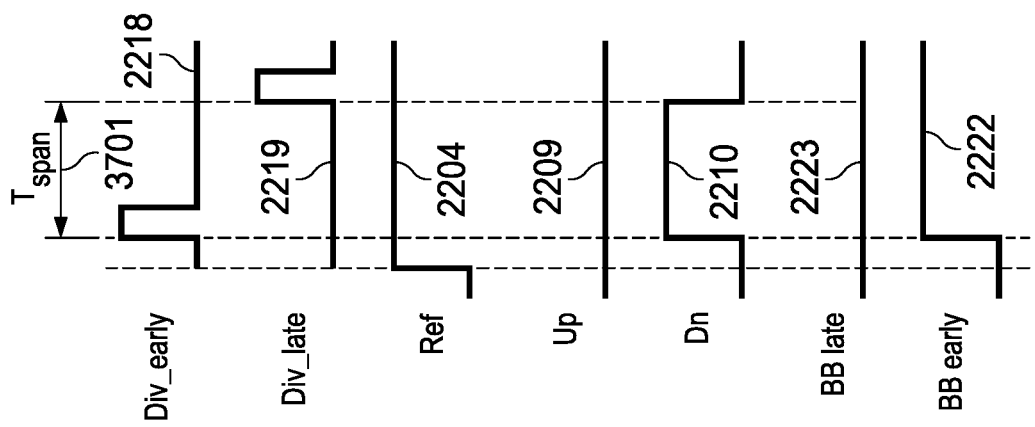

FIGS. 37A-37E are timing diagrams illustrating example bang-bang (BB) timing signals generated by timing circuitry inside PD 2208 (FIG. 22) along with linear phase detector signals Up and Dn. As long as the rising edge of reference signal 2204 falls within the Tspan window 3701, which is defined by the time between a rising edge of Div_early pulse 2218 and a following rising edge of Div_late 2219, BB late 2223 and BB early 2222 are inactive, as illustrated in FIGS. 37B, 37C, and 37D. FIG. 37A illustrates an example case in which a rising edge of reference signal 2204 occurs before the Tspan window 3701. In this case, BB early signal 2222 is activated. FIG. 37E illustrates an example case in which a rising edge of reference signal 2204 occurs after the Tspan window 3701. In this case, BB late signal 2223 is activated. Thus, in this example as long as both Up signal 2209 and Dn signal 2201 are active indicating that the feedback loop 2200 (FIG. 22) is in lock, BB early and BB late are inactive. Note there are cases, such as encountered with the PD circuit of 35, that Up and Dn could have activity outside of the Tspan window without disturbing the relationship of BB early and BB late becoming inactive outside of the Tspan window.

Figure 38:
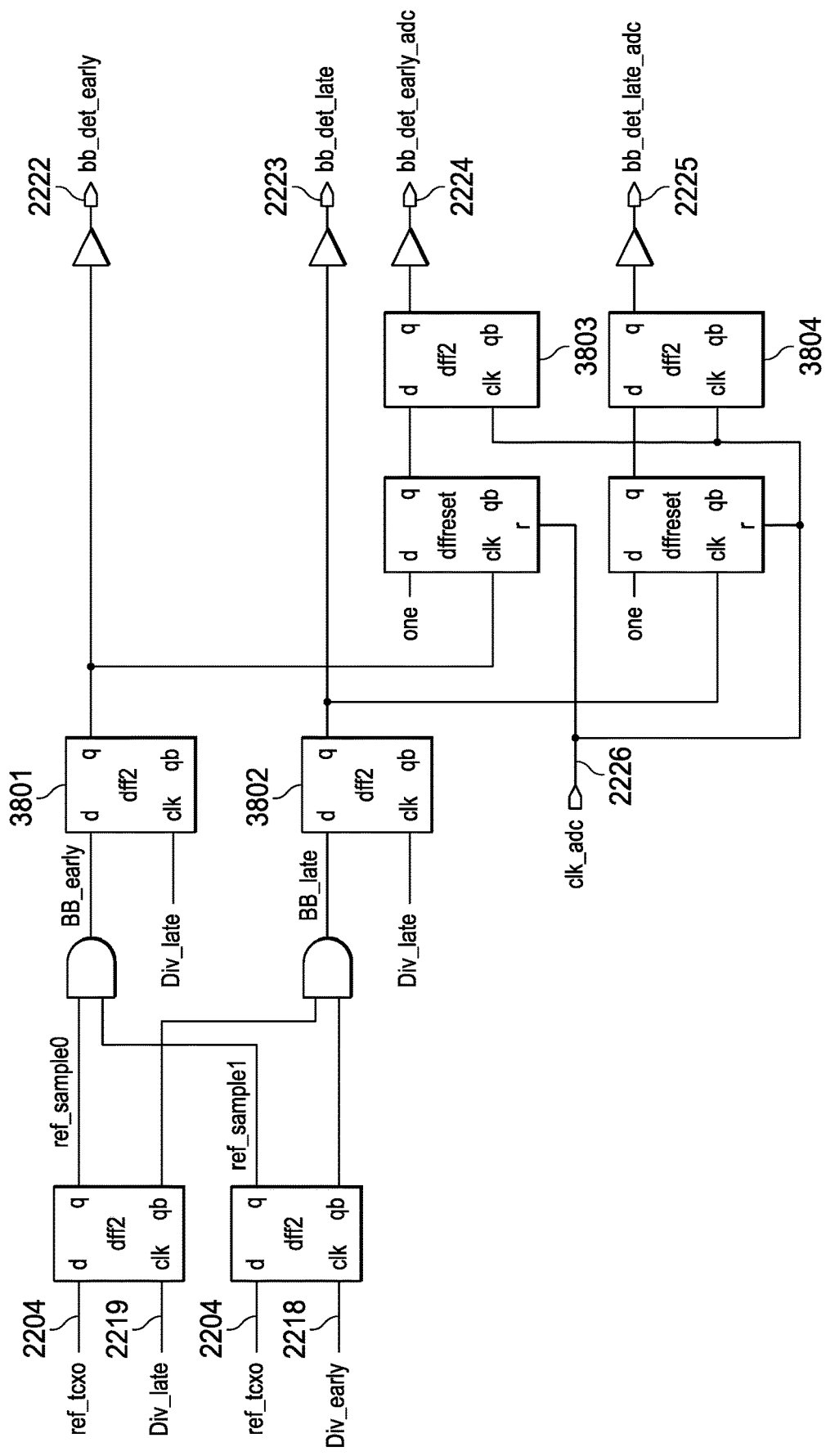
FIG. 38 is a schematic of an example circuit to generate bang-bang signals.

FIG. 38 is a schematic of an example circuit included within PD 2208 (FIG. 22) to generate bang-bang signals. As long as the rising edge of reference signal 2204 falls within the Tspan window 3701 (FIG. 37A), which is defined by the time between a rising edge of Div_early pulse 2218 and a following rising edge of Div_late 2219, BB late 2223 and BB early 2222 are inactive.

Re-timing flip-flops 3801, 3802 synchronize the timing of BB_early and BB_late to the div_late clock signal 2218, assuming sigma delta module is clocked by the div_late clock signal 2218. Re-timing flip-flops 3803, 3804 synchronize the timing of BB_early and BB_late to the ADC clock signal 2226, assuming ADC 2431 (FIG. 24) or ADC 2631 (FIG. 26 or 27) module is clocked by the ADC clock signal 2226.

Enhanced Digital Delta Sigma Modulator

As described hereinabove for FIGS. 1-5, noise folding may occur if DTC 112 (see FIG. 1) is not included in PLL 100. Without DTC 112, nonlinearity in phase detector 102 leads to noise folding of delta sigma noise 223, as indicated at 523 (FIG. 5). Such noise folding is avoided by the use of DTC 112 which reduces the impact of dithering by delta sigma modulator 114 (see FIG. 1) on phase error. DTC 112 reduces phase variation into phase detector 102 (FIG. 1) and also allows wide bandwidth operation. However, a DTC adds complexity, power consumption and area on an integrated circuit.

Delta-sigma ($\Delta\Sigma$; or sigma-delta, $\Delta\Sigma$) modulation is a method for encoding analog signals into digital signals as found in an analog-to-digital converter (ADC). It is also used to convert high bit-count digital signals with relatively low frequency content into lower bit-count, higher-frequency digital signals in which the relatively low frequency content is preserved. For example, conversion of digital signals into analog as part of a digital-to-analog converter (DAC) as well as fractional-N frequency synthesizers may utilize Delta-Sigma modulation. The delta-sigma modulation technique is known, see for example: "Delta-sigma modulation," Wikipedia, 9 August 2021 or later.

Figure 39:
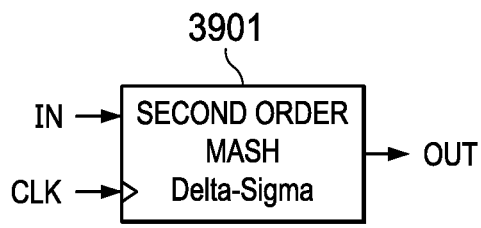
FIG. 39 is a block diagram of an example $2^{nd}$ order MASH delta-sigma modulator.

FIG. 39 is a block diagram of a 2nd order MASH digital delta-sigma modulator 3901. The multi-stage noise shaping (MASH) digital structure has a noise shaping property and is commonly used in digital audio and fractional-N frequency synthesizers. It includes two or more cascaded overflowing accumulators, each of which is equivalent to a first-order sigma-delta modulator. The carry outputs are combined through summations and delays to produce a binary output, the width of which depends on the number of stages (order) of the MASH.

RC charging of a high gain PCC, such as PCC 2212 (FIG. 22), has nonlinearity that causes noise folding of delta-sigma noise produced by delta-sigma module 2216 (FIG. 22). $2^{nd}$ order MASH delta-sigma 3901 often yields acceptably low noise folding, but not sufficient noise shaping. However, a $3^{rd}$ order delta-sigma often yields unacceptably high noise folding.

Figure 40:
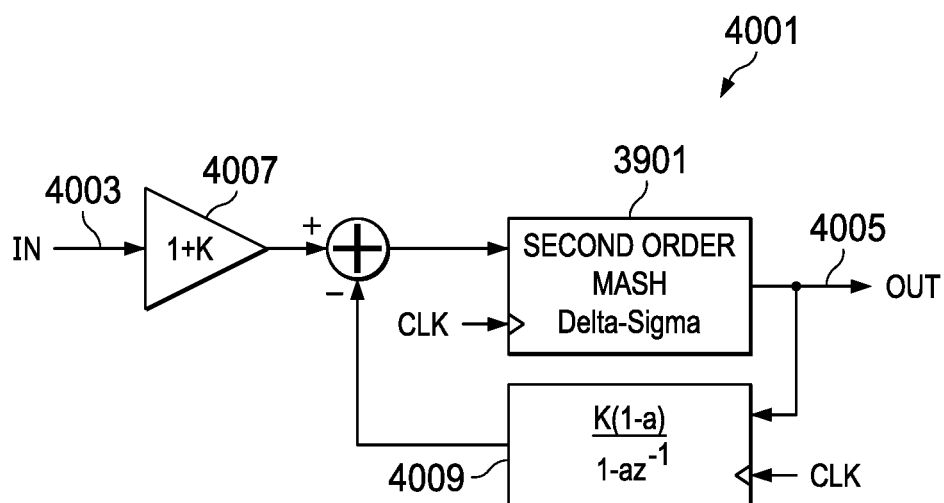
FIG. 40 is a block diagram of an example enhanced $2^{nd}$ order MASH delta-sigma modulator.

FIG. 40 is a block diagram of an example enhanced $2^{nd}$ order MASH delta-sigma modulator 4001. In this example, $2^{nd}$ order MASH delta-sigma 3901 is enhanced with a feedback loop that uses design parameters "K" and "a." In this example, feedback block 4009 acts as a digital lowpass filter that extracts the low frequency quantization noise so that it can suppressed through the action of feedback. The resulting feedback leads to a change in the DC gain of the closed loop system which is compensated by a cascaded gain block 4007.

Figure 41:
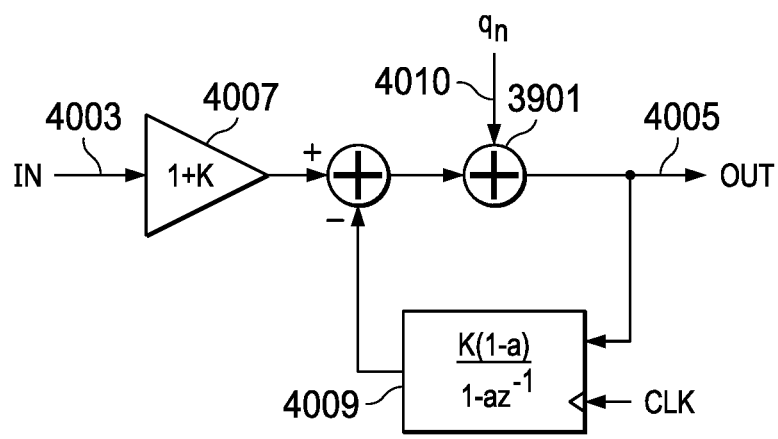
FIG. 41 is an example noise model of the example enhanced delta-sigma of FIG. 40.

FIG. 41 is an example noise model of the example enhanced delta-sigma modulator 4001 of FIG. 40. In this example, expression (8) represents a transfer function of delta-sigma quantization noise 4010 to output node 4005. An overall delta-sigma noise spectrum is represented by expression (9), where "n" is the MASH order of the delta-sigma. A signal transfer function from input 4003 to output 4005 is represented by expression (10).

$$H_q(z) = \frac{1 - az^{-1}}{1 + K(1-a) - az^{-1}} \tag{8}$$

$$S_q(z) = 1/12^* |H_q(z)|^2 |1 - z^{-1}|^{2n} \quad (9)$$

$$H_{sig}(z) = \frac{(1+K)(1-az^{-1})}{1+K(1-a)-az^{-1}} \quad (10)$$

Figure 42:
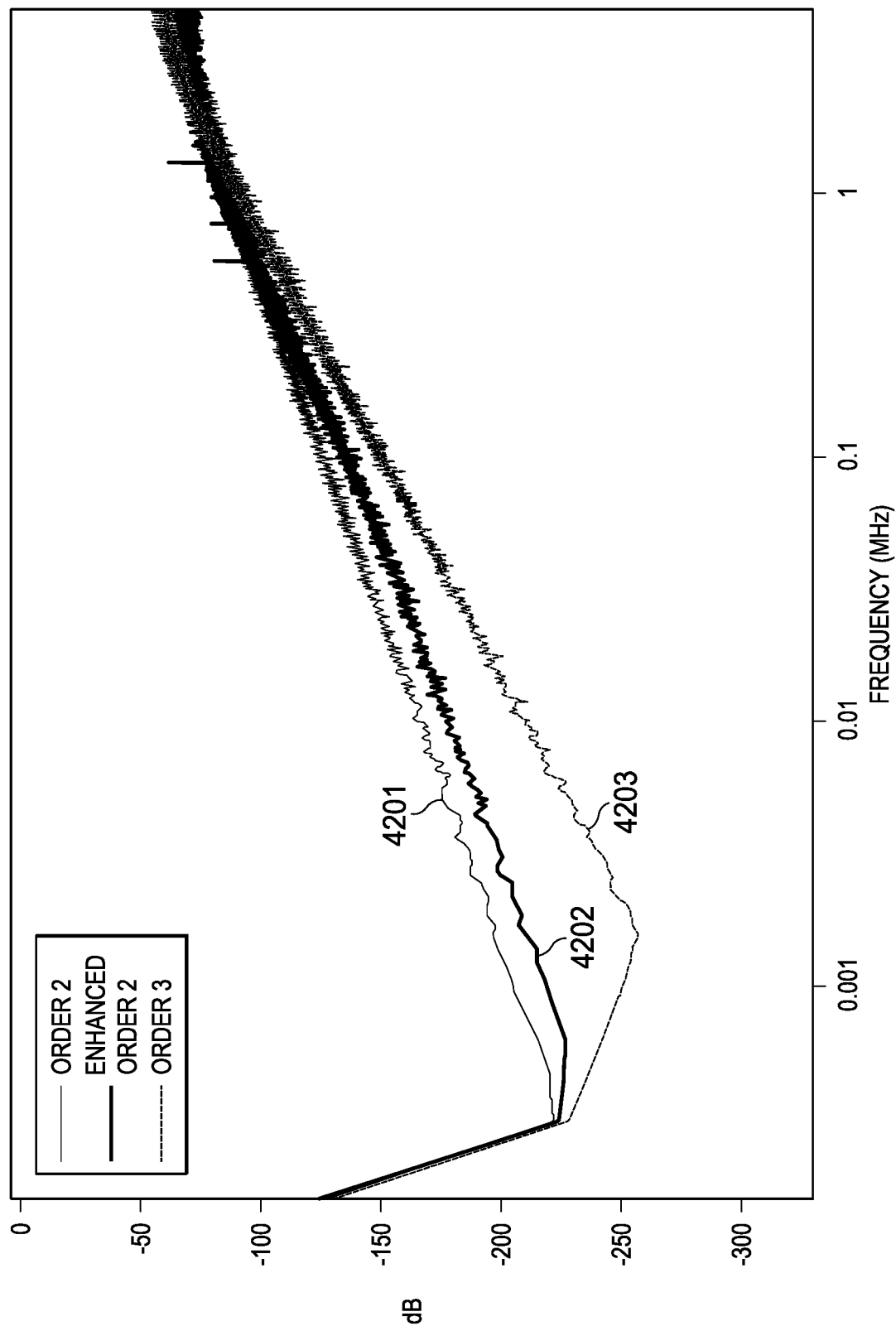
FIG. 42 is a plot illustrating simulation results for the enhanced delta-sigma of FIG. 40.

FIG. 42 is a plot illustrating simulation results in dB/Hz vs frequency (MHz) for the enhanced delta-sigma of FIG. 40 compared to conventional order 2 and order 3 MASH structures. Plot line 4201 represents $2^{nd}$ order MASH delta-sigma 3901 (FIG. 39). Plot line 4202 represents enhanced $2^{nd}$ order MASH delta-sigma 4001 (FIG. 40). Plot line 4203 represents a $3^{rd}$ order MASH delta-sigma (not shown).

In this example, K is selected to be 3 and is set to achieve lowpass bandwidth in feedback loop 4009 (FIG. 40) of approximately 1/100 of the clock frequency. In this example, the high frequency noise stays about the same, but an improvement of approximately 9 dB is observed at lower frequencies.

Phase Locked Loop Examples

Figure 43:
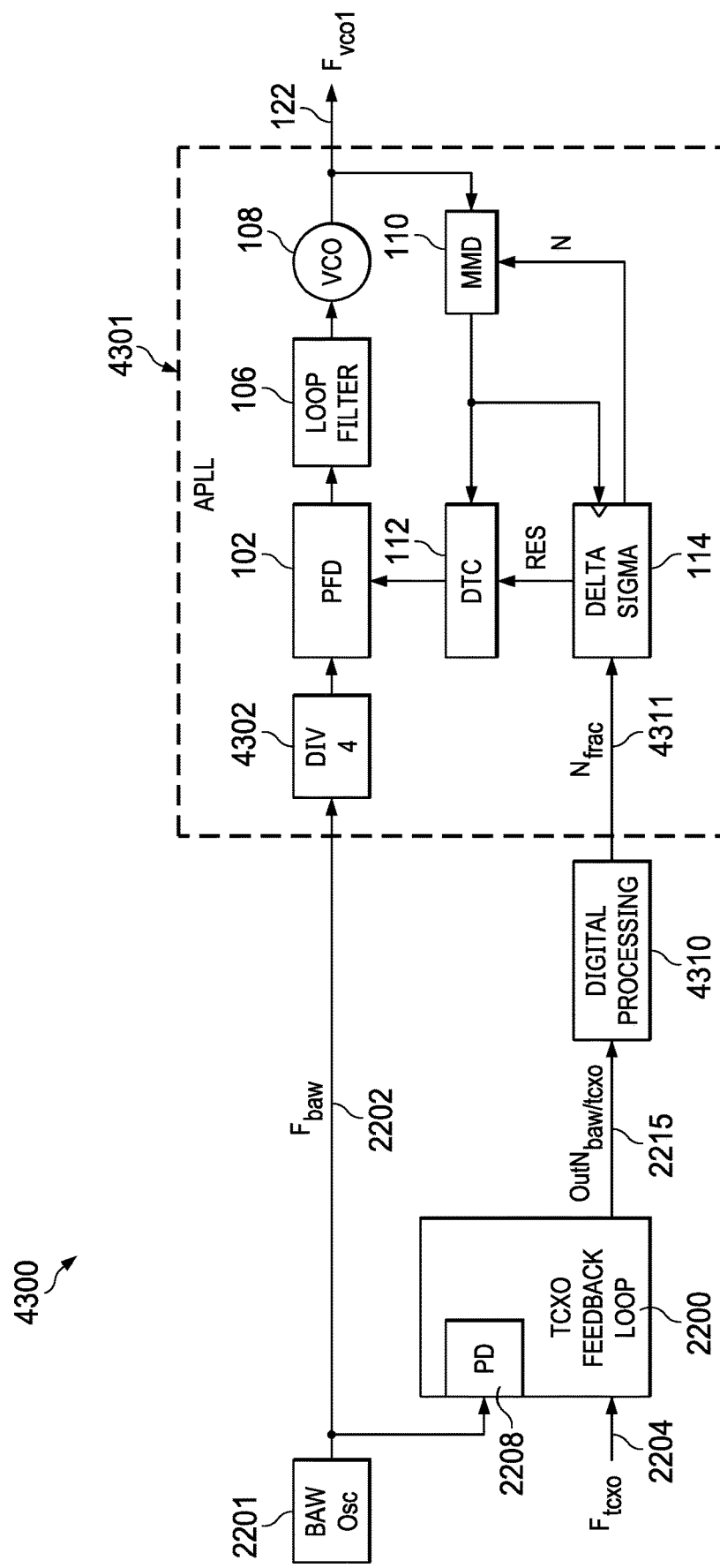
FIG. 43 is a block diagram of an example analog phase locked loop controlled by the feedback loop of FIG. 22.

FIG. 43 is a block diagram of an example frequency generating system 4300 that includes high bandwidth analog phase locked loop 4301 controlled by a low bandwidth feedback loop 2200 of FIG. 22. High BW PLL 4301 is similar to high BW PLL 100 (FIG. 1). In this example, high BW PLL 4301 is locked to reference frequency Fbaw 2202 provided by BAW oscillator 2201 that provides a high frequency and low jitter. In this example, divider 4302 divides high frequency reference signal 2202 by a factor of four for simplicity, but high gain PD techniques discussed could be applied and therefore lead to changes in the best choice of this divide value. In another example, a reference frequency may be provided by another known or later developed technique, such as a crystal-based reference oscillator.

In this example, low BW feedback loop 2200 is also locked to Fbaw reference frequency signal 2202 and to Ftcxo reference frequency signal 2204 provided by a temperature-controlled crystal oscillator. In another example, a reference frequency may be provided by another known or later developed technique, such as a crystal-based reference oscillator.

In this example, high BW PLL 4301 may include a high gain phase detector 102 as described hereinabove in more detail. In this example, low BW feedback loop 2200 may include a high gain PD 2208 as described hereinabove in more detail.

In this example, digital processing logic 4310 receives OutN signal 2215 from feedback loop 2200. OutN signal 2215 provides the value of the ratio between the frequency of Fbaw reference signal 2202 and Ftcxo reference signal 2204. Processing logic 4310 converts this ratio into a fraction value Nfrac 4311 that is provided to delta-sigma 114. By doing so, the ppm accuracy of Fvcol can be set according to Ftcxo, and suppression of low frequency phase noise of the BAW can be achieved.

In this example, APLL 4301 is described. In another example, a digital PLL may be used in place of APLL 4301.

Figure 44:
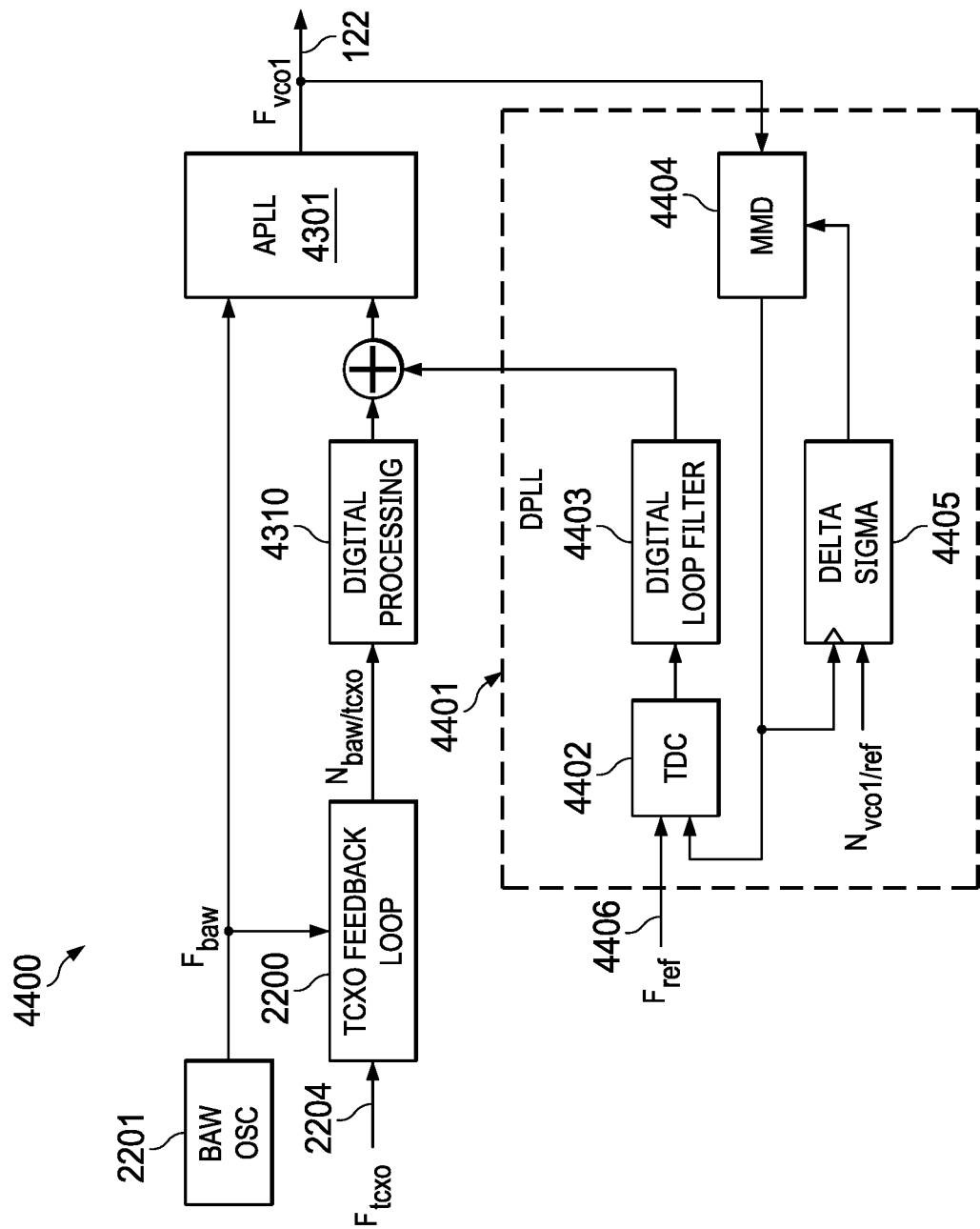
FIG. 44 is a block diagram of the example analog phase locked loop of FIG. 43 augmented by a digital PLL.

FIG. 44 is a block diagram an example frequency generating system that includes the example frequency generating system 4300 of FIG. 43 augmented by a digital PLL (DPLL) 4401. In this example, open loop cancellation of BAW low offset phase noise is provided by TCXO feedback loop 2200 and analog PLL 4301, as described hereinabove in more detail.

In this example, DPLL 4401 provides closed loop tracking to Fref 4406 to provide PPM accuracy and very low offset phase noise suppression. DPLL 4401 includes time to digital converter (TDC) 4402, digital loop filter 4403, multi-modulus divider 4404, and delta-sigma 4405.

In this example, APLL 4301 is described. In another example, a digital PLL may be used in place of APLL 4301. Similarly, in this example digital PLL 4401 is described. In another example, an analog PLL may be used in place of digital PLL 4401.

Simulations

Figure 45:
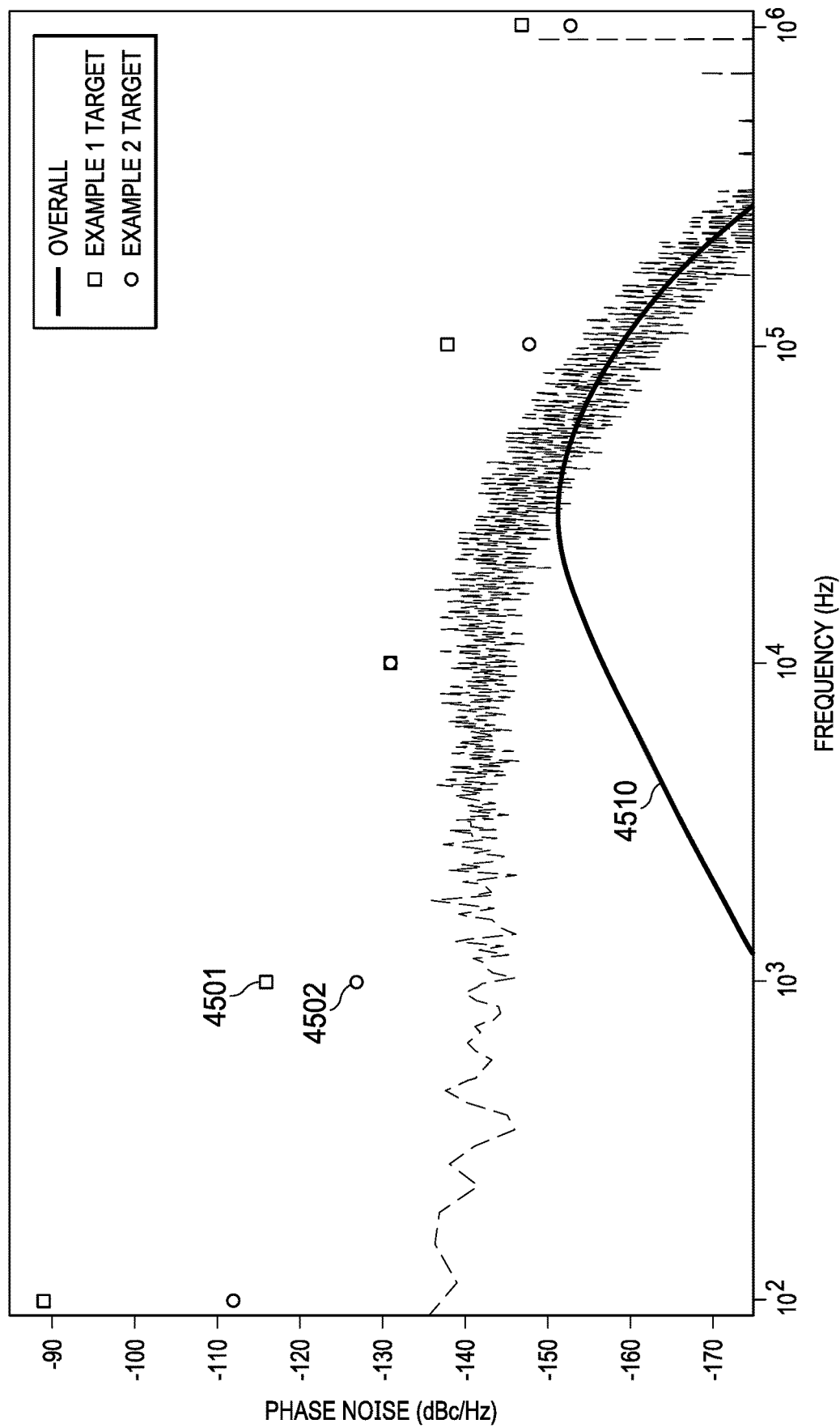
FIG. 45 is a plot illustrating phase noise level (dBc/Hz) versus offset frequency for simulated operation of example noise model of FIG. 2.

FIG. 45 is a plot of phase noise level (dBc/Hz) versus offset frequency for simulated operation of example noise model of FIG. 2 illustrating noise folding effects of delta-sigma noise, see FIG. 5. In this example, plot line 4510 represents overall phase noise at output 122 (FIG. 1). In this example, the carrier frequency is 312.5 MHz, reference frequency 120 (FIG. 2) is 40.0 MHz, divider 210 (FIG. 2) input is 2.5 GHz, BW is 14.7 kHz. Significant degradation occurs at low frequencies due to noise folding of delta-sigma quantization noise, but total noise remains below noise targets for two example systems, as indicated at 4501, 4502.

Figure 46:
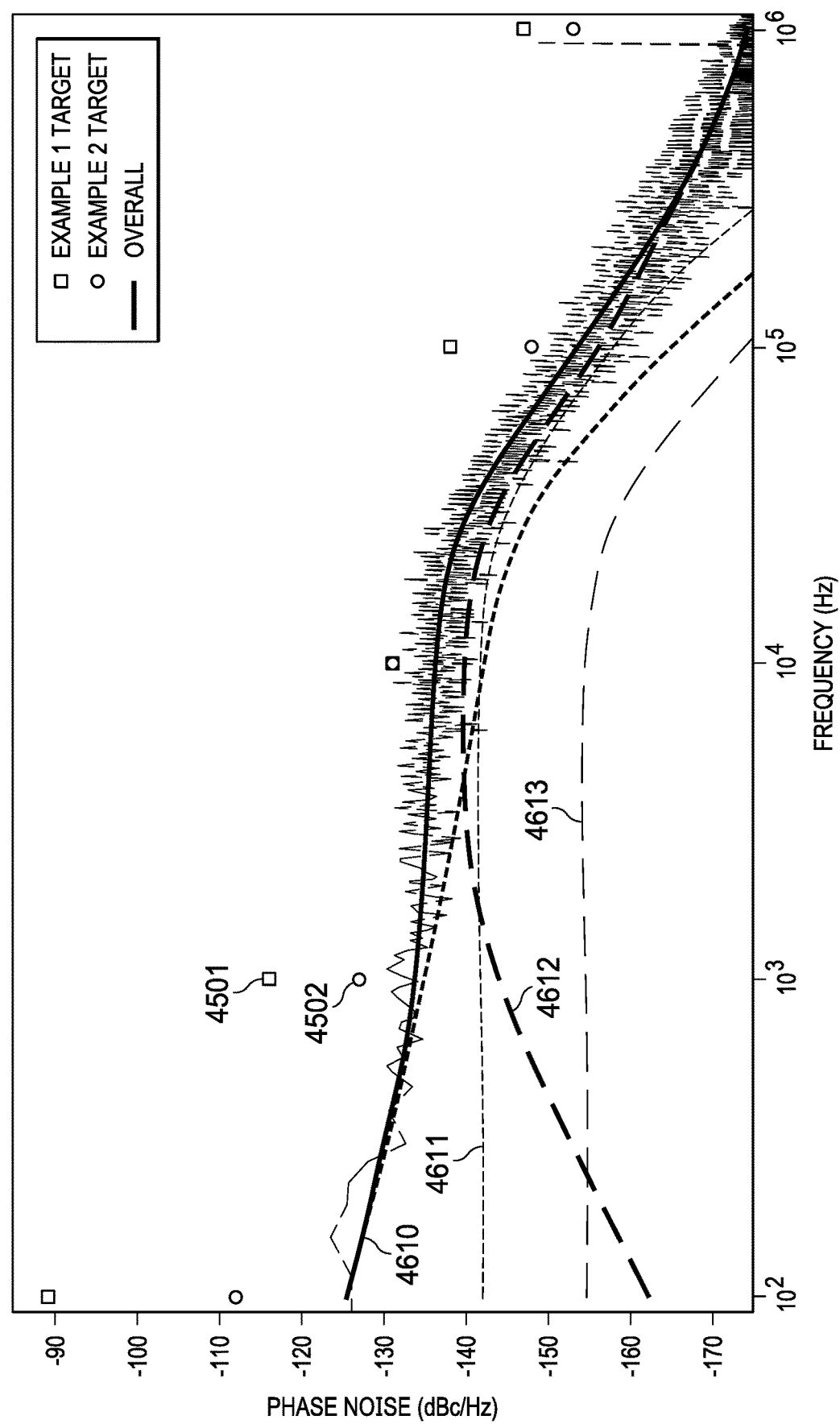
FIG. 46 is a plot illustrating phase noise level (dBc/Hz) versus offset frequency for simulated operation of example system 4300 of FIG. 43.

FIG. 46 is a plot illustrating phase noise level (dBc/Hz) versus offset frequency for simulated operation of example system 4300 of FIG. 43. In this example, the carrier frequency is 312.5 MHz, BAW reference frequency 2202 (FIG. 43) is 40.0 MHz, divider 110 (FIG. 43) input is 2.5 GHz, BW is 14.7 kHz. In this example, plot line 4610 illustrates overall phase noise appearing on output 122 (FIG. 43). Plot line 4611 illustrates delta-sigma noise with folding in TCXO loop 2200 (FIG. 43). Plot line 4612 illustrates BAW noise from a simulated parallel BAW oscillator 2201 (FIG. 43). Plot line 4613 illustrates quantization noise for a 10-bit, 4.0 MHz ADC quantizer within TXCO loop 2200 (FIG. 43). Total noise remains below noise targets for two example systems, as indicated at 4501, 4502.

Figure 47A:
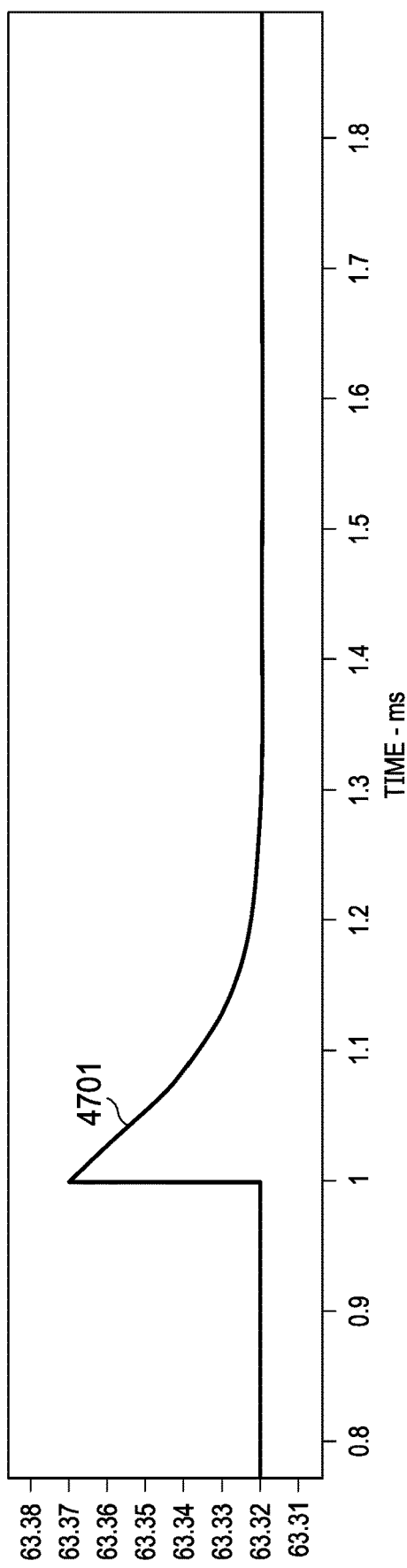
FIGS. 47A, 47B are plots illustrating operation of an example bang-bang circuit.
Figure 47B:
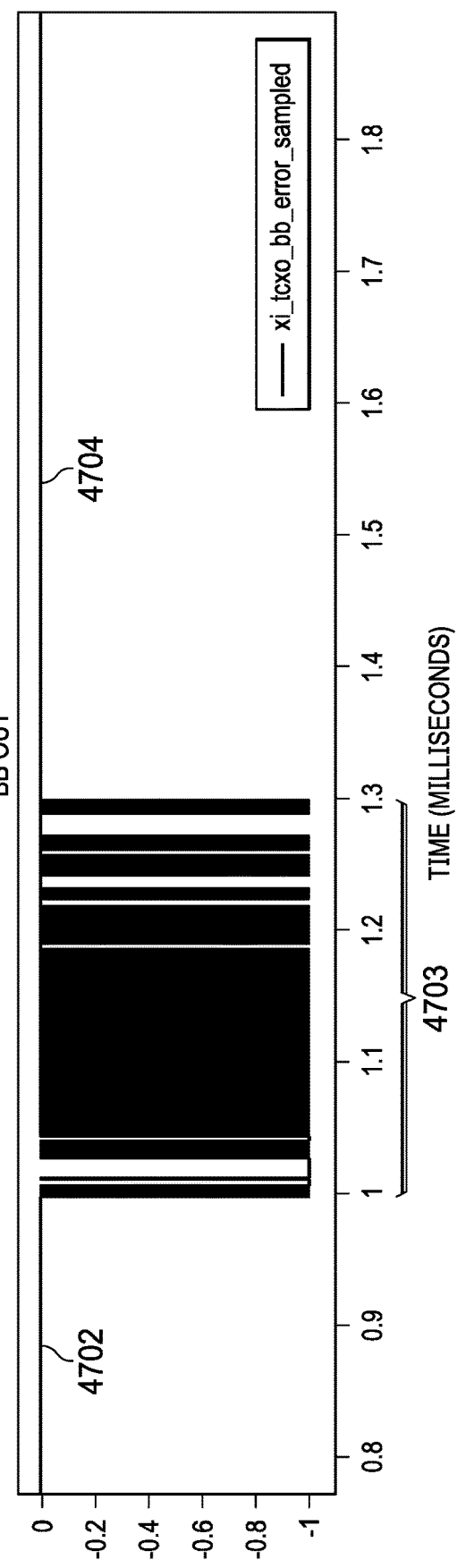

FIGS. 47A, 47B are plots illustrating operation of an example bang-bang circuit generated by timing circuitry inside PD 2208 (FIG. 22). In this example, plot line 4701 illustrates a simulated step response of a fractional ratio value 4311 (FIG. 43) feed into the delta-sigma 114 (FIG. 43). Prior to the step, bang-bang output signals 2222, 2223 (FIG. 22) are quiescent, as illustrated at 4702. After the step input, BB output signals 2222, 2223 are active for a small amount of time (ms) as indicated at 4703 in order to more quickly stabilize the ratio value. After a short period of time, the BB output signals 2222, 2223 again go quiescent, as indicated at 4704 once the ratio value has stabilized.

Other Embodiments

In described examples, high gain, high BW phase detectors and high gain, low BW phase detectors are presented. In described examples, these are combined in various combinations to provide variable frequency systems that produce stable frequency signals that have low noise. In another example, these components may be configured in various topologies to provide enhanced low noise system performance.

In this description, the term "phase detector" is used to refer to a circuit that detects a difference in phase between a reference signal and a feedback signal. In some examples, a phase detector may include a pulse generator timing circuit, such as a PG circuit 1701 (FIG. 17). In other examples, a phase detector may be a simple XOR gate as shown in FIG. 15. In some examples, a phase detector may include a "phase to charge converter" (PCC) such as PCC 905 (FIG. 9). In In some examples, a phase detector may include a phase to digital converter, such as phase to digital converter 2212 (FIG. 22).

In described examples, an opamp is used in the PCC. In another example, another type of known or later developed amplifier configuration that has an inverting and a non-inverting input may be used.

In this description, the term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described embodiments, and other embodiments are possible, within the scope of the claims.

What is claimed is:

1. An apparatus comprising:
    a multi-modulus divider (MMD) having a divider input, a divisor input, and a divider output;
    a phase detector having a first clock input a second clock input, and a PD output, the second clock input coupled to the divider output; and
    a phase to digital converter (P2DC) having a P2DC input and a P2DC output, the P2DC input coupled to the PD output, and the P2DC output coupled to the divisor input, the P2DC including a filter and an analog to digital converter (ADC) coupled between the P2DC input and the P2DC output, the ADC configured to provide a digital signal representing a frequency ratio between a first clock signal at the divider input and a second clock signal at the first clock input.

2. The apparatus of claim 1, wherein the filter includes:
    a phase to charge converter (PCC) having a PCC input and a PCC output, the PCC input coupled to the P2DC input; and
    a capacitor coupled to the PCC output and wherein the ADC is coupled between the PCC output and the P2DC output.

3. The apparatus of claim 2, wherein:
    the PD output is a first PD output;
    the PD has a second PD output:
    the P2DC input is a first P2DC input;
    the P2DC has a second P2DC input;
    the PCC input is a first PCC input, and the PCC has a second PCC input;
    the PCC includes a first switch coupled between a power terminal and the PCC output and a second switch coupled between the PCC output and a ground terminal, the first switch having a first switch control terminal coupled to the first PCC input and the second switch having a second switch control terminal coupled to the second PCC input.

4. The apparatus of claim 3, wherein:
    the PCC is a first PCC. the PCC output is a first PCC output. the capacitor is a first capacitor;
    the filter further includes a second PCC having a second PCC input coupled to the second P2DC input and a second PCC output, and a second capacitor coupled to the second PCC output;
    the ADC is coupled between the first and second PCC outputs and the P2DC output:
    the second PCC includes a third switch coupled between the power terminal and the second PCC output and a fourth switch coupled between the second PCC output and the ground terminal, the third switch having a third switch control terminal coupled to the second PCC input and the fourth switch having a fourth switch control terminal coupled the first PCC input.

5. The apparatuses of claim 4, further comprising:
    an amplifier having a positive amplifier input, a negative amplifier input, and an amplifier output, the negative amplifier input coupled to the first PCC output, the positive amplifier input coupled to the second PCC output, and the amplifier output coupled to an input of the ADC; and
    a third capacitor and a resistor coupled between the negative amplifier input and the amplifier output.

6. The apparatuses of claim 4, wherein the resistor is a first resistor, further comprising a second resistor coupled between the first PCC output and the negative amplifier input.

7. The apparatus Bb of claim 4. further comprising wherein the :
    a first amplifier having a first negative amplifier input, a first positive amplifier input. and a first amplifier output;
    a second amplifier having a second negative amplifier input, a second positive amplifier input, and a second amplifier output;
    a first resistor coupled between the first PCC output and the first negative amplifier input;
    a third capacitor coupled to the first negative amplifier input;
    a second resistor coupled between the second PCC output and the first, positive amplifier input,
    a fourth capacitor coupled to the first positive amplifier input;
    a third resistor coupled between the second PCC output and the second negative amplifier input;
    a fourth resistor coupled between the first PCC output and the second positive amplifier input
    a fifth capacitor coupled to the second negative amplifier input;
    a sixth capacitor coupled to the second positive amplifier input;
    a seventh capacitor and a fifth resistor coupled between the first negative amplifier input and the first amplifier output; and
    an eighth capacitor and a sixth resistor coupled between the second negative amplifier input and the second amplifier output.

8. The apparatus of claim 4, further comprising:
    an amplifier having a negative amplifier input, a positive amplifier input, a positive amplifier output, and a negative amplifier output
    a first resistor coupled between the first PCC output and the negative amplifier input:
    a third capacitor coupled to the negative amplifier input;
    a second resistor coupled between the second PCC output and the positive amplifier input,
    a fourth capacitor coupled to the positive amplifier input;
    a fifth capacitor and a third resistor coupled between the negative amplifier input and the positive amplifier output; and
    a sixth capacitor and a fourth resistor coupled between the positive amplifier input and the negative amplifier output.

9. The apparatus of claim 4, wherein the first PCC includes a first resistor coupled between at least one of the first or second switches and the first PCC output, and the second PCC includes a second resistor coupled between at least one of the third or fourth switches and the second PCC output.

10. The apparatus of claim 1, further comprising a delta sigma modulator having an input coupled to the output of the P2DC, and an output coupled to the divisor input.

11. The apparatuses of claim 10, wherein the filter is a first filter, the delta sigma modulator has a $2^{nd}$ order multi-stage noise shaping (MASH) structure, and the apparatus further comprises a second filter having a filter input coupled to the output of the delta sigma modulator and a filter output coupled to the input of the delta sigma modulator.

12. The apparatus of claim 9, wherein each of the first and second resistors includes a respective trimmable resistor, and each of first and second capacitors includes a respective variable capacitor.

13. The apparatus of claim 5, further comprising an anti-aliasing filter coupled between the amplifier output and the ABC.

14. The apparatus of claim 3, wherein the divider output is a first divider output, and the MMD has a second divider output; and
wherein the PD has a third clock input coupled to the second divider output.

15. The apparatus of claim 14, wherein the MMD is configured to provide a first pulse signal at the first divider output and a second pulse signal at the second divider output responsive to a first signal at the divider input; and
wherein the PD is configured to:
provide a first PD signal at the first PD output representing a first phase difference between the first pulse signal and a second signal at the first clock input; and
provide a second PD signal at the second PD output representing a second phase difference between the second signal and the second pulse signal.

16. The apparatus of claim 15, wherein:
a first edge of the first pulse signal and a second edge of the second pulse signal being separated by a time window;
the PD has a first bang-bang (BB) PD output and a second bang-bang PD output, the first and second BB PD outputs coupled to the divisor input; and
the PD is configured to provide a first BB PD signal at the first BB PD output and a second BB PD signal at the second BB PD output responsive to a third edge of the second signal being outside the time window.

17. The apparatus of claim 1, further comprising a phase locked loop having a third clock input, a fractional-N input, and a clock output, the third clock input coupled to the divider input, and the fractional-N input coupled to the P2DC output.

18. The apparatus of claim 1, further comprising a first oscillator having a first oscillator output and a second oscillator having a second oscillator output,
wherein the first oscillator output is coupled to the divider input, and the first oscillator configured to provide the first clock signal having a first pre-determined frequency; and
wherein the second oscillator output is coupled to the first clock input, and the second oscillator configured to provide the second clock signal having a second pre-determined frequency.

19. The apparatus of claim 18, wherein the first and second oscillators are of different types.

20. The apparatus of claim 19, wherein the first oscillator is a crystal oscillator, and the second oscillator is a bulk acoustic wave (BAW) oscillator.

\* \* \* \* \*